(12) United States Patent
Sievers

(10) Patent No.: US 12,202,246 B2
(45) Date of Patent: *Jan. 21, 2025

(54) PRINTING PLATE IMAGING AND EXPOSURE APPARATUS AND METHOD

(71) Applicant: Esko-Graphics Imaging GmbH, Itzehoe (DE)

(72) Inventor: Wolfgang Sievers, Kremperheide (DE)

(73) Assignee: Esko-Graphics Imaging GmbH, Itzehoe (DE)

( * ) Notice: Subject to any disclaimer, the term of this patent is extended or adjusted under 35 U.S.C. 154(b) by 216 days.

This patent is subject to a terminal disclaimer.

(21) Appl. No.: 17/727,292

(22) Filed: Apr. 22, 2022

(65) Prior Publication Data

US 2022/0242106 A1 Aug. 4, 2022

Related U.S. Application Data

(60) Continuation of application No. 16/996,349, filed on Aug. 18, 2020, now Pat. No. 11,318,730, which is a
(Continued)

(51) Int. Cl.
*G03F 7/24* (2006.01)
*B41C 1/10* (2006.01)
*G03F 7/20* (2006.01)

(52) U.S. Cl.
CPC .......... *B41C 1/1008* (2013.01); *B41C 1/1033* (2013.01); *G03F 7/2057* (2013.01); *G03F 7/24* (2013.01)

(58) Field of Classification Search
CPC ... B41C 1/1008; B41C 1/1033; G03F 7/2057; G03F 7/24
See application file for complete search history.

(56) References Cited

U.S. PATENT DOCUMENTS

| 4,070,110 A | 1/1978 | Ott |
| 4,304,842 A | 12/1981 | Schoute |

(Continued)

FOREIGN PATENT DOCUMENTS

| CN | 101019073 A | 8/2007 |
| DE | 202004017044 U1 | 1/2005 |

(Continued)

OTHER PUBLICATIONS

"Cure-all Linear 100",Con-trol-Cure, US Process Supply, Inc. Portland, OR, retrieved Jun. 19, 2007 at http://www.uvps.com/product, 1 page.
(Continued)

*Primary Examiner* — Mesfin T Asfaw
(74) *Attorney, Agent, or Firm* — Buchanan Ingersoll & Rooney PC

(57) ABSTRACT

A system for preparing a photopolymer printing plate includes exposure unit comprising a plurality of UV light emitting diodes (UV LEDs), a holder comprising a UV translucent material configured to receive the printing plate, and a controller configured to activate the plurality of UV LEDs. The UV LEDs include a plurality of stationary back UV LEDs configured to emit UV radiation toward the non-printing back side of the printing plate through the holder with the printing plate disposed in a stationary position on the holder, the plurality of stationary back UV LED sources together defining at least one back array having a collective irradiation field covering an area at least coextensive with the lateral length and lateral width of the plate.

26 Claims, 46 Drawing Sheets

Related U.S. Application Data continuation of application No. 16/295,295, filed on Mar. 7, 2019, now Pat. No. 10,766,248, which is a continuation of application No. 15/820,333, filed on Nov. 21, 2017, now Pat. No. 10,766,247, which is a continuation of application No. 15/088,062, filed on Mar. 31, 2016, now Pat. No. 9,849,663, which is a division of application No. 13/770,974, filed on Feb. 19, 2013, now Pat. No. 9,315,009, which is a division of application No. 12/113,001, filed on Apr. 30, 2008, now Pat. No. 8,389,203.

(60) Provisional application No. 60/945,439, filed on Jun. 21, 2007, provisional application No. 60/945,189, filed on Jun. 20, 2007, provisional application No. 60/916,738, filed on May 8, 2007.

(56) References Cited

U.S. PATENT DOCUMENTS

| | | | |
|---|---|---|---|
| 4,899,214 | A | 2/1990 | Robbins et al. |
| 4,916,530 | A | 4/1990 | Neilson et al. |
| 5,386,268 | A | 1/1995 | Ohlig et al. |
| 5,455,416 | A | 10/1995 | Zertani et al. |
| 5,992,324 | A | 11/1999 | Rombult et al. |
| 6,189,452 | B1 | 2/2001 | Halup et al. |
| 6,238,837 | B1 | 5/2001 | Fan |
| 6,266,134 | B1 | 7/2001 | Gelbart |
| 6,326,127 | B1 | 12/2001 | Morren et al. |
| 6,352,815 | B1 | 3/2002 | Feil et al. |
| 6,355,395 | B1 | 3/2002 | Zwez et al. |
| 6,683,421 | B1 | 1/2004 | Kennedy et al. |
| 6,700,598 | B1 | 3/2004 | Hull |
| 7,000,543 | B2 | 2/2006 | Klein et al. |
| 7,137,696 | B2 | 11/2006 | Siegel |
| 7,165,492 | B2 | 1/2007 | Koberg et al. |
| 7,642,527 | B2 | 1/2010 | Marson et al. |
| 7,682,775 | B2 | 3/2010 | Rapp et al. |
| 7,709,183 | B2 | 5/2010 | Watanabe et al. |
| 8,389,203 | B2 | 3/2013 | Sievers |
| 8,399,178 | B2 | 3/2013 | Bertrand et al. |
| 8,516,961 | B2 | 8/2013 | Wolterink et al. |
| 8,757,060 | B2 | 6/2014 | Wolterink et al. |
| 9,315,009 | B2 | 4/2016 | Sievers |
| 9,849,663 | B2 | 12/2017 | Sievers |
| 10,766,247 | B2 | 9/2020 | Sievers |
| 10,766,248 | B2 | 9/2020 | Sievers |
| 2001/0052924 | A1 | 12/2001 | Steinke et al. |
| 2005/0011382 | A1 | 1/2005 | Donahue et al. |
| 2005/0116176 | A1 | 6/2005 | Aguirre et al. |
| 2005/0183597 | A1 | 8/2005 | Hull et al. |
| 2005/0266358 | A1 | 12/2005 | Roberts et al. |
| 2006/0054040 | A1 | 3/2006 | Daems et al. |
| 2006/0055761 | A1 | 3/2006 | Daems et al. |
| 2006/0154169 | A1 | 7/2006 | Timpe |
| 2007/0071953 | A1 | 3/2007 | Nakamura |
| 2007/0142490 | A1 | 6/2007 | Baumann et al. |
| 2007/0146430 | A1 | 6/2007 | Nakamura et al. |
| 2007/0148582 | A1 | 6/2007 | Hayashi et al. |
| 2007/0218372 | A1 | 9/2007 | Zalevsky et al. |
| 2007/0284527 | A1 | 12/2007 | Zani et al. |
| 2008/0063981 | A1 | 3/2008 | Ohnishi |
| 2008/0280227 | A1 | 11/2008 | Sievers |
| 2010/0073660 | A1 | 3/2010 | Hull |

FOREIGN PATENT DOCUMENTS

| | | | |
|---|---|---|---|
| EP | 0007127 | B1 | 12/1982 |
| EP | 1579987 | A1 | 9/2005 |
| EP | 1804243 | B1 | 7/2007 |
| JP | 2007045128 | A | 2/2007 |
| WO | 02093265 | A1 | 11/2002 |
| WO | 2004111731 | A1 | 12/2004 |
| WO | 2007012023 | A2 | 1/2007 |
| WO | 2008094607 | A1 | 8/2008 |

OTHER PUBLICATIONS

"How to Build a UV Curing System", US Process Supply. Inc. Portland, OR, retrieved on Jun. 29, 2002 at http://uvps.com/manuals/manual build-complete.pdf, 27 pages.

DuPont Processing Manual for Cyrel, 1998, 142 pages.

European Communication for European Application No. 08 788 906.9, dated Feb. 21, 2011, 5 pages.

European Communication for European Application No. 08 788 906.9, dated Dec. 16, 2014, 6 pages.

Ex-Parte Re-Exam Application, Control No. 90/013,353 (U.S. Pat. No. 8,389,203) dated Sep. 24, 2014, 83 pages.

Ex-Parte Re-Exam Order, Control No. 90/013,363 (U.S. Pat. No. 8,389,203) dated Oct. 24, 2014, 17 pages.

Ex-Parte Re-Exam Communication Control No. 90/013,353 (U.S. Pat. No. 8,389,203) dated Jan. 29, 2015, 13 pages.

European Extended Search Report for Application 16000528.6, mailed Jul. 12, 2016, 1 page.

International Preliminary Report on Patentability on PCT Application PCT/IB2008/001900. issued Nov. 10, 2009, 6 pages.

Mills, P., "Characterizing the Output and Performance of Solid-State UV LED Sources", 2005 RadTech Europe Conference and Exhibition, Barcelona, Spain, Oct. 18-20, 2005, 13 pages.

Non Final Office Action for U.S. Appl. No. 15/820,333, mailed Apr. 10, 2018, 20 pages.

Opto Technology, Inc., Wheeling, IL: Specification: Shark High Flux UV LED Illuminators model OTLH-0480-UV, retrieved on Jun. 19, 2007, from http://www.optotech.com, 5 pages.

Reexamination Certificate for U.S. Pat. No. 8,389,203 dated Jun. 8, 2015, 1 page.

Sasa et al., "A Novel UV Sensitive Photopolymerization System with Microgel Matrix", Polymers Advanced Technologies, vol. 5, Issue 2, 1994. 2 pages. (abstract only).

Search Report issued Jan. 29, 2009 for Application PCT/IB2008/001900, 4 pages.

Search Report issued Dec. 4, 2008 for Application PCT/IB2008/001901, 15 pages.

Siegel, S., "UV Commercialization of LED Curing: Advances in a New Technology", US Process Supply, Inc. Portland, OR, retrieved Jun. 19, 2007, from http://www.uvps.com/products, 35 pages.

Urano et al., "Photopolymerization System Thermally Accelerated by a Laser Diode", Journal of Imaging Science and Technology, vol. 41, No. 4, 1997, 2 pages. (abstract only).

Written Opinion for International Application No. PCT/IB2008/001900, dated May 8, 2008, 5 pages.

Entire patent prosecution history of U.S. Appl. No. 12/113,001, filed, Apr. 30, 2008, entitled, "Exposing Printing Plates Using Light Emitting Diodes."

Entire patent prosecution history of U.S. Appl. No. 13/770,974, filed, Feb. 19, 2008, entitled, "Exposing Printing Plates Using Light Emitting Diodes."

Entire patent prosecution history of U.S. Appl. No. 15/088,062, filed, Mar. 31, 2016, entitled, "Exposing Printing Plates Using Light Emitting Diodes.".

Entire patent prosecution history of U.S. Appl. No. 15/820,333, filed, Nov. 21, 2017, entitled, "Exposing Printing Plates Using Light Emitting Diodes."

Entire patent prosecution history of U.S. Appl. No. 16/295,295, filed, Mar. 7, 2019, entitled, "Method and Apparatus for Exposing Printing Plates Using Light Emitting Diodes ."

Entire patent prosecution history of U.S. Appl. No. 16/996,349, filed, Aug. 18, 2020, entitled, "Printing Plate Imaging and Exposure Apparatus and Method."

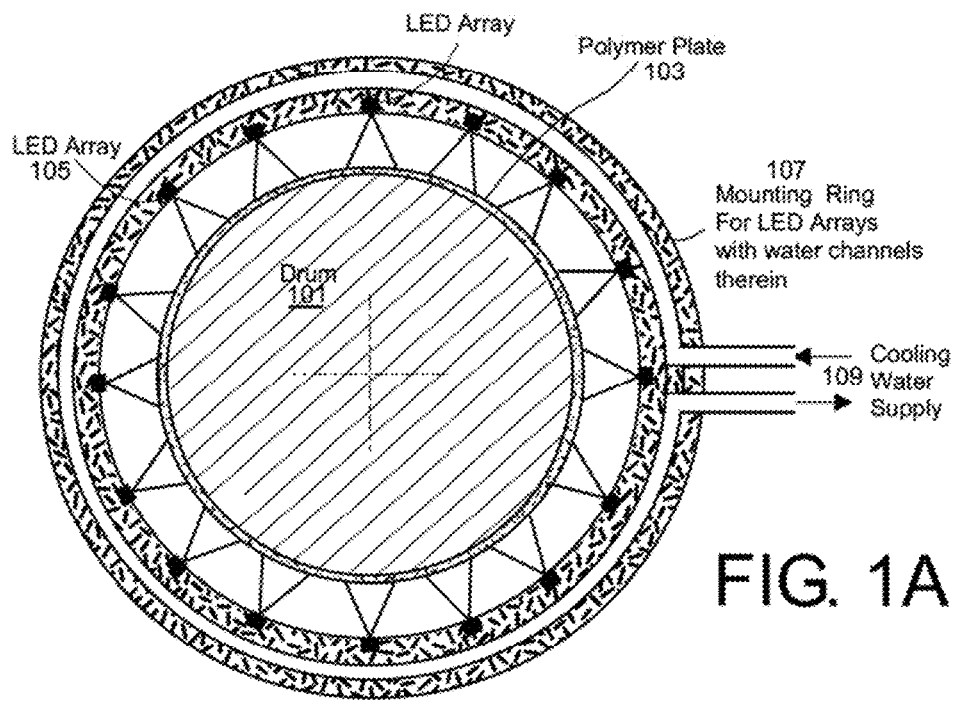
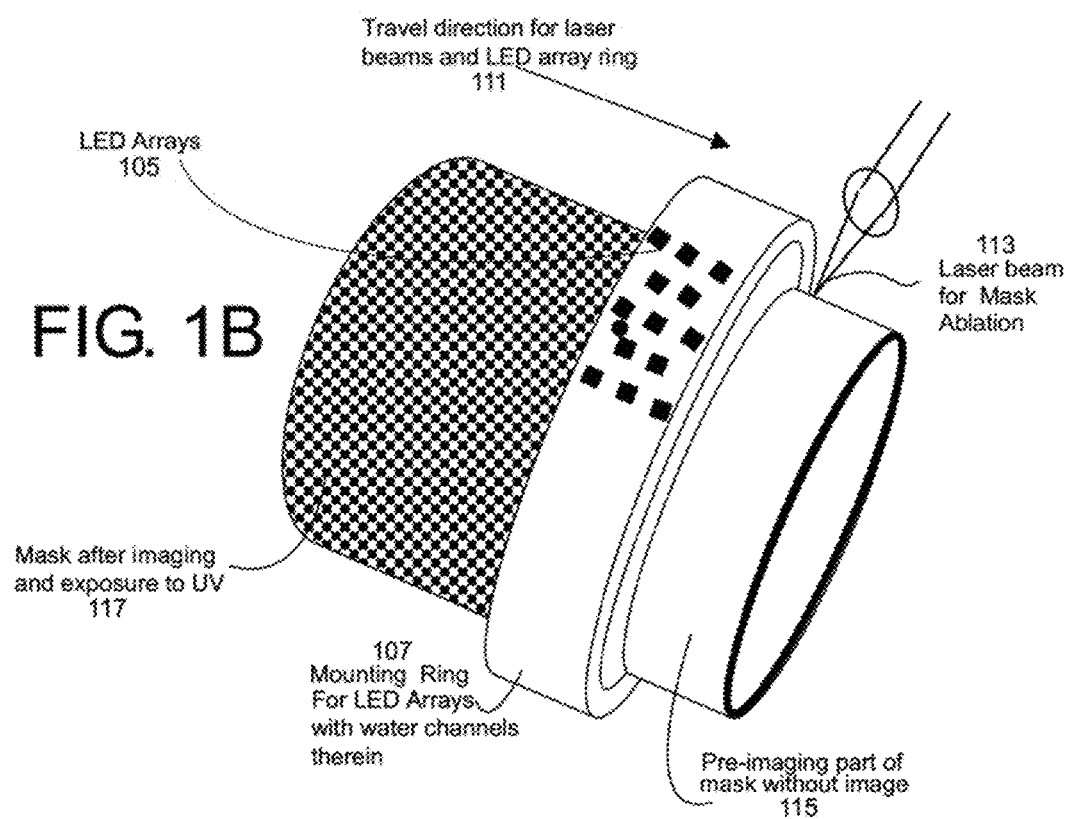

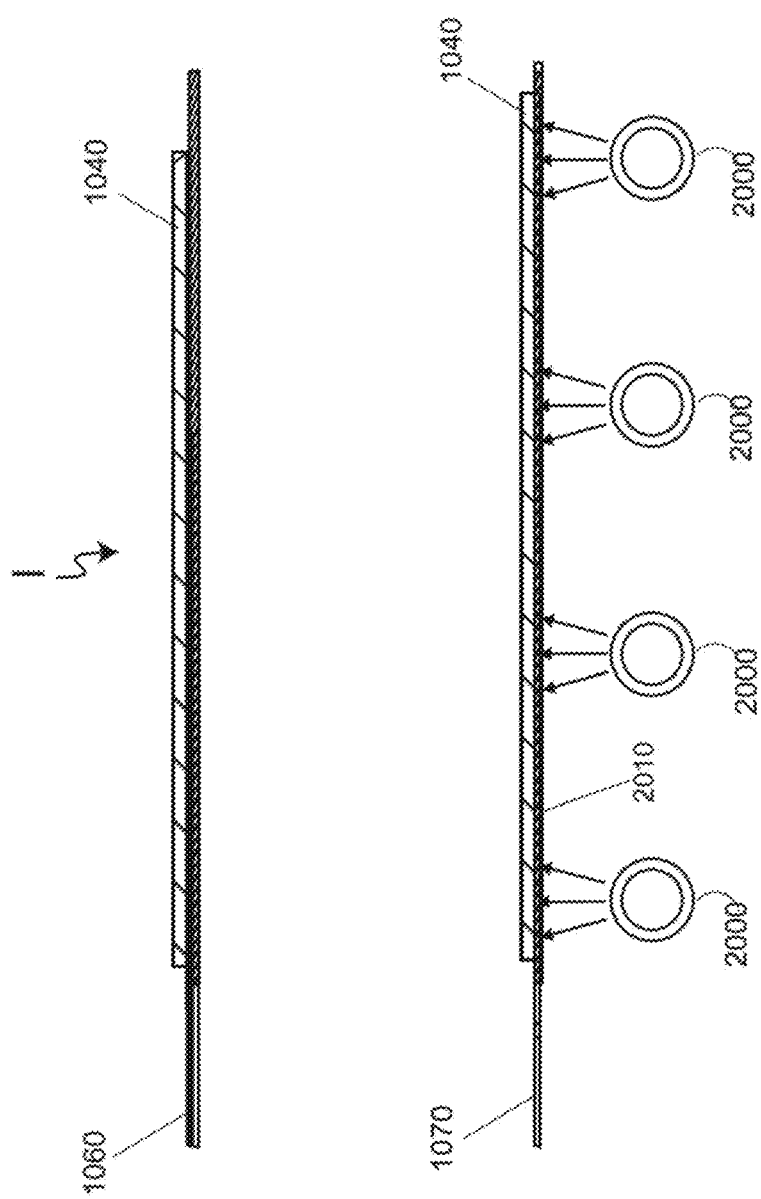

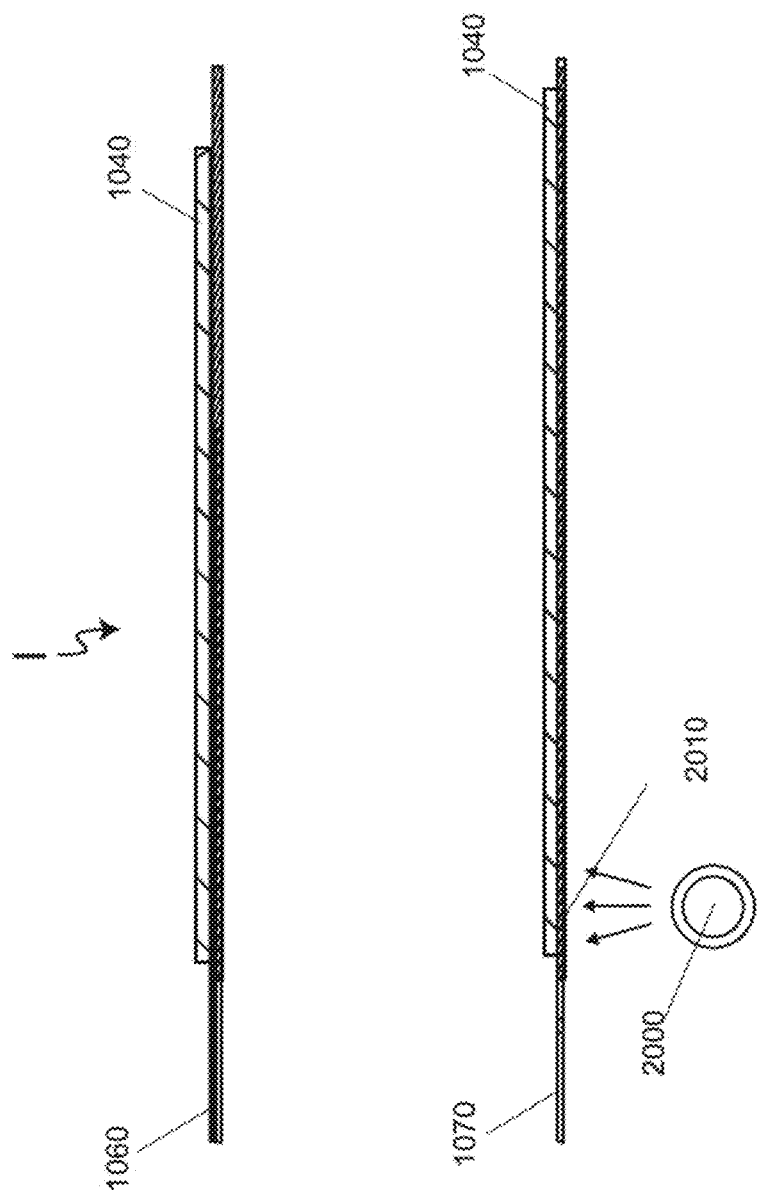

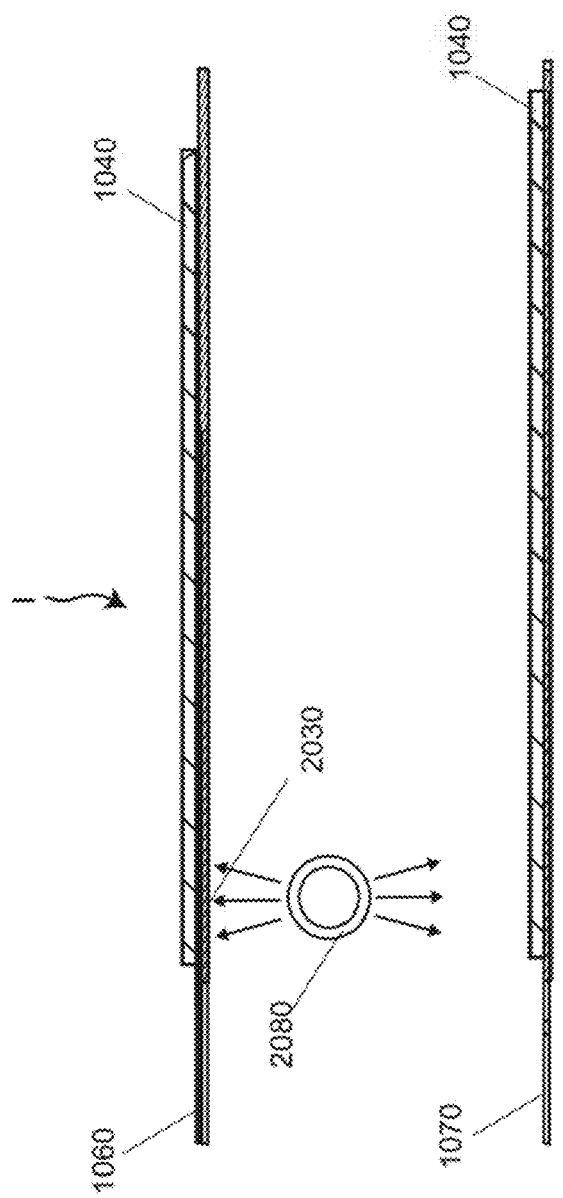

PRINTING PLATE IMAGING AND EXPOSURE APPARATUS AND METHOD

CROSS-REFERENCE TO RELATED APPLICATIONS

The present application is a continuation of U.S. patent application Ser. No. 16/996,349 (status: allowed), filed Aug. 18, 2020 which is a continuation of U.S. patent application Ser. No. 16/295,295, filed Mar. 7, 2019, now U.S. Pat. No. 10,766,248 which is a continuation of U.S. patent application Ser. No. 15/820,333, filed Nov. 21, 2017, now U.S. Pat. No. 10,766,247, which is a continuation of U.S. patent application Ser. No. 15/088,062, filed Mar. 31, 2016, now U.S. Pat. No. 9,849,663. U.S. application Ser. No. 15/088,062 is a divisional of U.S. patent application Ser. No. 13/770,974, filed Feb. 19, 2013, now U.S. Pat. No. 9,315,009. U.S. patent application Ser. No. 13/770,974 is a divisional of U.S. patent application Ser. No. 12/113,001, filed 30 Apr. 2008, now U.S. Pat. No. 8,389,203. U.S. patent application Ser. Nos. 16/295,295, 15/820,333, 15/088,062, 13/770,974 and 12/113,001, as well as the present application, claim benefit of priority of U.S. Provisional Patent Application Ser. Nos. 60/945,439 filed 21 Jun. 2007, 60/945,189 filed 20 Jun. 2007, and 60/916,738 filed 8 May 2007. The contents of all of the foregoing are incorporated herein by reference.

FIELD OF THE INVENTION

The present invention relates generally to printing, and in particular to curing printing plates having photo-curable material thereon using a solid state source of radiation.

BACKGROUND

Preparing printing plates such as photopolymer flexographic plates and letterpress printing plates coated with photopolymer material (such plates in general referred to as "polymer plates") is being more and more automated. A typical process of preparing such printing plates includes starting with a plate that has an ablatable material thereon, imaging in a digital imager to ablate the ablatable material according to imaging data, and a curing process of the exposed plate that involves exposure to light energy, e.g., ultraviolet (UV) light energy. Automation often includes inline exposure to cure the plate inline after imaging.

Polymer plates as described herein include plates for flexography made of a material such as photopolymer material that can be cured by exposure to UV, and also letterpress plates (e.g., lithographic plates) that have a photopolymer material coated thereon that is exposed by UV material to cure the coating. Polymer plates as used herein also include cylinders with photo-curable coatings thereon, sometimes called polymer sleeves or photopolymer sleeves. Note that the term "polymer" is not meant to limit the composition of the photo-curable material. Any photo-curable material that is curable by UV radiation is included.

Many polymer plates are optimized for a 365 nm curing wavelength. Depending on the speed by which the polymer plate is imaged, there has to be sufficient UV power available to do sufficient UV curing of the polymer during the inline exposure. For 4 $m^2$/h productivity, the UV power at 365 nm has to be around 150 Watts. State of the art systems that include such so called inline exposure typically use gas filled arc lamps to generate sufficiently high levels of UV energy in the required wavelength or wavelengths. Such arc lamps consume up to several Kilowatts of electrical power to provide the required amount of exposure energy. Furthermore, as much as 98% of this energy is converted into heat or other unwanted wavelengths, and needs to be filtered out and cooled away from the polymer plate. The conversion efficiency of such arc-lamp-based inline exposure systems is usually not better than 1.5% to 2%. Furthermore, such arc lamps run at high voltages, e.g., several hundred to several thousand Volts. Furthermore, such arc lamps typically need to be cooled, e.g., water cooled in order to remove the enormous amounts of waste heat and radiation not needed for the curing process.

The combination of the need for a relatively high voltage and for water or other types of cooling is potentially hazardous.

In addition to the hazards and the waste, heating of polymer plates has a negative impact on the homogeneity of halftone screen dots, e.g., has negative impact on the appearance of a homogeneous screened area. This can further increase the amount of UV energy necessary for curing.

Furthermore, some of the wavelengths produce by such arc lamps, e.g., radiation in the UV-C range can produce artifacts such as relatively brittle screen dots that can break off the plate after as few as a few hundred or perhaps a few thousand impressions. Therefore, there is a need to filter out undesired wavelengths other than the 365 nm range of wavelengths needed to cure a plate.

Such filtering of unwanted wavelengths further reduces the curing efficiency of the 365 nm range wavelength, so that the amount of 365 nm energy necessary for curing is raised.

Arc lamps also are known to produce a light source that is relatively not very diffuse. This causes very thin and small support shoulders of screen dots on a printing plate. Often complex reflector geometries are used in an attempt to compensate for the non-diffuse nature of the light from an arc lamp.

Furthermore, arc lamps are known to have a relatively limited life time. A life of between 500 and 2000 hours is typical.

Flexographic plates designed for CTP imaging are typically photopolymer plates that are pre-sensitized with a coating such as a Laser Ablation Mask System (LAMS) coating that is ablated by a laser in an imager during imaging. The LAMS layer is typically highly sensitive and vulnerable before and after imaging, so that scratches may destroy the flexographic plate and make it unusable.

It is known and the inventors have found that exposing a so-imaged plate with ultraviolet irradiation significantly reduces the hazard of damaging the flexographic plate, e.g., by scratching the plate. The inventors also have found that alternatively so irradiating a plate with UV radiation prior to imaging also significantly reduces the hazard of damaging the flexographic plate, e.g., by scratching the plate.

There is thus an incentive to reduce the amount of handling to automate the process of loading and unloading.

There also is an incentive to reduce the amount of time to load and unload a set of plates.

There also is an incentive to integrate irradiating plates with the process(es) of loading and/or unloading.

DESCRIPTION OF THE DRAWINGS

FIG. 1A shows in a simple cross-sectional view one embodiment of an LED-based exposure system that includes features of the present invention.

FIG. 1B shows a simplified perspective view of elements of one embodiment of the invention.

FIG. 22B shows the area marked I in FIG. 22A magnified.

FIG. 25B shows the area marked I of FIG. 25A magnified.

FIG. 27B shows the area marked I in FIG. 27A magnified.

DETAILED DESCRIPTION

Figure 2:
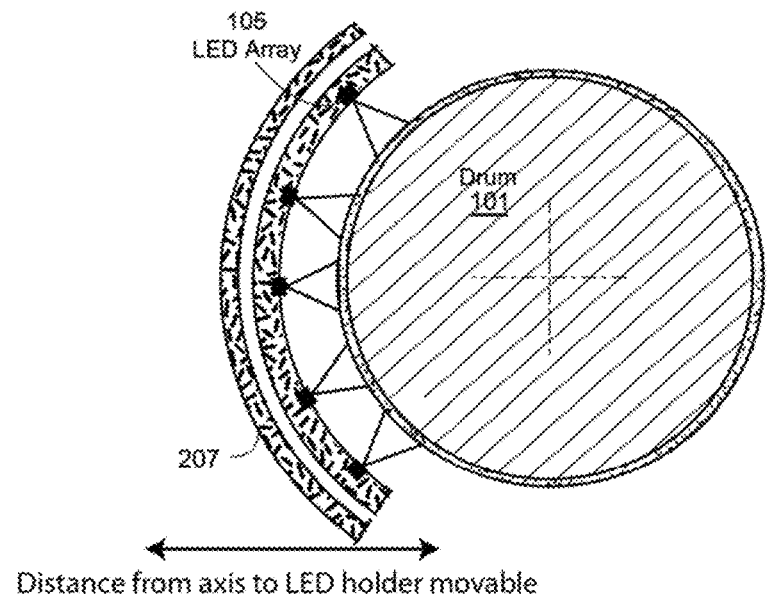
FIG. 2 shows another embodiment of the invention in which an LED holder that holds one or more arrays of LEDs is arranged as a segment of a ring rather than as the mounting ring of the embodiment of FIGS. 1A and 1B.

Embodiments of the present invention include an apparatus configured to expose a plate that has a photocurable material thereon, the exposing using light emitting diodes (LEDs) to cure of the photocurable material thereon. Embodiments further include a method of exposing a plate that has a photocurable material thereon, such as a polymer flexographic plate, a polymer-coated letterpress plate, or a polymer cylinder with UV radiation using LEDs rather than arc lamps.

Throughout the specification and claims, it is to be understood that by exposing a plate is meant exposing a plate that has a photocurable material thereon to cure the material thereon using UV radiation. Plates as described herein are plates that have a photocurable material thereon, and include polymer plates. Such a polymer plate may be a plate for flexography made of a photopolymer material that can be cured by exposure to UV. Such a polymer plate may alternately be a letterpress plate that has a photopolymer material coated thereon and that is exposed by UV material to cure the coating. Such a polymer plate may alternately be a plate on a cylinder. A plate on a cylinder may be a cylinder made of carbon fiber or glass fiber which is coated with a layer of photopolymer that is curable by UV radiation. Such cylinders with a plate thereon are sometimes referred to as polymer sleeves and photopolymer sleeves.

Thus the present invention covers the exposing of any plate of any shape that has photocurable material thereon, e.g., a photopolymer. The present invention is thus applicable to all printing plates on which curing by exposure to UV radiation is applicable.

The term printing plate is understood to mean such a plate herein.

OVERVIEW

Embodiments of the present invention include methods and apparatuses that include exposing a plate to UV radiation using UV emitting LEDs.

Particular embodiments include a method comprising: placing a printing plate on an imaging device; imaging the plate according to imaging data; and applying UV radiation using a plurality of UV emitting LEDs during the process of imaging of the printing plate. In one embodiment, the plate initially has ablatable material, and wherein the imaging includes ablating ablatable material on the plate according to the imaging data to form an ablated plate, and wherein the applying of the UV radiation includes exposing the ablated plate to UV radiation to cure the plate. In one embodiment, the imaging device is an external drum imager that includes a drum that rotates during imaging.

Particular embodiments include a method comprising: placing a printing plate on an imaging device; imaging the plate according to imaging data; removing the imaged plate; and applying UV radiation to the back of the printing plate using a plurality of UV emitting LEDs during or after the removing of the imaged printing plate.

Particular embodiments include a method comprising: placing a printing plate on an imaging device; imaging the plate according to imaging data; removing the imaged plate; and applying UV radiation to the back or front of the printing plate or to both the front and the back of the printing plate using a plurality of UV emitting LEDs during or after the placing of the plate or the removing of the imaged printing plate.

Particular embodiments include an apparatus comprising: a rotatable imaging drum arranged to have a plate or a sleeve with a plate thereon, the drum operative to rotate during an imaging process; a source of one or more laser beams coupled to a source of image data and operable to image a plate on the drum, including moving in the direction of the axis of rotation of the drum during the imaging process; and a plurality of UV emitting LEDs operative to expose at least an imaged portion of the plate during the imaging process to cure the at least imaged portion of the plate.

In one embodiment, the plate initially has ablatable material, and wherein the imaging ablates ablatable material on the plate according to the imaging data to form an ablated plate. In one embodiment, the plurality of LEDs is in the form of a plurality of arrays of LEDs.

Embodiments include a method and an apparatus to aid the loading and unloading of flexographic plates to and from an imager. The apparatus includes a loading area holding one single or a plurality of flexographic plates and an unloading area holding a single flexographic plate, the areas arranged vertically, and a control system to control the automated loading and unloading mechanism. In one version, the loading includes automatically loading a plate onto the loading area, and in the case that the plate includes a protective sheet thereon, the automatic loading to the loading area includes removing the protective sheet from the plate. One embodiment of the apparatus also includes one or more sources of ultraviolet (UV) energy configured to irradiate flexographic plates with ultraviolet radiation at some time or times during the process that includes loading and unloading, and controlled by a control system. One arrangement includes UV radiating prior to the plates being imaged, and another arrangement includes UV radiating after the imaging, and yet a third embodiment includes UV radiation of the underside of the plate prior to imaging, and UV radiating the top side after imaging. Particular embodiments may provide all, some, or none of these aspects, features, or advantages. Particular embodiments may provide one or more other aspects, features, or advantages, one or more of which may be readily apparent to a person skilled in the art from the figures, descriptions, and claims herein.

Using UV LEDs

LEDs that produce energy in the wavelength range suitable for exposing polymer plates are already available, and are used, e.g., for curing inks, such as inkjet inks. However, the amount of energy required for UV curing of a plate is relatively high. The inventor has recognized that LEDs that can produce light in the useful UV wavelength range have reached a stage of development where they are not only rugged and reliable, but also deliver sufficient output powers, that is, if enough of them are used, sufficient energy is available for the curing of plates.

LED arrays which provide about 0.25 Watts of UV @ 365 nm are already available. For example, Opto Technology, Inc. of Wheeling, Ill., for example, has an array of LEDs packaged in a TO-66 package called "Shark"™ that can be mounted on a heatsink, and that produces UV at the 375 nm range. The company is planning a 365 nm version that is in the wavelength range for curing printing plates. For 150 Watts of UV energy, a device with an array of 600 LEDs is usable for inline UV exposure of plates at an approximate rate of 4 $m^2$/h.

The conversion efficiency for such LEDs is around 4-5% which is twice as good as arc lamps.

Waste energy is converted into heat. One version of the arrays is on a package mountable on a heatsink. In one embodiment, the excess heat is removed by using water cooled heatsinks with the LEDs. This reduces the heat to which the polymer plates are exposed. Insulation material further can be sued to mask heat radiated from the heatsinks towards the plates.

Thus the inventor recognizes that LEDs need less energy not only because of their better electro/optical conversion efficiency but also due to better process efficiency.

Also LEDs are known to last longer than typical arc lamps. Given sufficient cooling, LEDs should be able to operate for more than 10,000 hours, which is 5 to 20 times more than typical arc lamps used for inline exposure.

Furthermore, LEDs are powered by relatively low voltage DC power compared to arc lamps.

Thus, the inventor recognizes that it is possible to use multiple UV LEDs, e.g., multiple UV LED arrays for plate curing.

FIG. 1A shows in a simple cross-sectional view one embodiment of an LED-based exposure system that works with an external drum digital imager that includes a rotating drum 101 around which a plate 103 such as a flexographic plate that has an ablatable mask thereon is placed to be imaged by one or more lasers modulated according to imaging data.

Define the axial direction as the direction of the axis of rotation of the drum. One embodiment of the digital imager includes the source of laser light 113 modulated by the imaging data moving in the axial direction during rotation of the drum so that the imaging data eventually images the whole drum by ablating the mask material.

One embodiment includes a plurality of LED arrays 105 mounted on the inside surface of a mounting ring 107 made of heatsink material that is placed around the circumference of the drum 101 so that the LED arrays 105 expose the surface of the drum 101 or a plate 103 thereon when turned on. The mounting of the LED arrays 105 includes thermally coupling the LED arrays 105 to the heatsink material. One embodiment uses common TO-66 packaged LEDs.

Note that, for the purpose of describing embodiments of the invention, like elements that are used in different drawings or configurations have the same reference numeral. For example, LED arrays in any example embodiment of the invention use reference numeral 105. Those in the art will understand, however, that these arrays may not be identical or substitutable from embodiment to embodiment.

The mounting ring 107 is movable in the axial direction and is arranged to follow the modulated laser beam or beams 113, so that as the drum rotates and the plate 103 thereon is imaged, the plate 103 after imaging, i.e., with the mask thereon ablated according to the imaging data is exposed to UV radiation from the LED array(s) 105. The mounting ring 107 thus moves in the axial direction relative to the surface of the drum at the same rate and behind the modulated laser beam(s) 113.

In FIG. 1A, the mounting ring 107 included cooling channels—water channels—to which is coupled a supply of cooling liquid 109, e.g., water.

In one embodiment, as an additional measure, the inside surface of the mounting ring 107 other than where the LED arrays 105 emit their energy is insulated so that heat is not radiated in the direction of the drum 101.

FIG. 1B shows the arrangement in a simplified perspective view. The direction of motion of the laser beam(s) 113 and mounting ring 107 is shown as direction 111, and is shown left to right relative to the rotating drum 101.

FIG. 2 shows another embodiment in which an LED holder 207 that holds one or more arrays of LEDs 105 is arranged as a segment of a ring rather than as the mounting ring 107 of the embodiment of FIGS. 1A and 1B. In one embodiment, the LED holder 207 covers about 90 degrees, so it is in the form of a quarter-ring.

One such embodiment includes a mechanism that allows the distance from the axis of rotation to the ring holder 207 to be varied. This allows the exposing unit to be used with drums of a plurality of diameters, with the distance changed to accommodate any particular diameter.

This embodiment is for drums, or sleeves that have relatively small diameters. The arrangement of FIG. 1 might not be suitable such cases, because there might not be sufficient surface to place a sufficient number of LEDs around the circumference.

One such embodiment is suitable for use with a range of drum or sleeve diameters.

Figure 3:
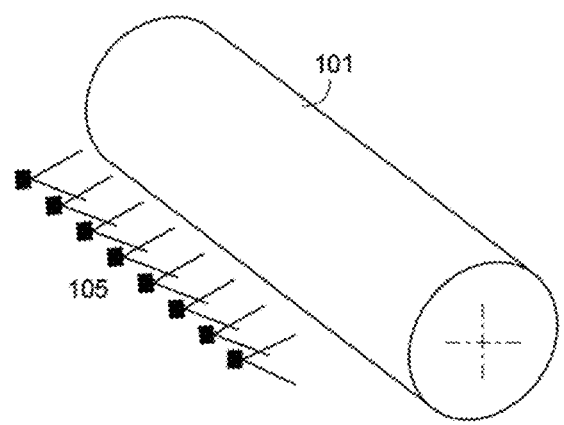
FIG. 3 shows a different embodiment of the invention in which the LEDs are arranged in a segment that is moveable towards and away from the axis of rotation of the drum.

FIG. 3 shows a simple perspective view of another embodiment that, like the embodiment of FIG. 2, is suitable for small diameter drums or sleeves, and also that provides for having different drums or sleeves of different sizes. In FIG. 3, the LED holder does not move in the axial direction, e.g., does not follow the laser beam in the axial direction, but is fixed in such a direction. The holder for the LED array(s) 105 extends the whole length of the drum. One such embodiment still provides for varying the distance from the LED array(s) and the axis of rotation of the drum to accommodate different drums or sleeves of different diameters.

Figure 4:
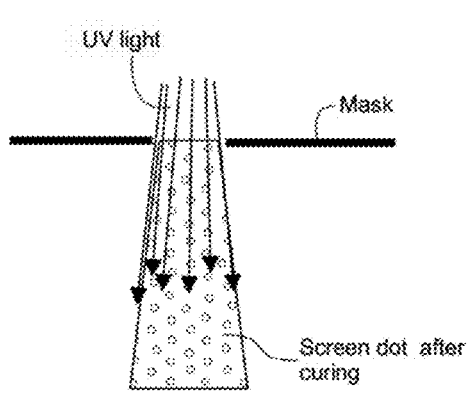
FIG. 4 is to show how a light source with relatively low diffusion results in a screen dot with a narrow support structure.

FIG. 4 shows a problem that can occur with arc lamps without reflector geometries that avoid the relatively high brightness of such sources. Such arc lamps, without complex reflector structures, may cause small, steep support shoulders of the screen dots as shown in FIG. 4. These support shoulders give relatively little support during printing, and may cause the screen dot to bend under pressure as might occur during printing.

Figure 5:
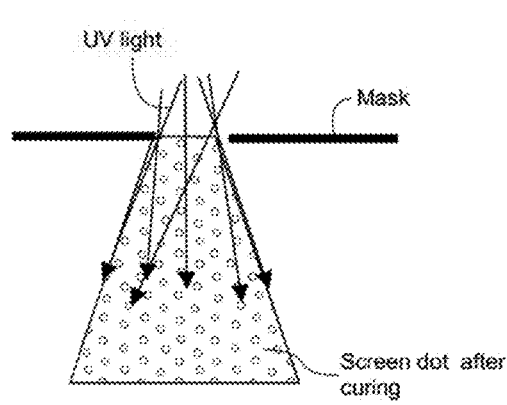
FIG. 5 is to show how a light source with relatively high diffusion results in a screen dot with a relatively wide support structure.

Complex reflector geometries are usually added to arc lamps to lower the brightness and produce more divergence and diffusion in the beam. Such lower brightness and high divergence and diffusion create broader shoulders in the cured polymer, as shown for a one halftone dot in FIG. 5.

Figure 6:
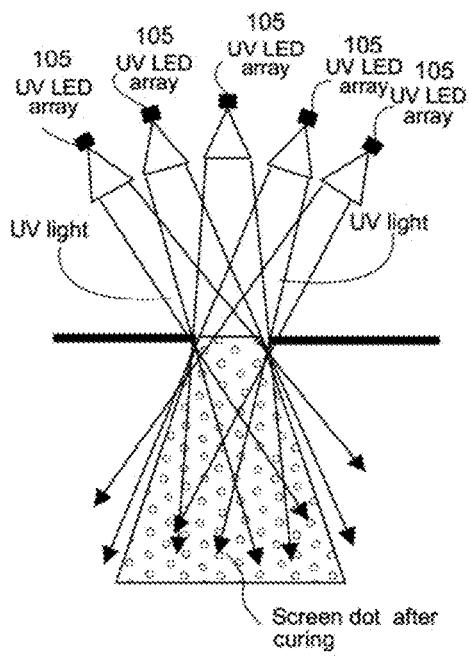
FIG. 6 shows one embodiment of the invention in which a plurality of LED arrays are arranged at different angles.

FIG. 6 shows how using a plurality of LEDs or LED arrays 105 can help produce a widely divergent (diffuse) beam. Each of the LED arrays 105 is placed to provide radiation at a slightly different angle. A relatively large number of such LED arrays is used in one embodiment, so that the LEDs can be aimed differently to produce a relatively divergent set of beams, resulting in broad shoulders. This is illustrated in FIG. 6 which shows five arrays 105 producing in combination a divergent set of beams, resulting, in this illustration, in a cured halftone dot that has relatively broad shoulders, compared, e.g., to the halftone dot shown in FIG. 4.

Figure 7A:
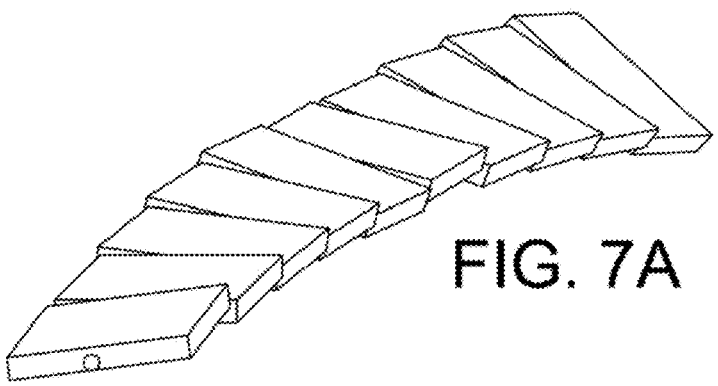
FIG. 7A shows an embodiment of the invention in which a mounting ring is divided into segments that hold the LED arrays with each segment tiltable with respect to the drum's axis of rotation.
Figure 7B:
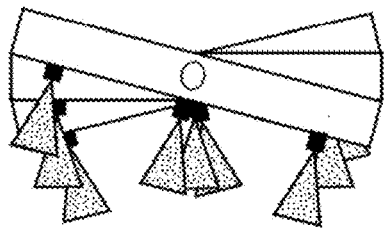
FIG. 7B shows an embodiment of a segment of a mounting ring that is tiltable with respect to the drum's axis of rotation and has LED arrays mounted on it.

FIG. 7A shows a perspective view and FIG. 7B shows an end view of a part of a ring structure on which the LED arrays 105 are mounted. The rings structure is made up of a plurality of segments, onto which are mounted the LED arrays 105. The segments are each tilted at a different angle relative to the axis of rotation of the drum, so that beams at different directions are produced.

Figure 8:
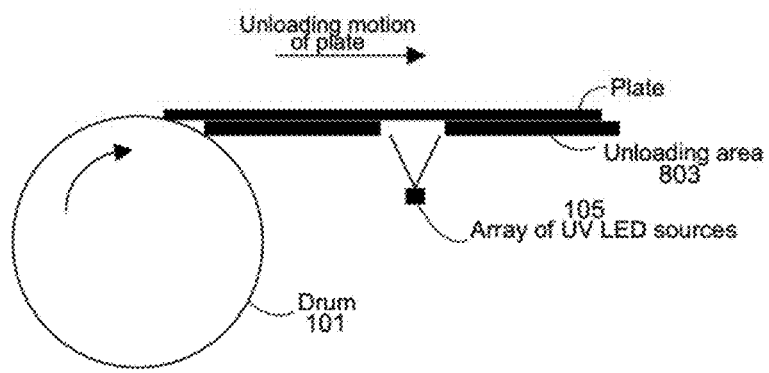
FIG. 8 shows one embodiment of the invention in which the LED arrays are arranged in a line at the location where a polymer plate travels along during unloading from the drum such that the back of the plate can be exposed.

While the above describes using UV LED sources for curing of the plate material from the top through the mask, it is also known that back-exposure improves the quality of plates, e.g., flexographic plates. FIG. 8 shows in simplified form an apparatus usable to expose the back of such plates after imaging as part of the process of unloading a plate from the drum imager. An array of UV LEDs 105, or an array of arrays of UV LEDs' is placed along the width of an unloading area 803 onto which a plate is unloaded from an imaging drum 101 so that there is in-line exposure during unloading. The unloading area 803 has a window underneath the plate when on the loading area that allows UV radiation from the bottom under the unloading area to irradiate the back of the plate after imaging, e.g., in the process of unloading. The energy density is calculated so that the plate may be moved over the array of (arrays of) UV LEDs to sufficiently expose the back of the plate.

U.S. Provisional Patent Application No. 60/916,738 filed May 8, 2007 to inventors Wolterink et. al, and titled METHOD AND APPARATUS FOR LOADING AND UNLOADING FLEXOGRAPHIC PLATES FOR COMPUTER-TO-PLATE IMAGING INCLUDING SEPARATE LOADING AND UNLOADING AREAS described automatic inline exposure. The contents of such Patent Application No. 60/916,738 are incorporated herein by reference, and expressly included below. An implementation of the present invention can be added to any of the embodiments described in U.S. Patent Application No. 60/916,738, in the form of a set of arrays of UV LEDs for front exposure, back exposure, or both front and back exposure. How to so modify the description of any embodiment described in U.S.

Patent Application No. 60/916,738 would be clear to one in the art from the description herein and in the cited Wolterlink et al. patent application.

Figure 9:
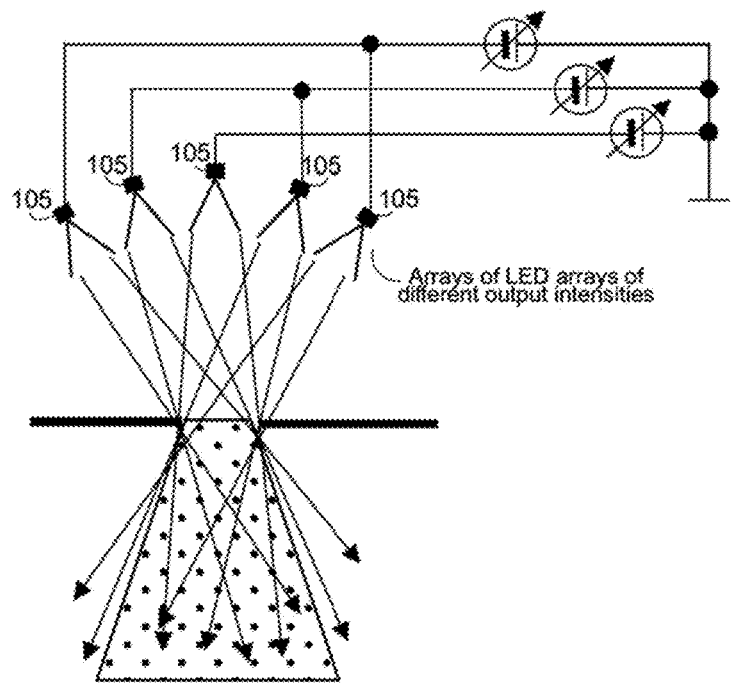
FIG. 9 shows another embodiment of the invention in which LED arrays of different wavelengths are used.

FIG. 9 shows in simplified form another embodiment wherein the LED arrays 105 operate at a variety of wavelengths in order to influence one or more properties of the cured material. In the simplified drawing, three different UV LED wavelengths are used each to drive one or more arrays of LEDs, in this case, using three different power supplies. By having each set of LEDs of a particular wavelength driven by its own power supply that is independently controlled, the wavelength mixture, e.g., the relative amount of each wavelength for the exposure can be precisely controlled. By having individual control, not only the intensity, but the exposure time for each component wavelength can also be precisely controlled.

Yet another embodiment replaces common back exposure systems that use one or more arc lamps for UV exposure of a plate after imaging by an exposure system that uses a plurality of LEDs or arrays of LEDs for the UV exposure. In one embodiment, such an exposure unit exposes the area of a whole plate. In another embodiment, the exposure unit exposes the width of a plate, and the plate travels relative to the source of UV radiation.

Many of the features described above are included in different embodiments of the LED exposure system that replaces a conventional bank exposure unit. In one embodiment, the exposure unit includes heatsink material on which the LEDs are mounted. In one version, the LEDs are oriented in a plurality of directions to produce UV beams of wider divergence, e.g., more disperse, so that the curing of the plate material produces better edges. In one version, LEDs of several wavelengths are used, each set of LEDs of different wavelengths driven by its independently controllable power source, so that the radiation produced can be tailored to be made up of different amounts of the wavelengths of the LEDs for spectral shaping.

Thus has been described use of UV LEDs or LED-arrays for curing photopolymer plates during the imaging process. Thus also has been described use of UV LEDs or LED-arrays for curing photopolymer plates after the imaging process. This may offer several advantages over state of the art arc lamps. One embodiment described includes LEDs arranged on the inner side of a ring which surrounds the surface of a rotatable drum of a drum imaging device. A photopolymer plate may be placed on the surface. The ring of LEDs travels in the axial during the laser imaging process to cure the imaged plate during the imaging process.

One feature compared to arc lamp curing is the relative absence of heat radiation, which otherwise may have negative impact on the curing process.

Another feature is that LEDs can be designed to only the wavelength (or wavelengths for a plurality of LEDs) needed for the curing process. Other wavelengths which reduce the quality of the cured plate are not present and so need not be filtered out.

Another feature is easy relative ease of adjustment of the curing light divergence by arranging the plurality of LEDs at various angles with respect to the plate surface. A more divergent set of beams may produce better curing than a less divergent set of beams.

Loading and Unloading Plates

The following describes an apparatus, method, and system for automated plate loading, imaging and unloading of flexographic plates and further a process step that includes ultraviolet irradiation of the plates.

One feature is including two separate areas, one for loading a plate and one for unloading a plate. Having such separate areas means that during imaging of a flexographic plate on the imager, in some embodiments, the next plate for loading onto the drum can be prepared including moving onto the loading area, and in some embodiments, irradiating the underside of the plate. Furthermore, in some embodiments, at the same time, the previously imaged plate that was unloaded from the drum can be in the middle of being unloaded, and/or in some embodiments, be irradiated with ultraviolet radiation. In some embodiments, one or more of (a) the preparing for loading, including moving onto the loading area, the (b) continuing with the unloading, and/or the irradiating can occur while (c) the next plate is imaged by the imager. Such a pipelined system reduces the extensive downtime that occurs by loading, unloading, irradiating and imaging using an imager.

Flexographic plates designed for CTP imaging are typically photopolymer plates that are pre-sensitized with a coating such as a Laser Ablation Mask System (LAMS) coating that is ablated by a laser in an imager during imaging. The LAMS layer is typically highly sensitive and vulnerable before and after imaging, so that scratches may destroy the flexographic plate and make it unusable. It is known and the inventors have found that exposing a so-imaged plate with ultraviolet irradiation significantly reduces the hazard of damaging the flexographic plate, e.g., by scratching the plate. The inventors also have found that alternatively so irradiating a plate with UV radiation prior to imaging also significantly reduces the hazard of damaging the flexographic plate, e.g., by scratching the plate.

Some embodiments include integrating an ultraviolet source subsystem including one or more ultraviolet sources with the loading and unloading, the ultraviolet source subsystems configured to expose the flexographic plate to ultraviolet radiation on one side, or another side, or both sides of the plate. By so integrating the irradiating with the loading and unloading into an automated process such that the vulnerability of plates to damage by manual operation is reduced.

Another feature of some embodiments is reducing the process time for flexographic plate making by having a pipeline that carries out more than one operation on more than one plate at the same time.

Embodiments further include automated loading of the plate onto the loading area, automated loading from the loading area onto the drum, and automated unloading of the plates to reduce the need to handle the plates by an operator.

One embodiment includes a semi-automated loader of a plate. In the case of a semi-automated arrangement, an operator manually loads and positions a plate on the loader at a loading position on the loading area. In the case that a protective sheet is included on the plate, the operator also removes the protective sheet. The remainder of the process: loading the plate onto the imager from the loading position, imaging the plate on the imager according to imaging data, and unloading of the plate is carried out automatically under control of a control system. In the case ultraviolet irradiation is included, such irradiating also is automatic under control of the control system.

Another embodiment includes a fully automated loader. In the case of such an automated arrangement, a mechanism picks up a plate, e.g., from a stack of plates or on another embodiment, from a compartment of a magazine of plate compartments, places the picked up plate to a loading position on the loading area, in the case that a protective sheet is included on the plate, removes the protective sheet.

The remainder of the process is the same as in the semi-automated loader embodiment: the loading of the plate onto the imager from the loading position, imaging the plate on the imager according to imaging data, and unloading of the plate is also carried out automatically.

Some semi-automatic loading embodiments and some fully automatic loading embodiments, include one or more UV irradiation subsystems integrated and configured to expose the plate to UV radiation in a fully automatic manner under control of the control system. The irradiation in one set of embodiments is of to-be-imaged plates, and occurs, e.g., during loading. The irradiation in another set of embodiments is of an imaged plate, and occurs, e.g., during unloading. The irradiation in another set of embodiments occurs, during loading and unloading.

Figure 10:
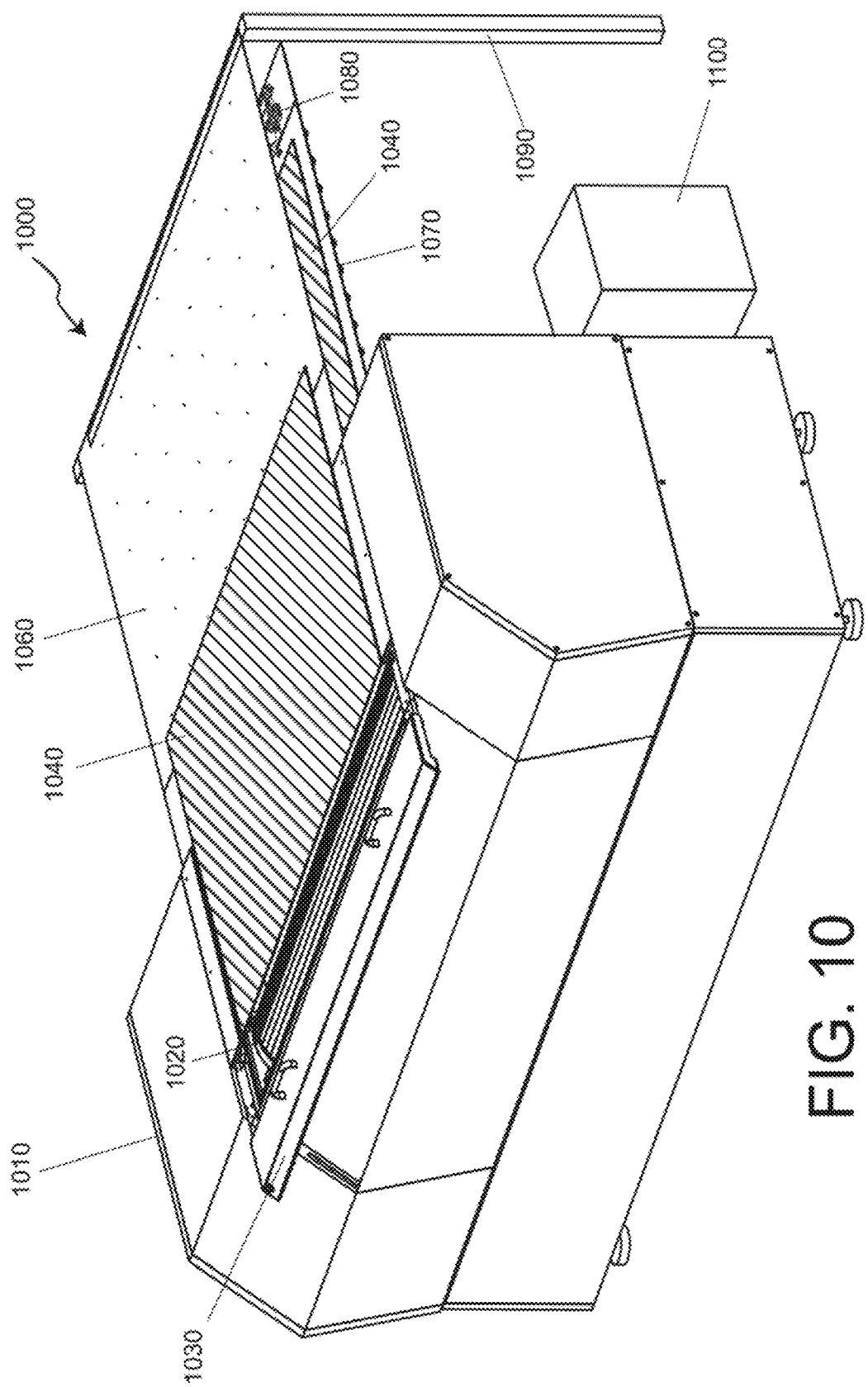
FIG. 10 shows one embodiment of a system that includes an external drum imager for flexographic plates or photopolymer letterpress plates, and a loader that includes a loading area and an unloading area each for holding a single plate.

FIG. 10 shows one embodiment of a system 1000 that includes an external drum imager 1010 for flexographic plates and a novel loader that includes a loading area and an unloading area each for holding a single flexographic plate. The loading area and the unloading area are each approximately horizontal and arranged vertically to each other. In the example embodiment described herein, the unloading area is under the loading area One embodiment of the imager 1010 includes a rotatable drum 1020 for loading a flexographic plate 1040 thereon. A door mechanism 1030 provides access to the drum for loading and unloading and is closed during imaging. In order to show the drum in FIG. 10, the door mechanism 1030 is shown in its open position. The imager 1010 includes at least one laser source that provides one or more laser beams modulated by imaging data, e.g., sets of data for each of a plurality of color separations for exposing the respective plates for a color print. Each laser is configured for exposing CTP flexographic plates, e.g., has the appropriate energy and wavelength for exposing the particular type of coating, e.g., type of LAMS coating on the flexographic plates. An example of one such flexographic imager 1010 is the Esko-Graphics Cyrel™ Digital Imager (Esko-Graphics, Gent, Belgium) made by Esko-Graphics, the assignee of the present invention.

In order not to obscure the inventive aspects, the novel loader is shown in FIG. 10 in simplified form.

In one embodiment, the novel loader includes a frame 1090, a horizontal loading area 1060 and a horizontal unloading area 1070, each of the loading and unloading area designed for holding a single flexographic plate. One feature is that the loading and unloading areas are separate so that while one plate is positioned at the loading position on the loading area 1060, another plate can be unloaded or situated at the unloading area 1070. In the embodiment shown, the unloading area 1070 is arranged vertically beneath the loading area 1060. FIG. 10 shows a plate 1040 on the loading area 1060 and another plate in the unloading area 1070.

One feature of an embodiment is the automatic loading of a plate onto the drum from the loading area 1060, and another feature is the automatic unloading of a plate, e.g., an imaged plate from the drum onto the unloading area 1070. Another feature of some embodiments is the automatic positioning of single plate from a stack of plates or a magazine of compartments of plates onto the loading area 1060 and automatic removal of any protective coversheet from the top of the plate during positioning onto the loading area 1060 or during loading onto the drum.

Another feature of an embodiment is the automatic exposure of the plate to light, e.g., to UV-radiation, in one version during positioning onto the loading area 1060, in other embodiments, during loading onto the drum or during unloading onto the unloading area or when lying on the unloading area, or during more than one of these phases. The loading, unloading, automatic positioning when included and UV features are controlled under control of the control system 1100.

The edge of the plate parallel to the drum axis and closest to the imager when the plate is in the horizontal position is called the front edge, and that furthest from the imager is called the rear edge.

Figure 11:
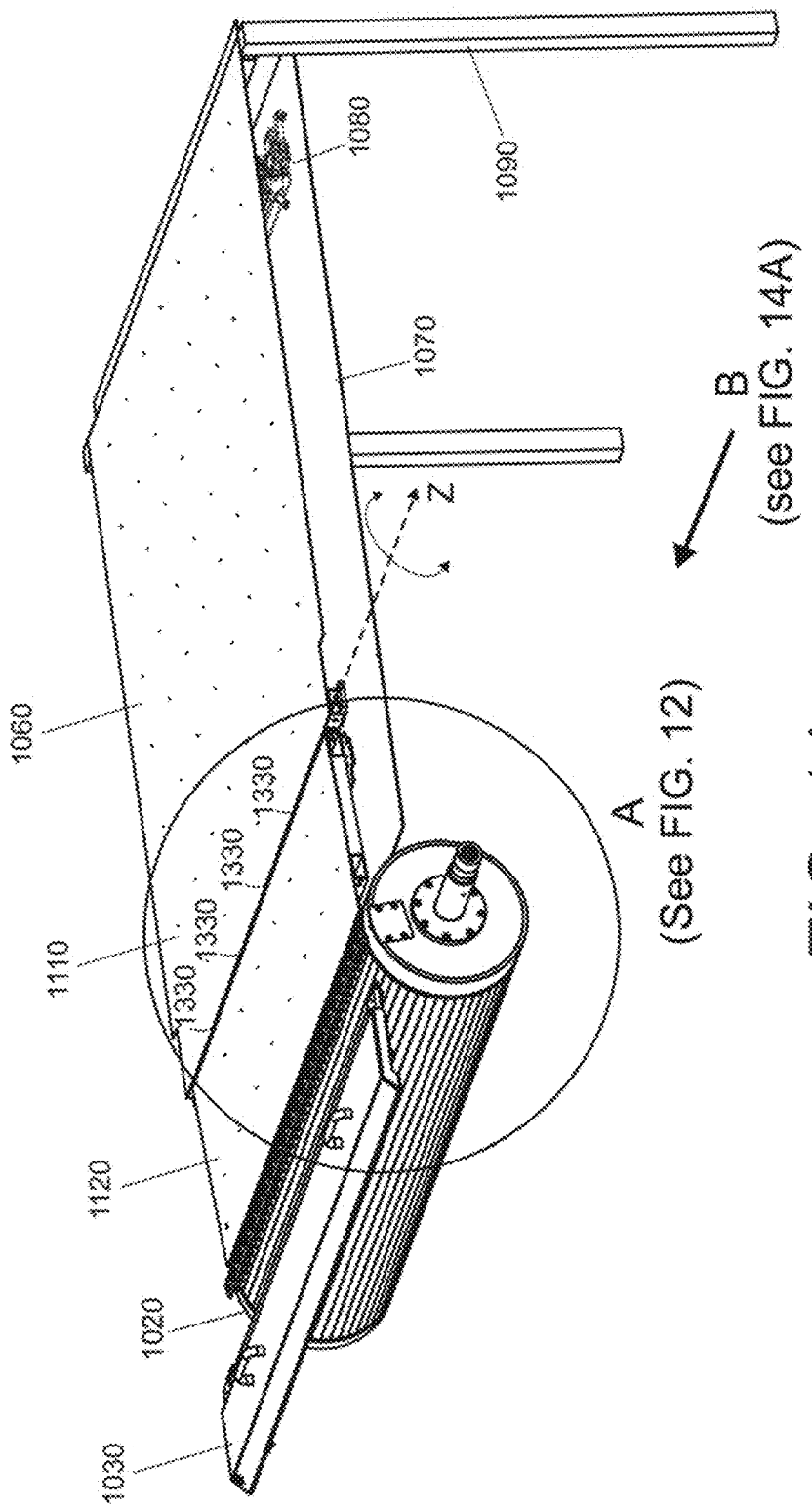
FIG. 11 shows the system of FIG. 10 in simplified form.
Figure 12:
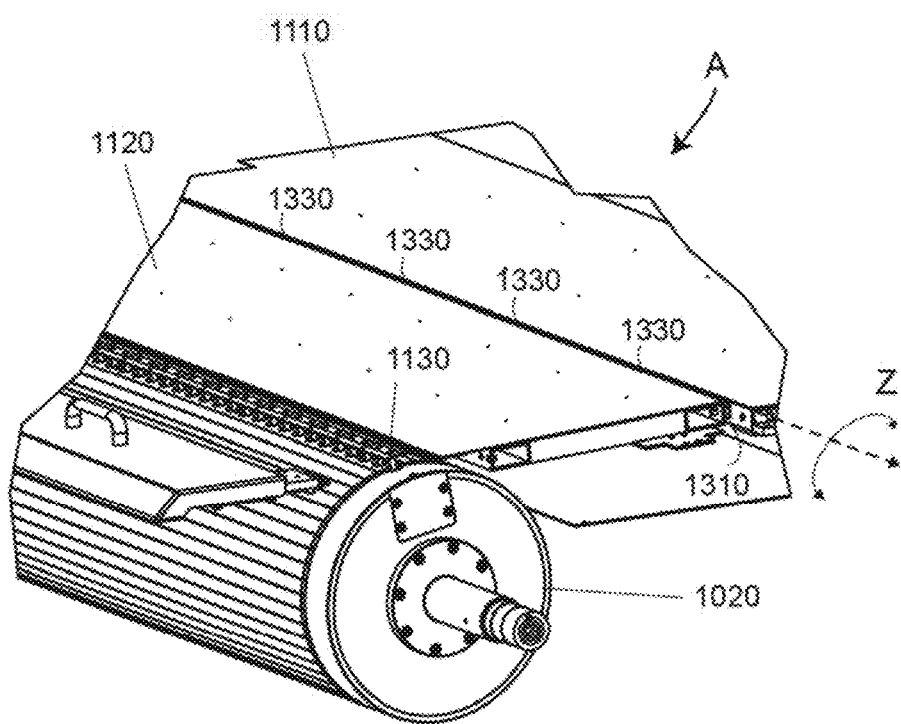
FIG. 12 shows the region marked A in FIG. 11 in magnified form.

FIG. 11 shows the system in simplified form, and FIG. 12 shows the region marked A in magnified form. These drawings show the imager is reduced to the drum 1020 that includes an automated clamp 1130, e.g., a T-shaped clamp as described in U.S. Pat. No. 7,165,492 to Koberg, et al. titled METHOD AND APPARATUS TO CLAMP AND RELEASE FLEXIBLE PLATES ONTO AN IMAGING CYLINDER. The loading area 106 includes two parts: a front loading part 1120 which is closest to the drum and a rear loading part 1110 which is horizontally arranged on the rear side opposite to the one closest to the drum. In one embodiment, the front loading part 1120 is hingeably connected by a hinge mechanism 1310 to the rear loading part 1110 and can be tilted along the front part's rear edge 1330 to rotate about an axis shown as Z. Tilting downwards causes its front edge to be lowered towards the surface of drum. By the front loading part 1120 being closed is meant the front loading part 1120 co-planar with the rear loading part 106. The front loading part 1110 is so closed during imaging, and, as described below, can be tilted at the hinge edge 1330 so that the front edge of a plate thereon is moved towards the drum surface as part of loading. The front and rear loading parts 1120 and 1110 together form the loading area 1060.

Figure 13A:
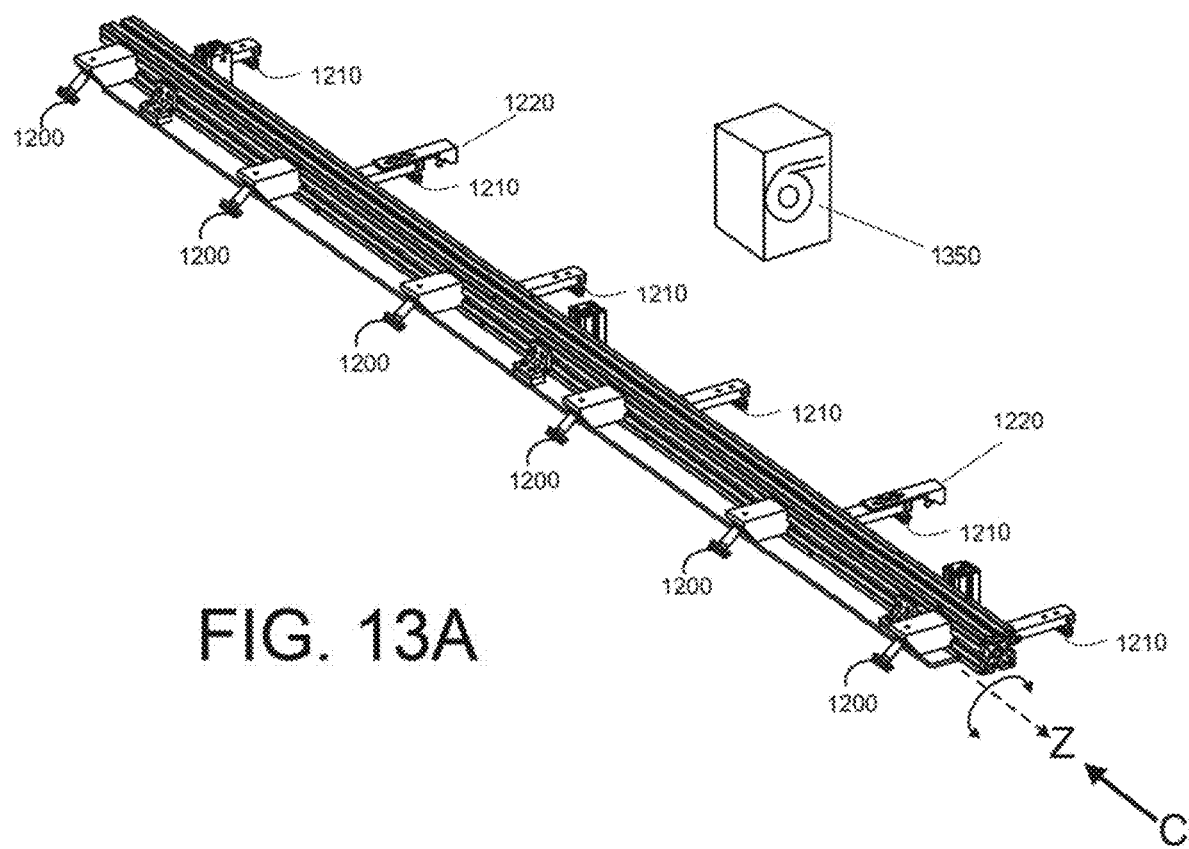
FIG. 13A shows a perspective view of an embodiment of a grabber mechanism included in an embodiment of the system.
Figure 13B:
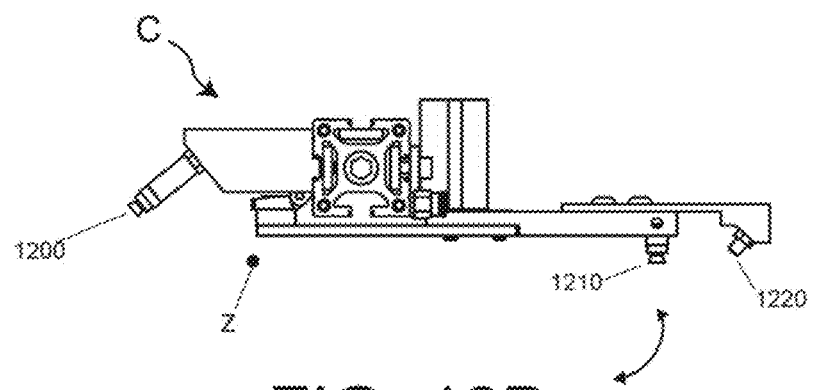
FIG. 13B shows an end view labeled C in FIG. 13A of the grabber mechanism embodiment shown in FIG. 3A.

The system further includes a grabber mechanism 1080. FIG. 13A shows a perspective view and FIG. 13B an end view labeled C of the grabber mechanism 1080 that includes a first set of vacuum cups (also called suction cups) 1200 arranged in the front (drum) side, a second set of vacuum cups (also called suction cups) 1210 arranged in the rear side (away from the drum), and a set of air injectors 1220 also arranged in the rear side. There is a supply of vacuum 1350 that is controllable by the control system 1100 to turn on or off vacuum to the first set of vacuum cups 1200 closest to the imager, and to turn on or off vacuum to the second rear set of vacuum cups 1210 under control of the control system 1100. The same supply 1350 also is used in one embodiment to turn on or off a supply of air to the rear air injectors 1220, again under control of the control system 1100. The supply 1350 is shown in symbolic form in FIG. 13. Furthermore, those in the art will understand that there are valves and supply hoses included for such function, and such details are not shown in the drawings in order not to obscure the inventive aspects of the example embodiment. The grabber mechanism is movable under control of the control system 1100 in the horizontal direction as indicated in FIG. 14 where the direction to the drum is called front direction and the direction away from the drum is called rear direction. Also the rear vacuum cups 1210 and the rear air injectors 1220 are hinged to the grabber mechanism and can be tilted along the axis labeled Z in FIG. 13A, under control of the control system 1100.

Figure 14A:
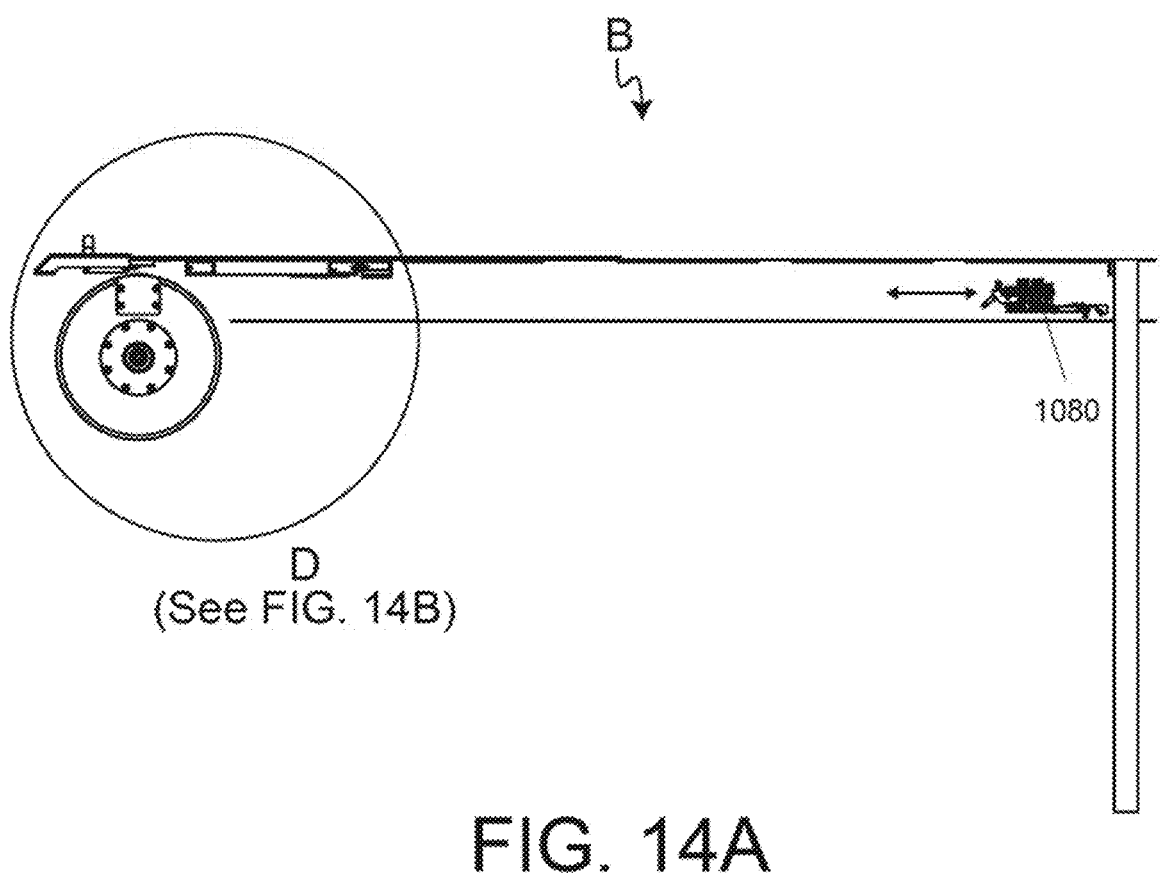
FIG. 14A shows a side view of an embodiment of the system in simplified form in which the imager is represented only by the drum.
Figure 14B:
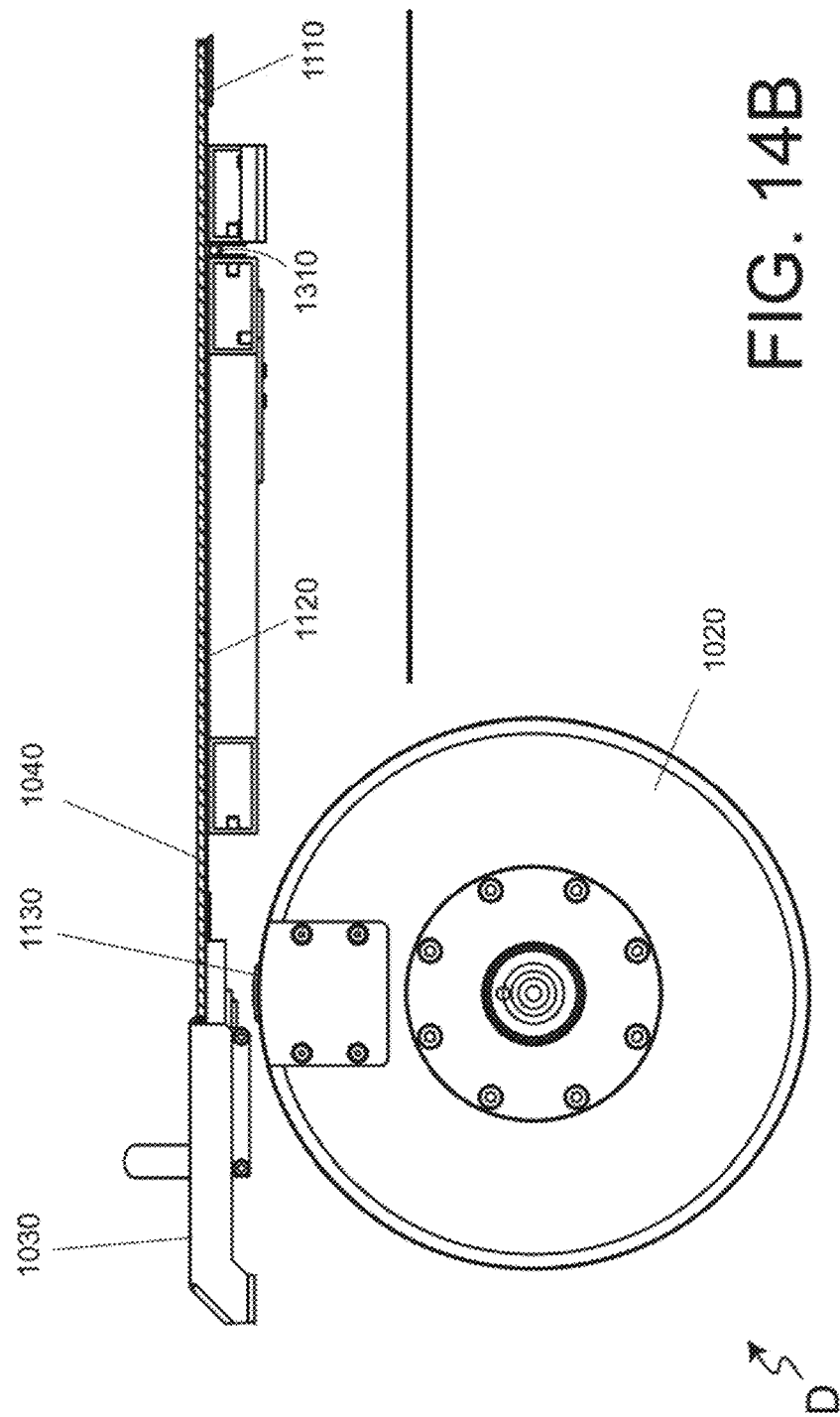
FIG. 14B shows a magnified view of the region labeled D in FIG. 14A.
Figure 15:
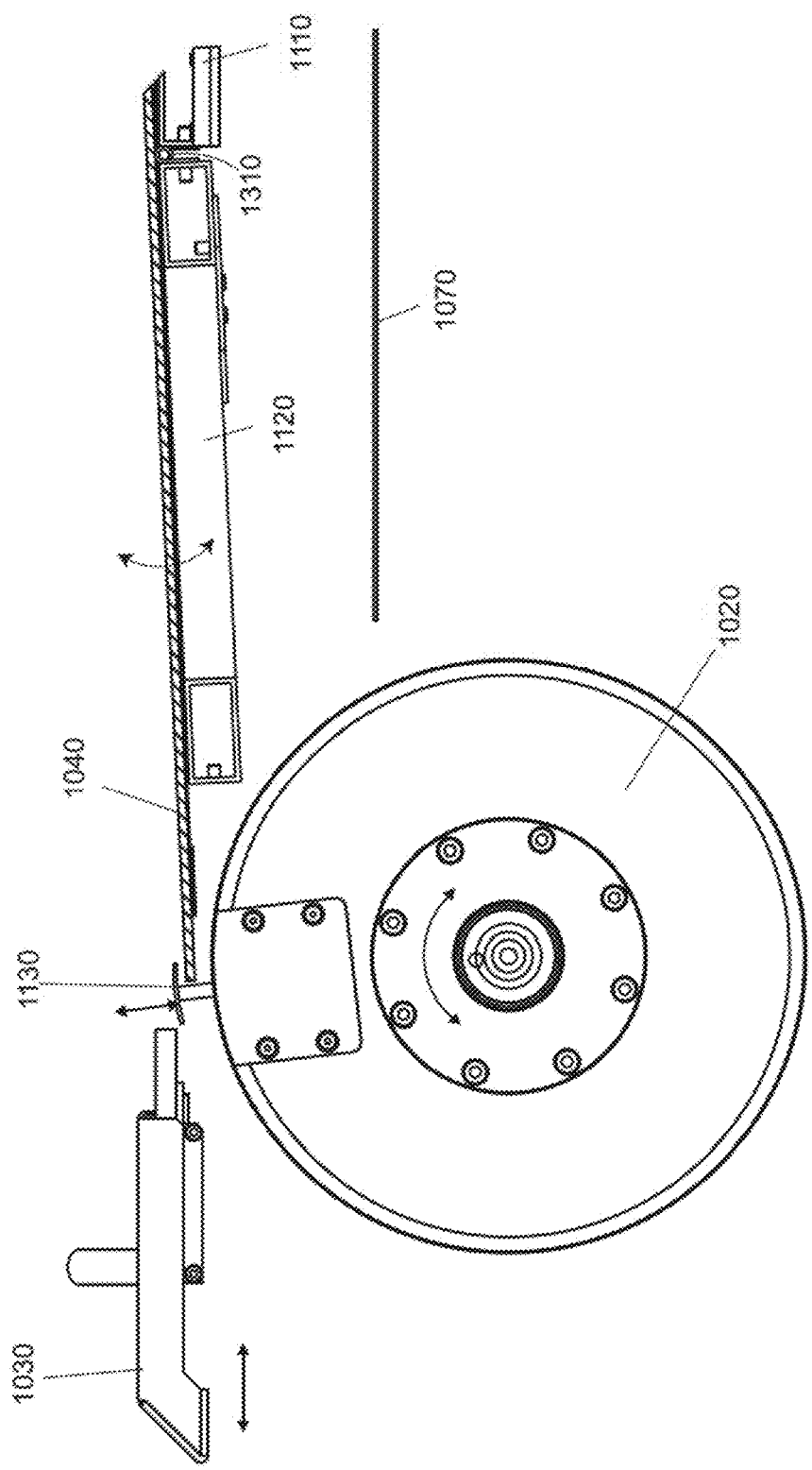
FIG. 15 shows a side view of an embodiment of the imager with the front edge of a plate in the gap between the clamp and the outer surface of the drum.

FIG. 14A shows a side view of the system 1000 in simplified form in which the imager is represented only by the drum. FIG. 14B shows a magnified view of the region labeled D. The door mechanism 1030 and the front loading part 1120 are shown in the in closed position in which the front loading part is co-planar with the rear loading part to form the loading area 1060. A plate 1040 is shown thereon. The drum 1020 is shown after being moved under control of the control system 1100 to a loading position wherein the automated clamp 1130 is in an upright position and is closed. The loading position is configured so that when the clamp 1130 is opened, e.g., raised relative to the drum surface to form a gap between the clamp and the drum surface, the front edge of a plate can be moved into the gap region between the clamp and the drum surface. When a plate 1040 with any protective coversheet removed is positioned in a plate loading position such that the front edge of the plate 1040 is positioned directly against the edge of the door mechanism 1030, the control system in operation causes the door mechanism 1030 to move to an open position and causes the front loading part 1120 to tilt down by counterclockwise rotation in the views shown, with the plate 1040 and its front edge thereon. The control system in operation causes the automated clamp 1130 to open and the drum is positioned so that one side of the clamp 1130 is directly over the front edge of plate 1040, i.e., the front edge of the plate is in the gap between the clamp 1130 and the drum surface. FIG. 15 shows a side view of the imager with the front edge of the plate 1040 in the gap between the clamp 1130 and the outer surface of the drum 1020 so that closing the clamp 1130 would clamp the front edge of the plate onto the drum.

Figure 16:
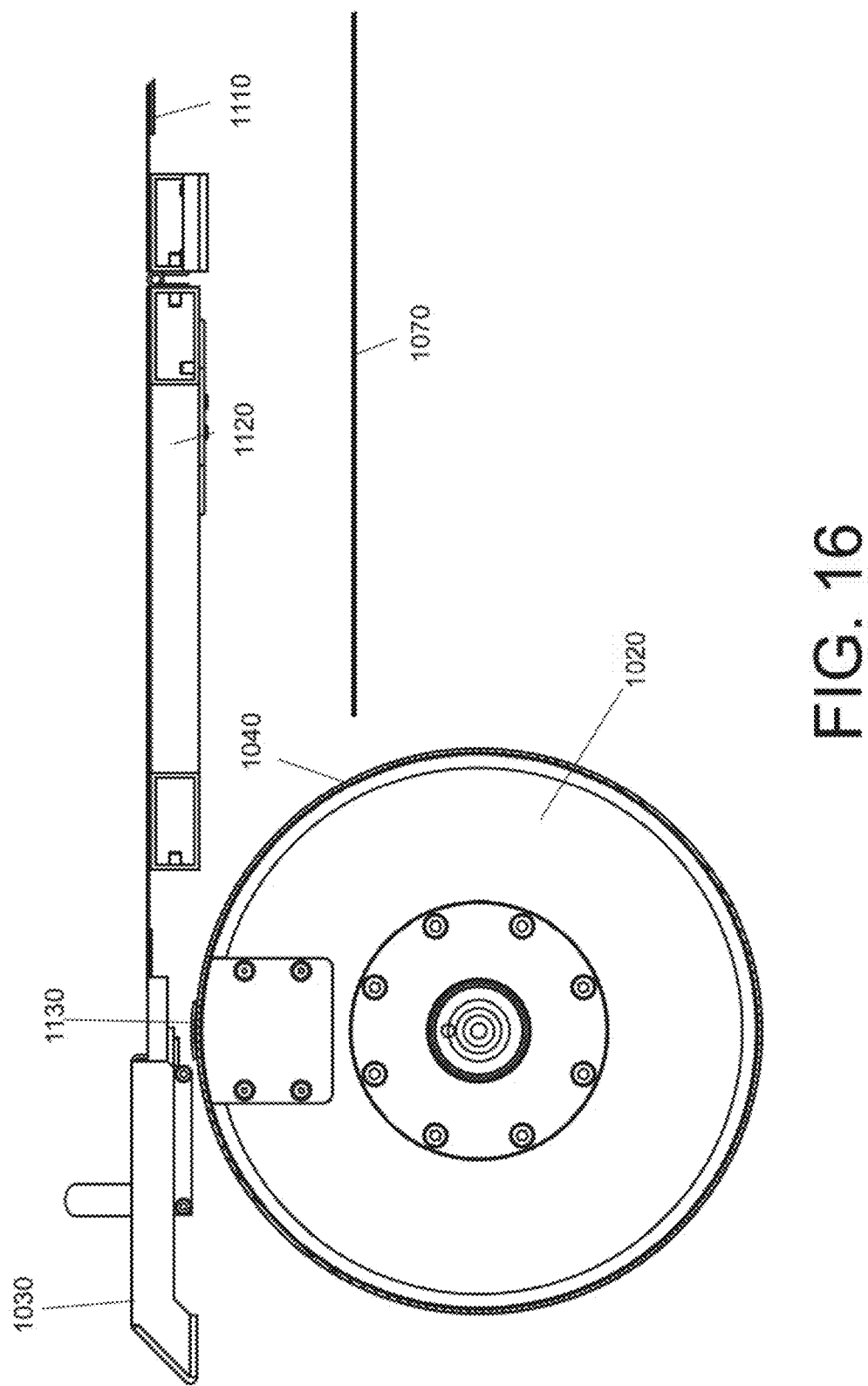
FIG. 16 shows a simplified side view of an embodiment of the imager in a position of a plate loaded onto the surface.

The control system 1100 in operation next causes the automated clamp 1130 to close to clamp the front edge of the plate onto the drum. The control system 1100 in operation next causes a vacuum on the drum surface to be turned on and the drum 1020 to be rotated in the counterclockwise direction by one turn. During such rotation of the drum 1020, the plate 1040 slides from the loading area 1060 onto the outer surface drum and is held thereto by the vacuum grooves on the drum surface. In the example, assume the plate has a length approximately equal to the circumference of the outer surface of the drum. The control system 1100 in operation, after the rotation of the drum, causes the automated clamp 1130 to open so that the rear edge of the plate can fall, and does fall in the gap between the automated clamp 1130 and the outer drum surface. The control system 1100 in operation then causes the automated clamp 1130 to close so that the plate 1040 is mounted onto the drum. The control system 1100 in operation also then causes the front loading part 1120 to tilt back in a clockwise direction until it is co-planar with the rear loading part 1110, and also causes the door mechanism 1030 to be closed. FIG. 16 shows a simplified side view of the imager in this position of the plate loaded onto the surface. In this example, the plate is now ready for imaging. The imager then images the plate by imaging data as is typical in such an imager.

Figure 17:
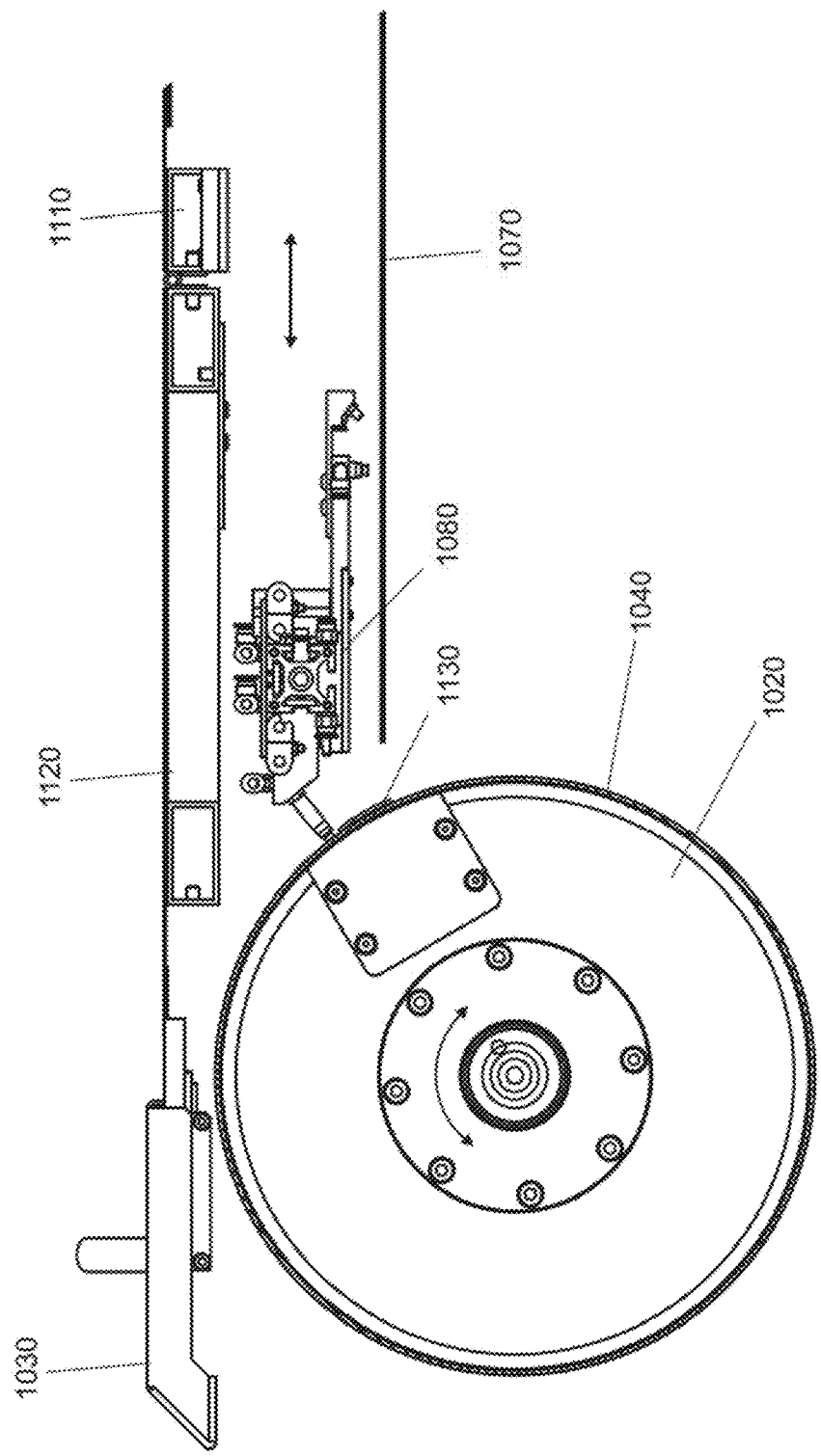
FIG. 17 shows a simplified side view of an embodiment of the imager in a position with the front suction cups in contact with a plate next to the rear edge of the plate.
Figure 18:
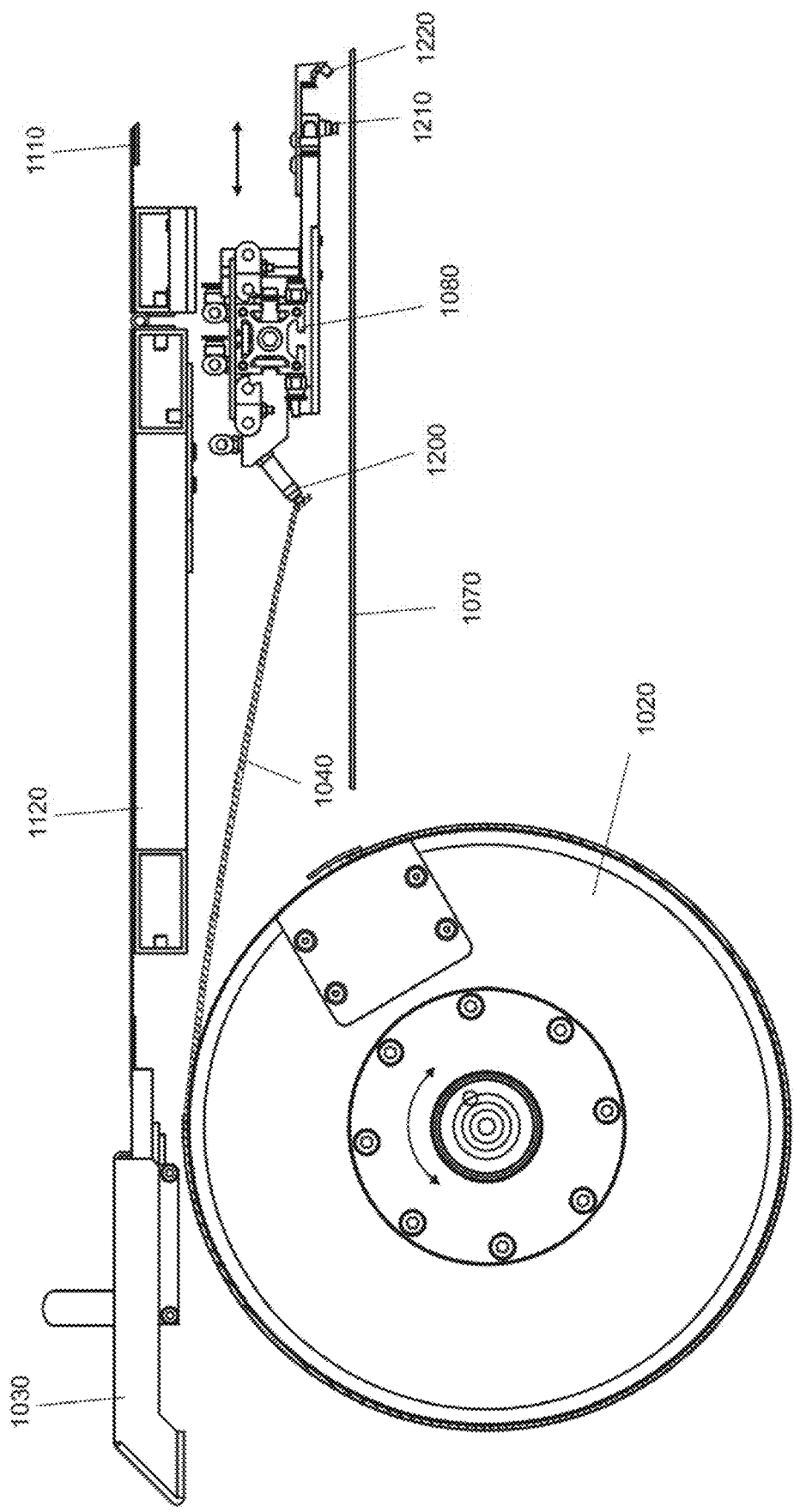
FIG. 18 shows a simplified side view of an embodiment of the imager with a plate removed and the clamp closed.

After the plate is imaged, continuing with the illustrative example, the method includes the automated unloading of the imaged plate under control of the control system 1100. Assume the position after imaging is also as shown in FIG. 16 with the plate 1040 positioned onto the drum. For unloading, the control system 1100 in operation causes the drum 1020 to be positioned in a pre-defined unloading position. The control system 1100 in operation causes the grabber mechanism 1080 to move horizontal to the drum 1020 to a plate unloading position in which the set of front suction cups 1200 are directly in contact with the plate next to the rear edge of plate 1040. FIG. 17 shows a simplified side view of the imager in this position with the front suction cups 1200 in contact with the plate next to the rear edge of the plate 1040. The control system 1100 in operation causes vacuum to be supplied to the set of front suction cups 1200 and also causes the automated clamp 1130 to open. The control system 1100 in operation causes the drum to be rotated clockwise while at the same time causing the grabber mechanism to move back horizontally with the rear edge of the plate 1040 held thereto by the front set of suction cups 1200 at a speed proportional to the rotational speed of the drum. When the drum has rotated sufficiently, the control system 1100 in operation causes the grabber mechanism to continue moving so that the rear edge of the plate 1040 is removed from the gap between the opened automated clamp 1130 and the outer surface of the drum. The control system 1100 in operation then causes the automated clamp 1130 to close. FIG. 18 shows a simplified side view with the plate 1040 removed and the clamp so closed.

Figure 19:
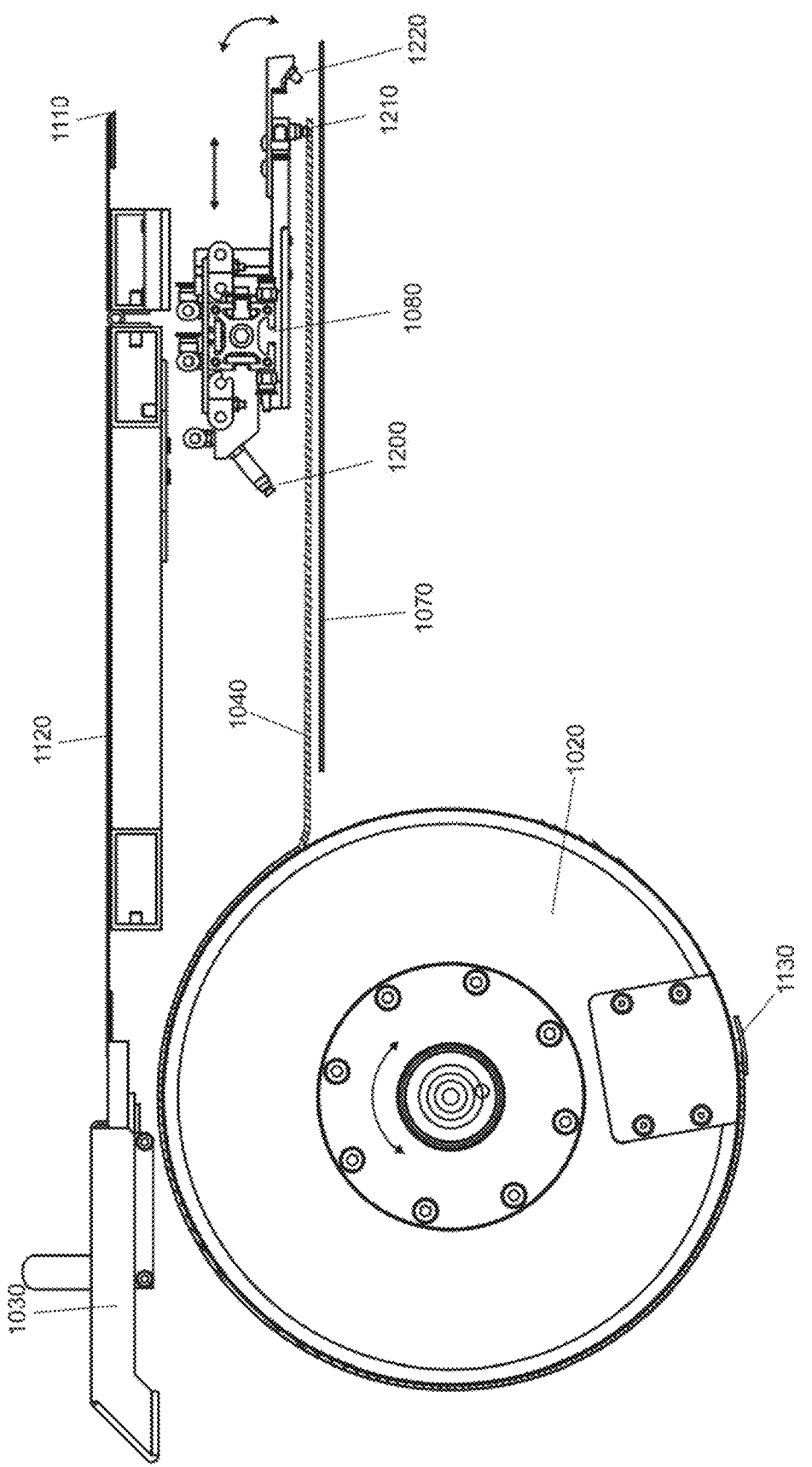
FIG. 19 shows a simplified side view of an embodiment of the system with a plate in such that the combination of the rear set of suctions cups and air injectors are tilted up so that the rear edge of the plate is picked up from the unloading area.

The control system 1100 in operation then causes the vacuum to be turned off from the front suction cups 1200. As a result, the rear edge of the plate 1040 falls down onto the unloading area 1070. The control system 1100 in operation causes the grabber mechanism to move horizontally in the direction towards the drum 1020 to a position in which the rear set of suction cups 1210 is positioned over the rear edge of the plate 1040. At this position, the control system 1100 in operation causes the vacuum supply to the rear suctions cups 1210 to be turned on, and the air supply to the air injectors 1220 is also turned on. The control system 1100 in operation also causes the combination of the suction cups 1210 and injectors 1220 to tilt down towards the surface of the plate 1040 until the vacuum cups are directly in contact with the surface of the plate next to the rear edge of plate 1040. The control system 1100 in operation then causes the combination of the rear set of suctions cups 1210 and air injectors 1220 to tilted up so that the rear edge of the plate 1040 is picked up from the unloading area 1070. FIG. 19 shows a simplified side view of the system with the plate in this position.

Figure 20A:
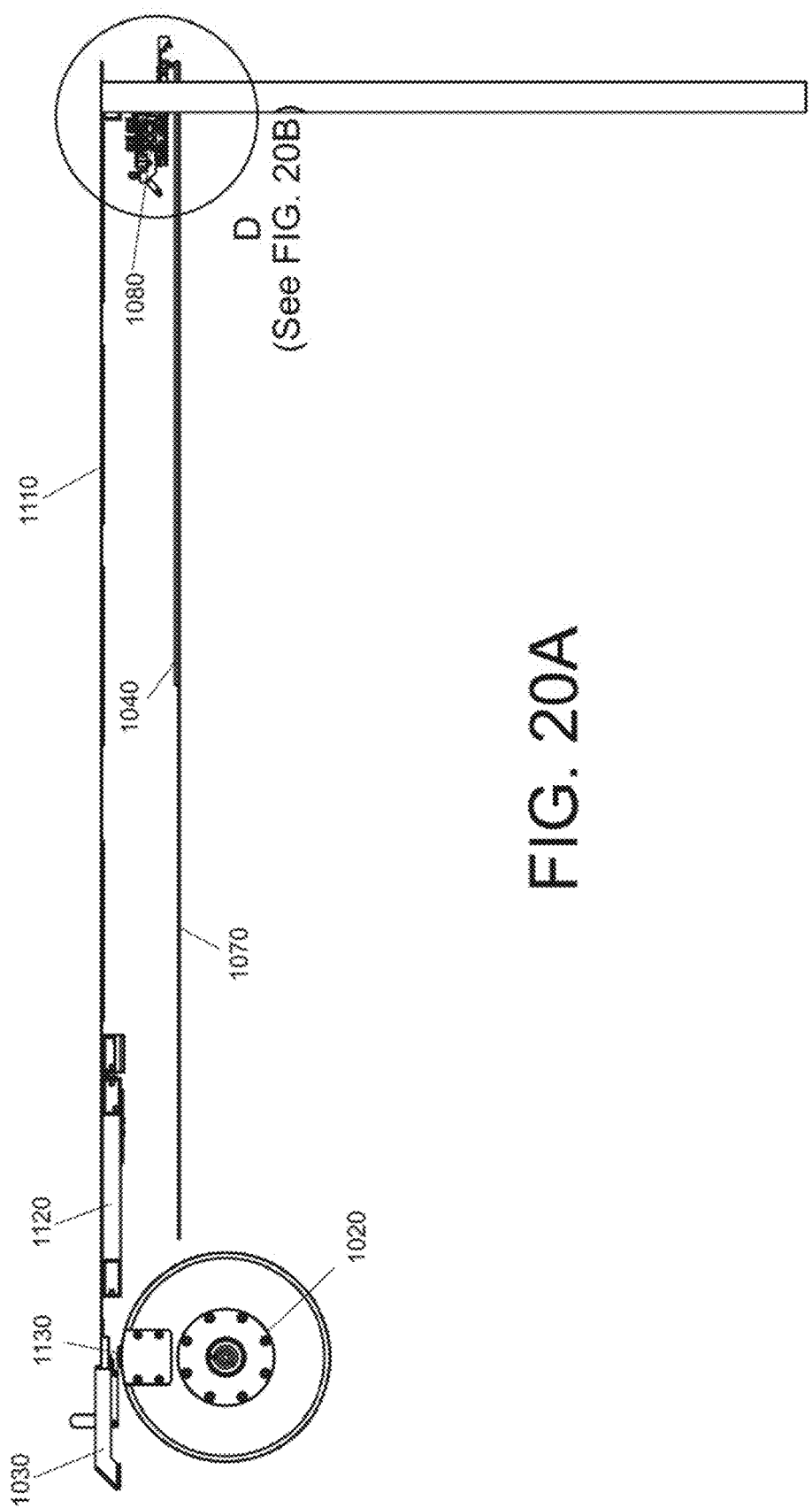
FIG. 20A shows an end view of an embodiment of the system with a plate in the unloaded position after automated unloading.
Figure 20B:
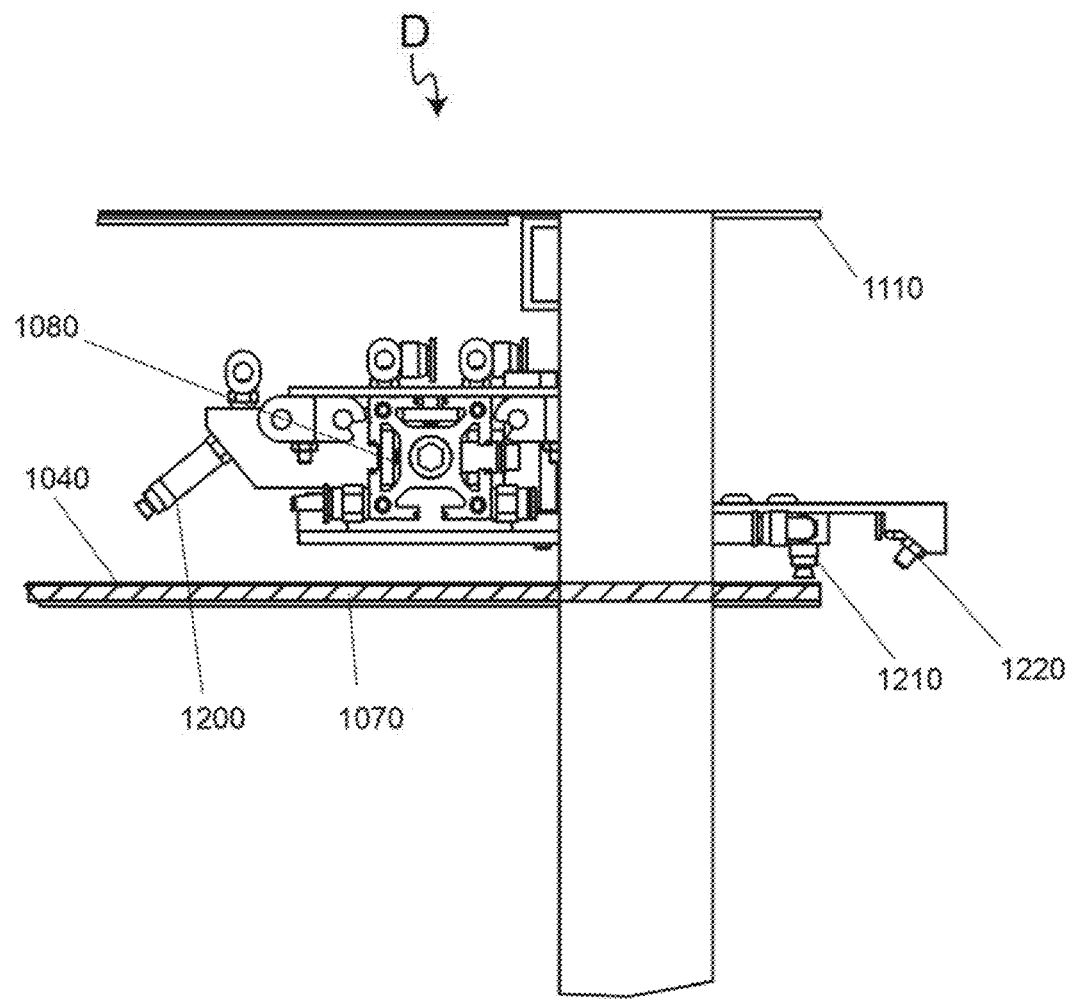
FIG. 20B shows a magnified view of the region marked D in FIG. 20A.

The control system 1100 in operation then causes the drum 1020 to be rotated in a clockwise direction and at the same time the grabber mechanism 1080 to move in the direction towards the rear direction until the automated clamp 1130 of the drum 1020 is in the upright position. The control system 1100 in operation cause the grabber mechanism 1080 to continue moving in the rear direction until it reaches and stops at the end of the frame 1090. Simultaneously, while the automated clamp 1130 of drum 1020 is in its upright position, the control system 1100 in operation causes the automated clamp 1130 to open. The control system 1100 in operation causes, once the grabber mechanism is at the end of the frame, the vacuum to the rear suction cups to turn off, and the air to the rear air injectors 1220 to be off. As a result, the rear edge of plate 1040 falls down onto the unloading table 1070. The plate 1040 is thus automatically unloaded to an unloaded position on the unloading table 1070. FIG. 20A shows an end view of the system with the plate 1040 in the unloaded position after such automated unloading. FIG. 20B shows a magnified view of the region marked D in FIG. 20A that includes the grabber mechanism and the rear end of the unloaded plate.

One embodiment of the system further includes one or more irradiator subsystems configured to irradiate the plate with ultraviolet radiation. Irradiating plates that have a sensitized coating such as a LAMS coating with ultraviolet radiation is known in the art. One embodiment of the system includes an irradiator subsystem configured to irradiate the plate from the back side, such a process called back exposure herein, and another embodiment of the system includes an irradiator subsystem configured to irradiate the plate from the top side, such an irradiation process called main exposure herein. One embodiment includes elements that carry out both main exposure and back exposure.

Figure 21A:
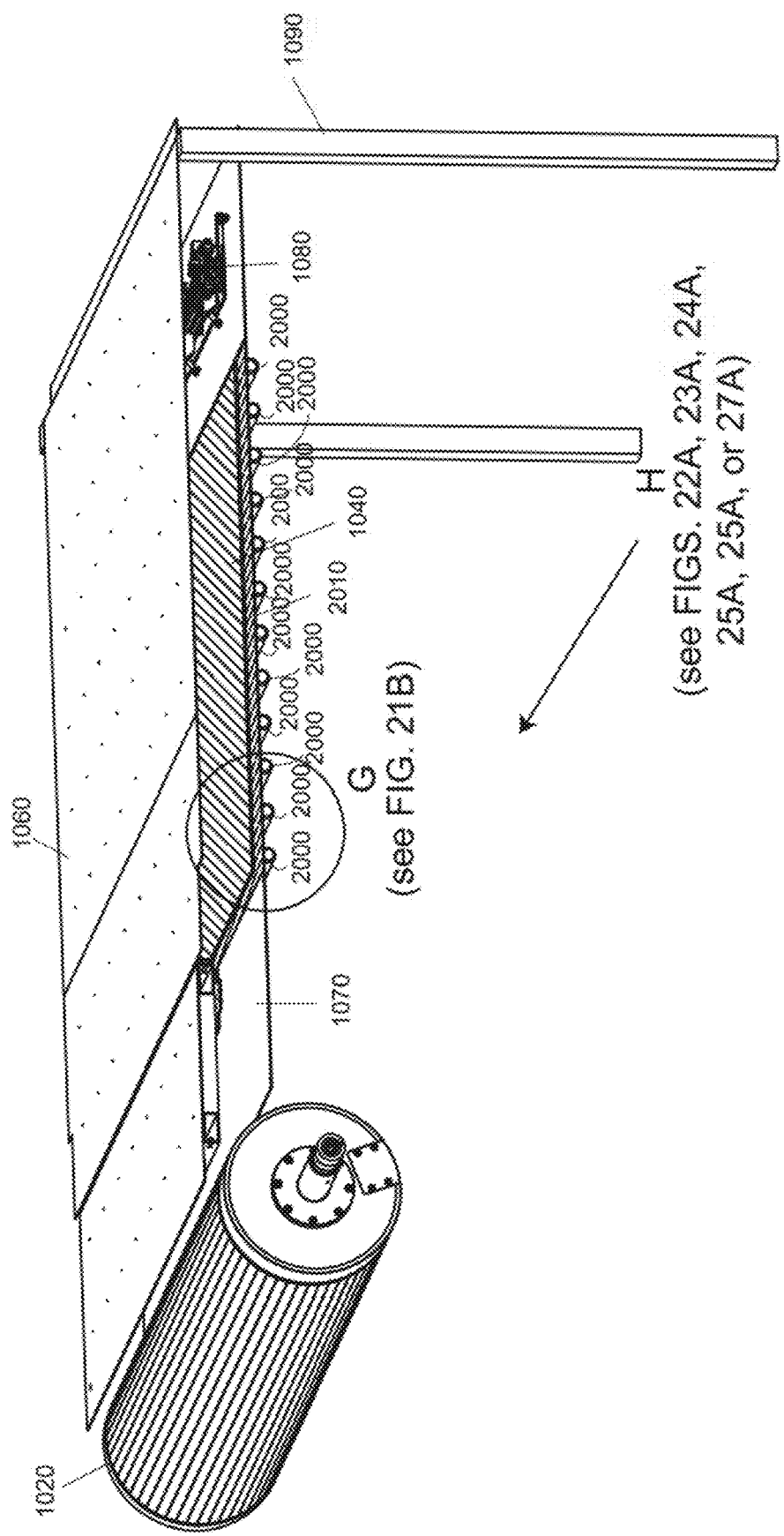
FIG. 21A shows a perspective view of an embodiment of the loader.
Figure 21B:
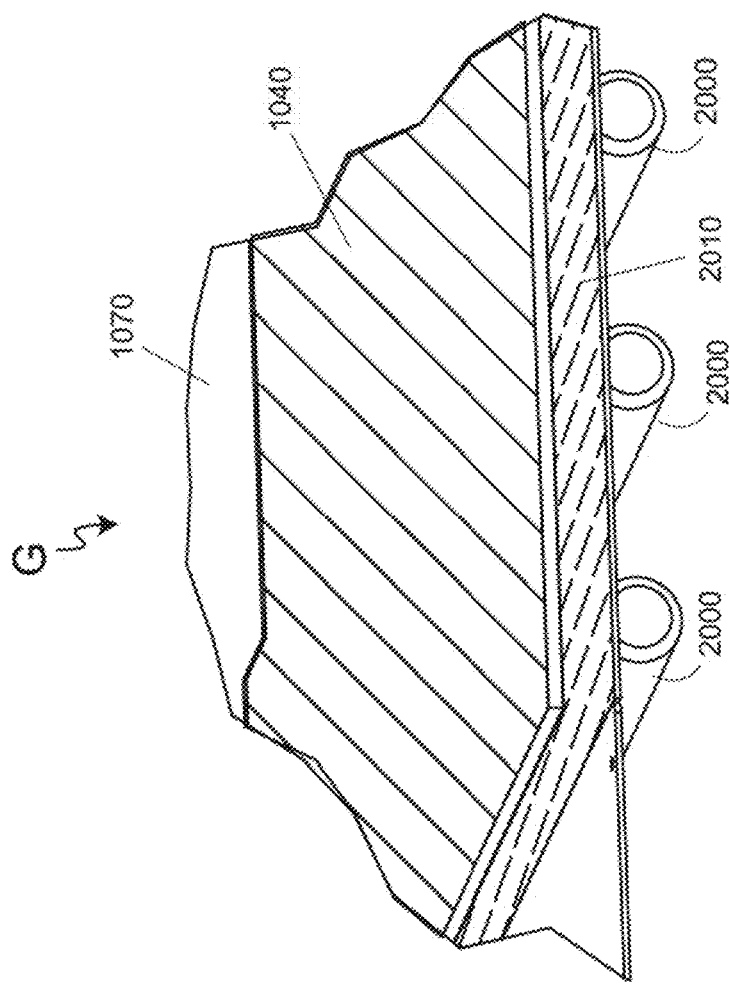
FIG. 21B shows the region denoted by G in FIG. 21A magnified.

FIG. 21A shows a perspective view of an embodiment of the novel loader including an ultraviolet source subsystem, in this version a set of UV sources 2000 configured to irradiate the flexographic plate with ultraviolet radiation. The ultraviolet source subsystem is controlled by the control system 1100. FIG. 21B shows the region denoted by G magnified.

Note that FIGS. 22A, 23A, 24A, 25A, 26A and 27A each show an end view in the direction denoted H in FIG. 21A of a different embodiment in which the respective ultraviolet source subsystem has different alternate configurations in order to illustrate the way the ultraviolet source subsystem is configured may be different in different versions.

Figure 22A:
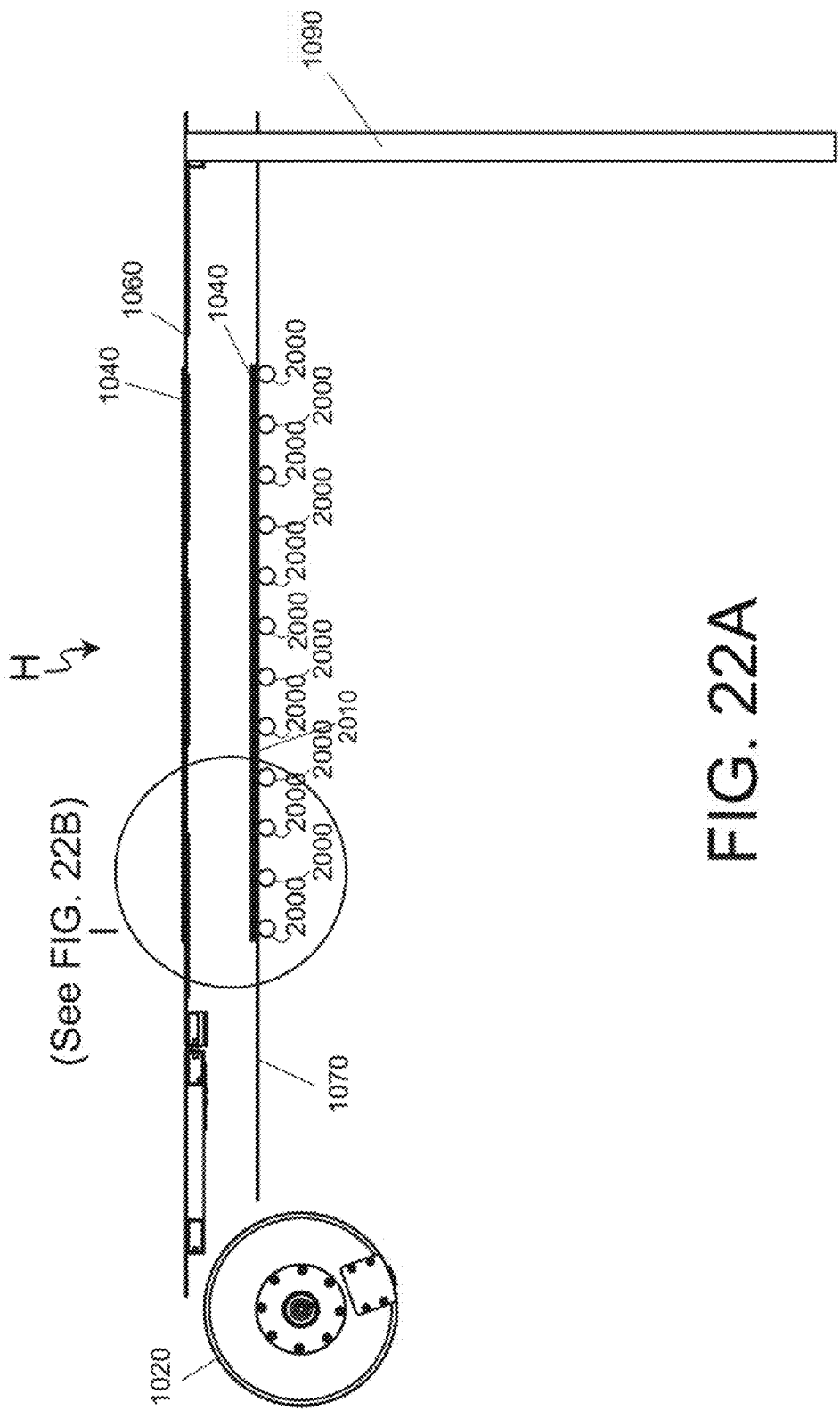
FIG. 22A shows a side view of an embodiment of the system in simplified form where the imager is only represented by the drum, and includes a first embodiment of an ultraviolet source subsystem.

FIG. 22A shows a side view of the system in simplified form where the imager is only represented by the drum, and includes a first embodiment of the ultraviolet source subsystem. FIG. 22B shows the area marked I magnified. This embodiment includes a plurality of UV sources 2000 arranged under the unloading area 1070. The unloading area 1070 includes ultraviolet translucent material 2010 between plate 1040 and the UV source 2000. As the plate 1040 is unloaded automatically under control of the control system 1100, the plate is positioned directly over the plurality of UV sources 2000. The control system 1100 is configured in operation to cause the plate to be exposed for a programmable amount of time for back exposure, and, after the back exposure is complete, to cause the grabber mechanism to pick the plate up automatically and to move the plate to the unloading position.

Figure 23A:
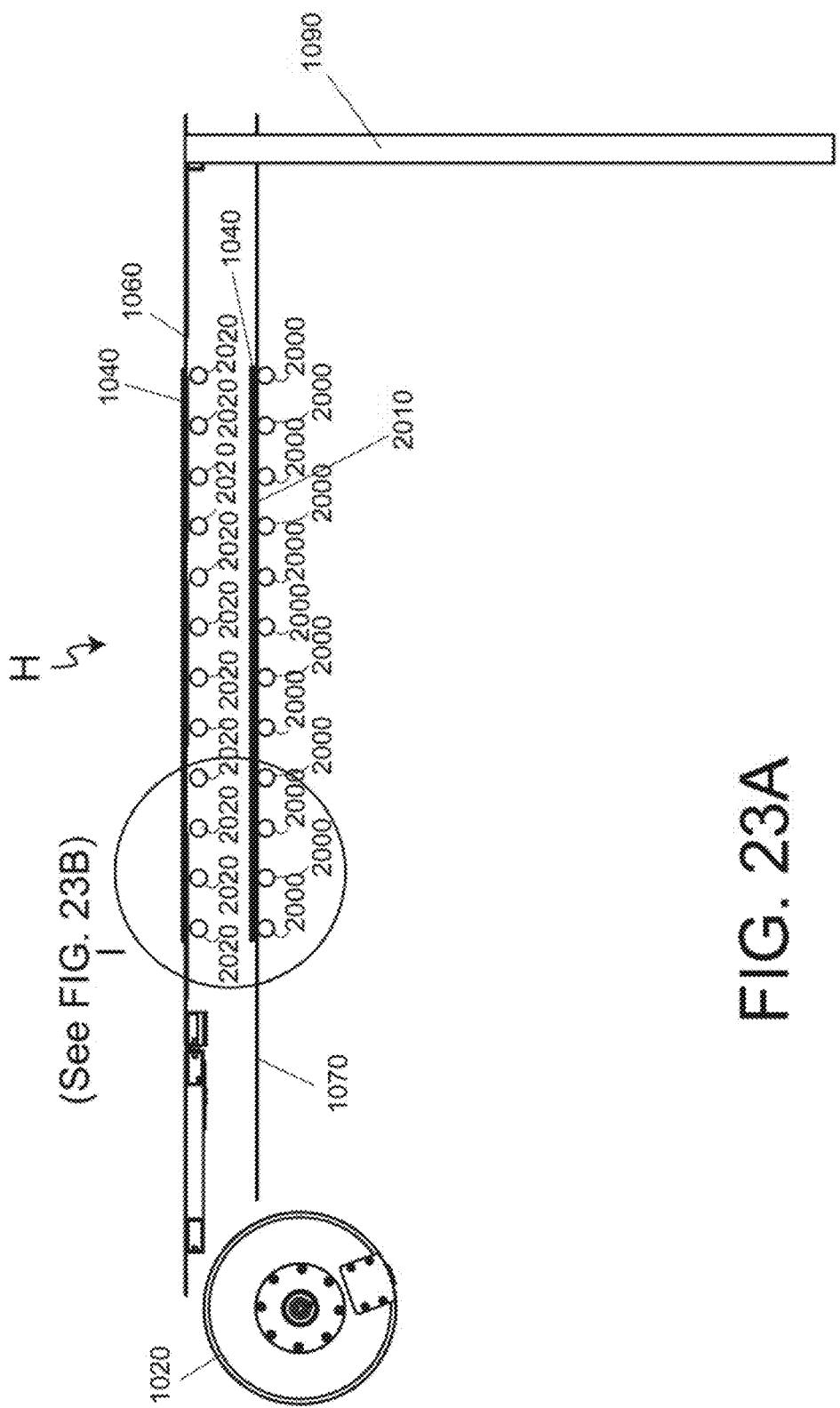
FIG. 23A shows a side view of an embodiment of the system in simplified form where the imager is only represented by the drum, and includes a second embodiment of an ultraviolet source subsystem.
Figure 23B:
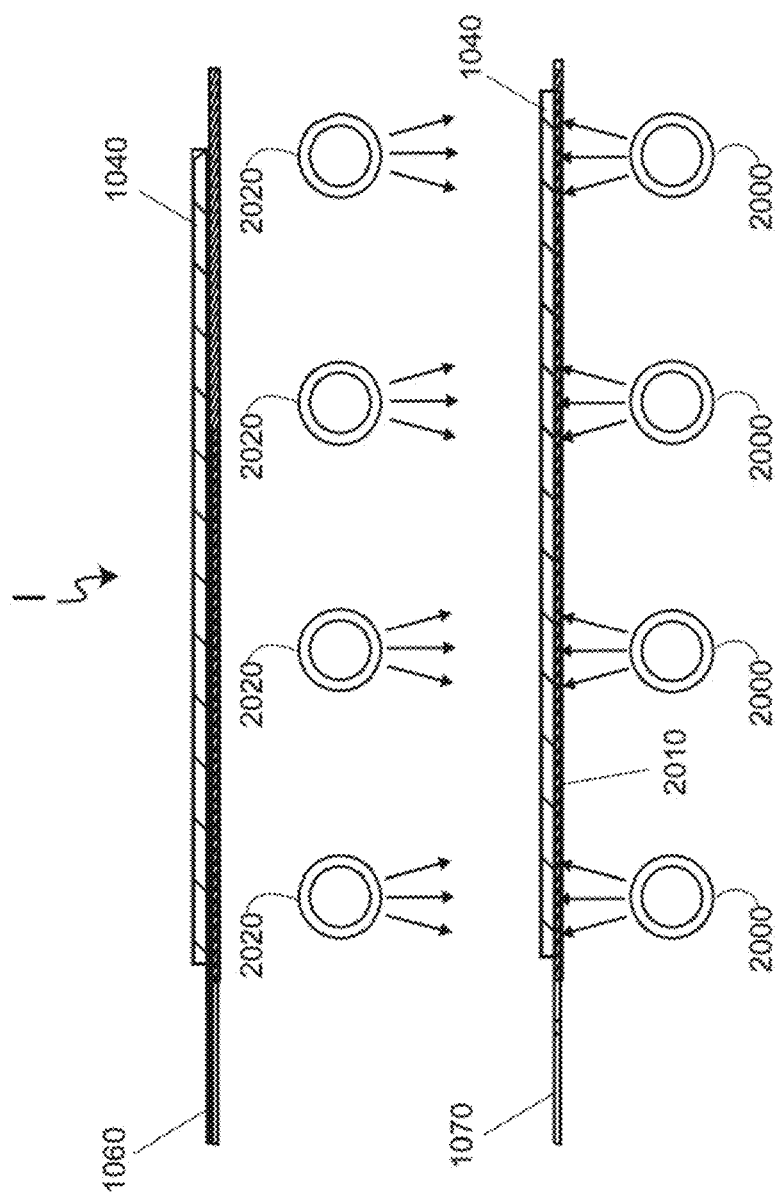
FIG. 23B shows the area marked I in FIG. 23A magnified.

FIG. 23A shows a side view of the system in simplified form where the imager is only represented by the drum, and includes a second embodiment of the ultraviolet source subsystem. FIG. 22B shows the area marked I magnified. In FIGS. 23A and 23B, the ultraviolet source subsystem includes a first plurality of UV sources 2000 positioned to be under the unloading area 1070 and a second plurality of UV sources 2020 over the plate 1040 lying on the unloading area 1070. This second plurality of UV sources 2020 is used for main exposure of the plate 1040 after unloading. In one embodiment, the control system 1100 is configured in operation to cause the plate 1040 on the unloading area 1070 to be irradiated from the top and also from the bottom after its automatic unloading from the drum for respective programmable amounts of time on the top and bottom.

Figure 24A:
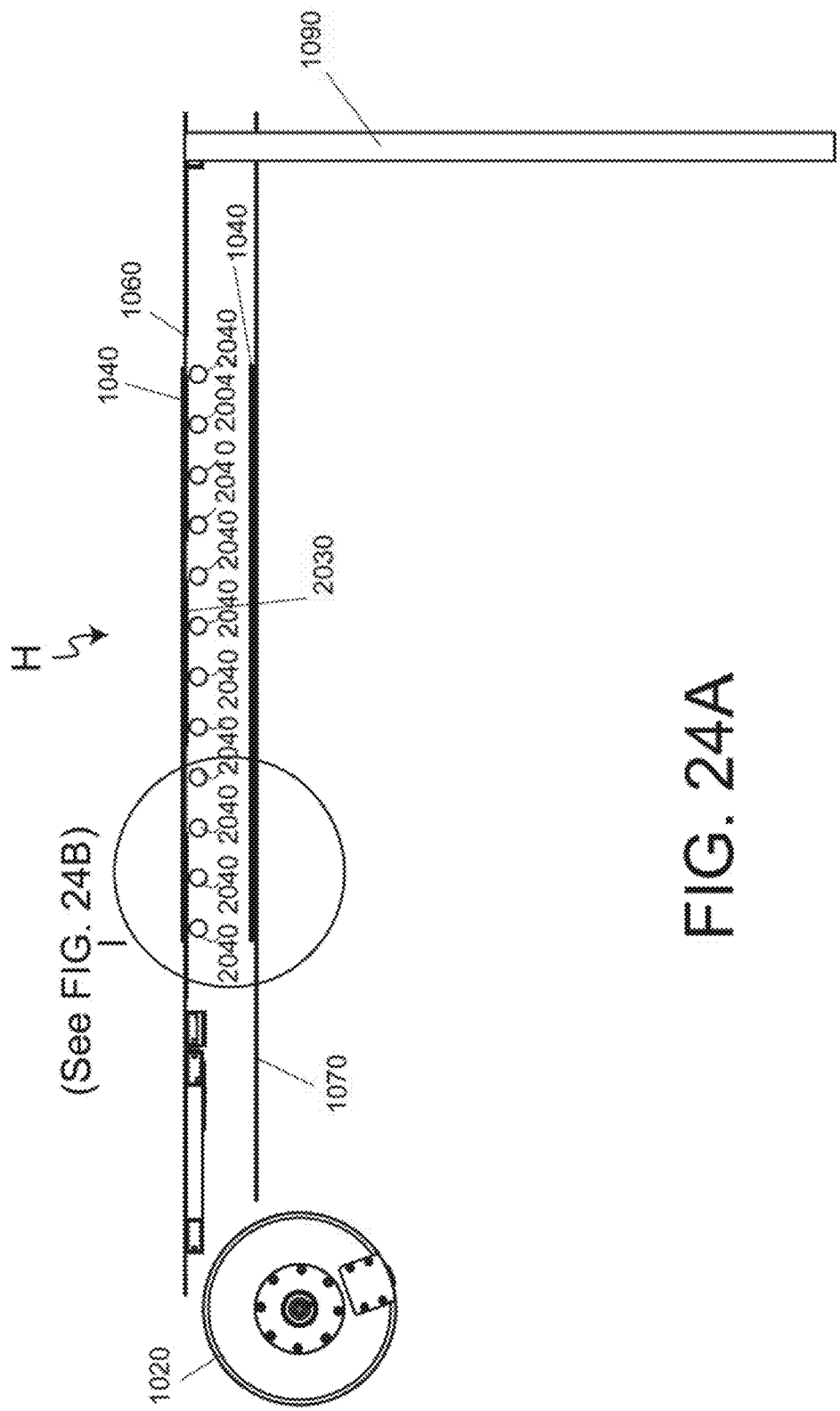
FIG. 24A shows a side view of an embodiment of the system in simplified form where the imager is only represented by the drum, and includes a third embodiment of an ultraviolet source subsystem.
Figure 24B:
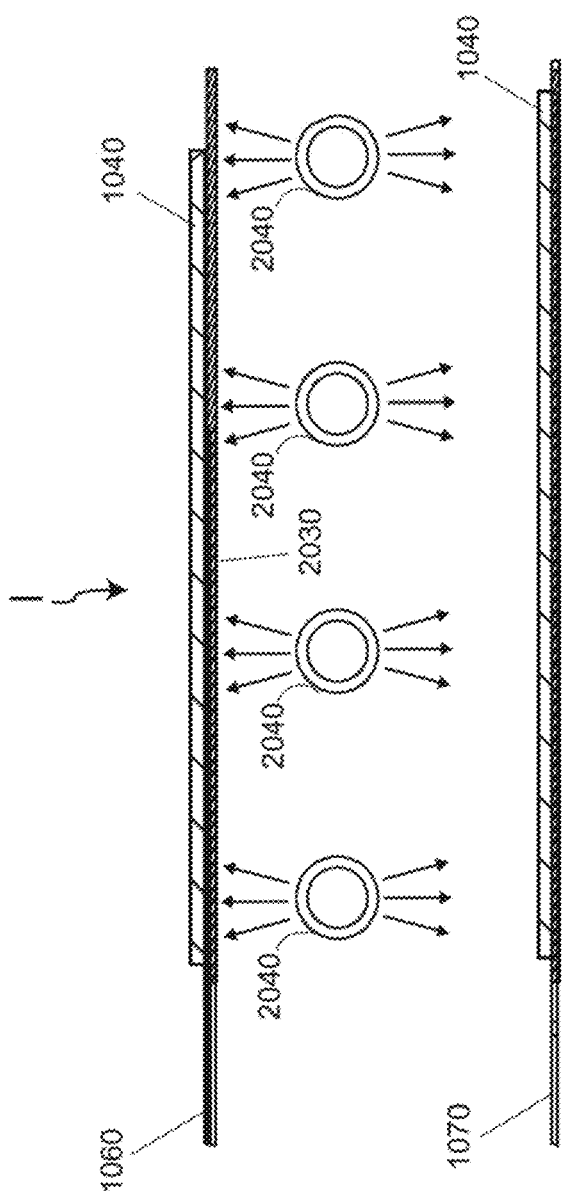
FIG. 24B shows the area marked I in FIG. 24A magnified.

FIG. 24A shows a side view of the system in simplified form where the imager is only represented by the drum, and includes a third embodiment of the ultraviolet source subsystem. FIG. 24B shows the area marked I magnified. FIGS. 24A and 24B show ultraviolet source subsystem with a plurality of UV sources 2040 between plate 1040 on unloading area 1070 and loading area 1060. The loading area 1060 under plate 1040 includes ultraviolet translucent material 2030. The control system is configured in operation to cause a first plate 1040 on the loading area 1060 to be irradiated from the back side prior to the plate being loaded, while at the same time to irradiate a different, already imaged plate on the unloading system from that imaged plates top side. In an alternate version, the same plate 1040 is loaded automatically onto the loading area 1060 and irradiated from its back side by the set of sources 2040, then loaded automatically onto the drum 1020, then removed to the unloading area where it is irradiated from the top for a programmable amount of time, all under control of the control system 1100.

Figure 25A:
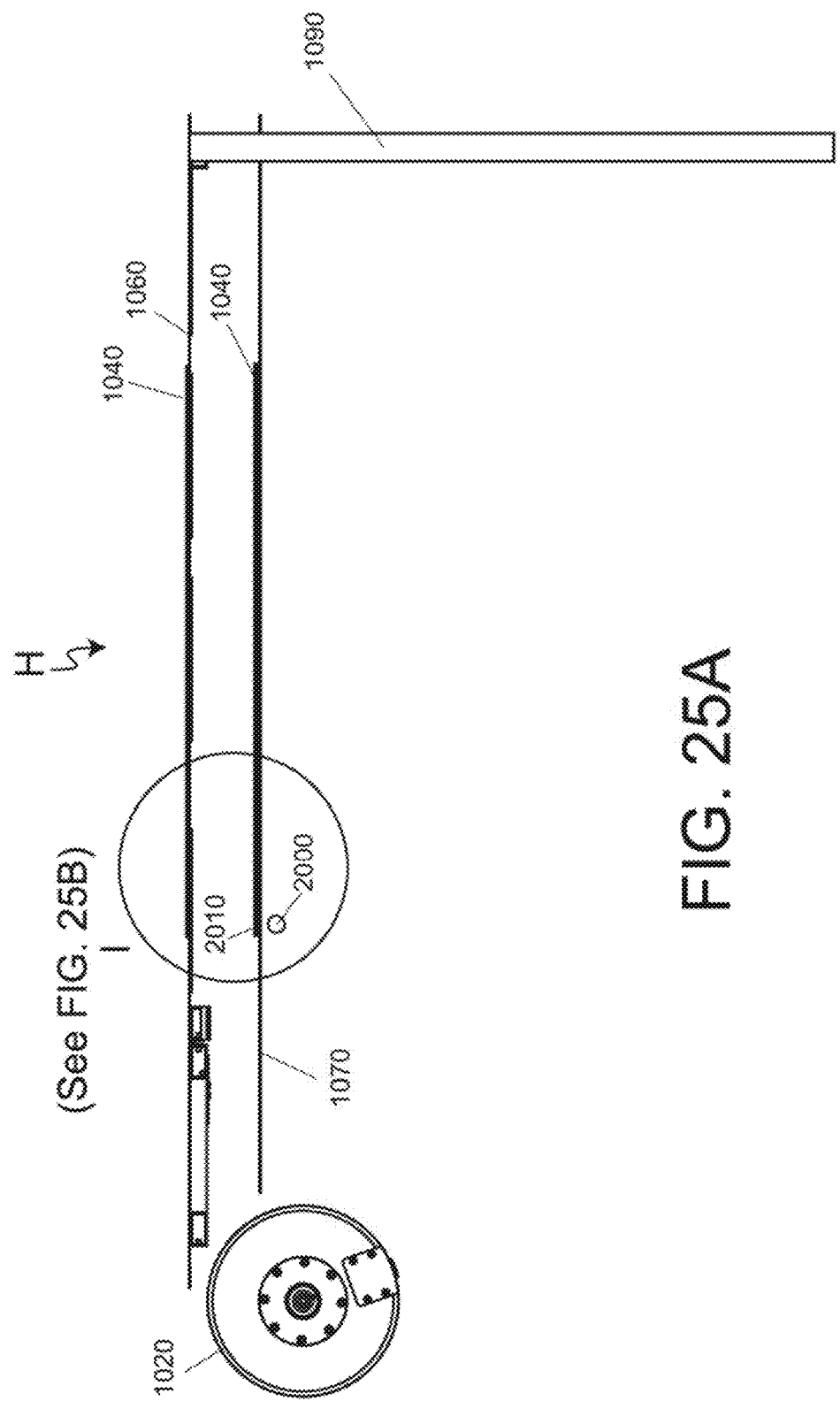
FIG. 25A shows a side view of an embodiment of the system in simplified form where the imager is only represented by the drum, and includes a fourth embodiment of an ultraviolet source subsystem.

FIG. 25A shows a side view of the system in simplified form where the imager is only represented by the drum, and includes a fourth embodiment of the ultraviolet source subsystem. FIG. 25B shows the area marked I magnified. FIGS. 25A and 25B show a system with an ultraviolet source subsystem that includes one UV source 2000 under the unloading area 1070. The unloading area 1070 includes translucent material 2010 over the UV source 2000. The control system in operation causes the UV source to be on while the plate 1040 is moved over the source at a speed programmed so that each part of the plate is exposed from the back side for a required amount of time to provide adequate back exposure.

Figure 26A:
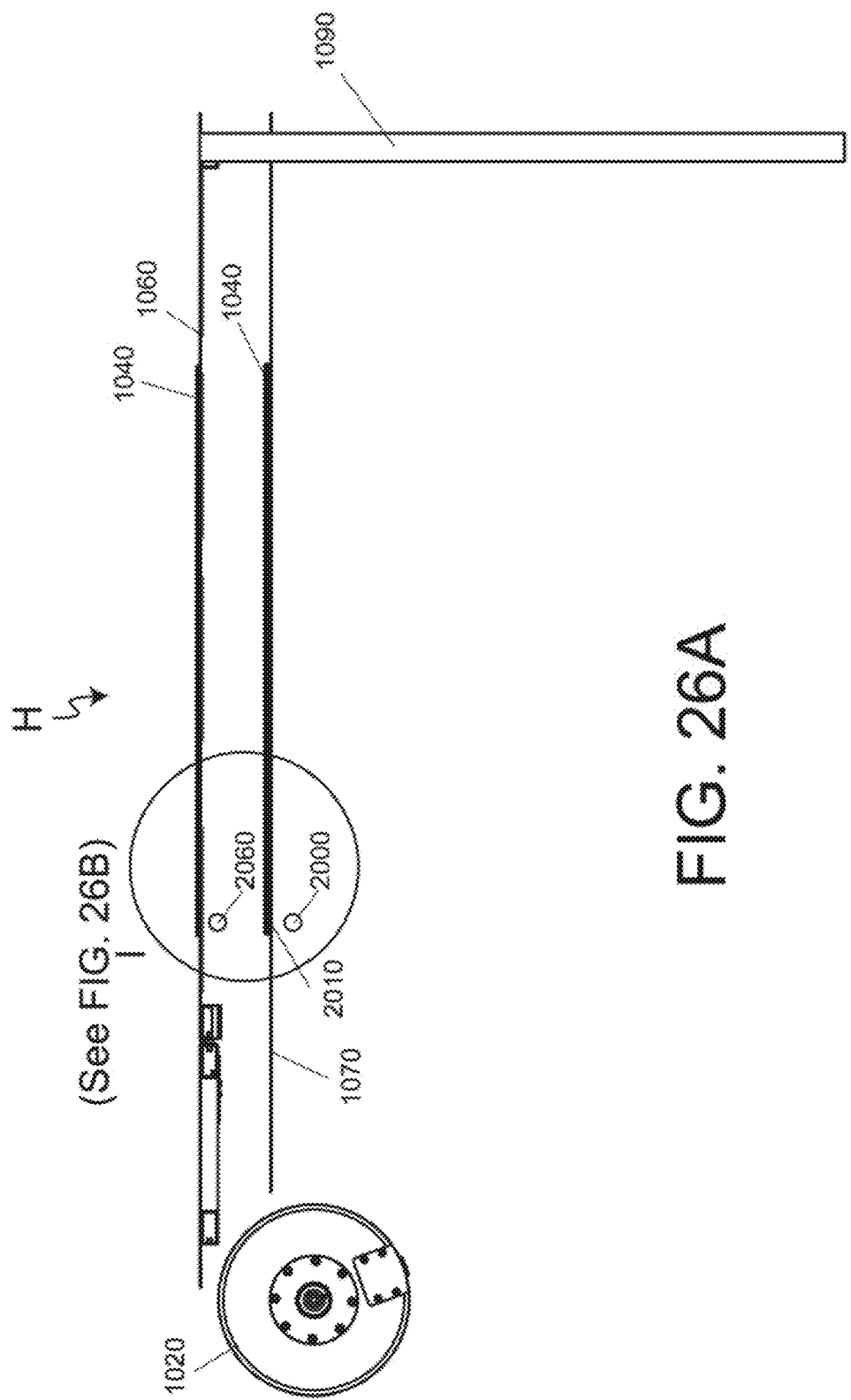
FIG. 26A shows a side view of an embodiment of the system in simplified form where the imager is only represented by the drum, and includes a fifth embodiment of an ultraviolet source subsystem.
Figure 26B:
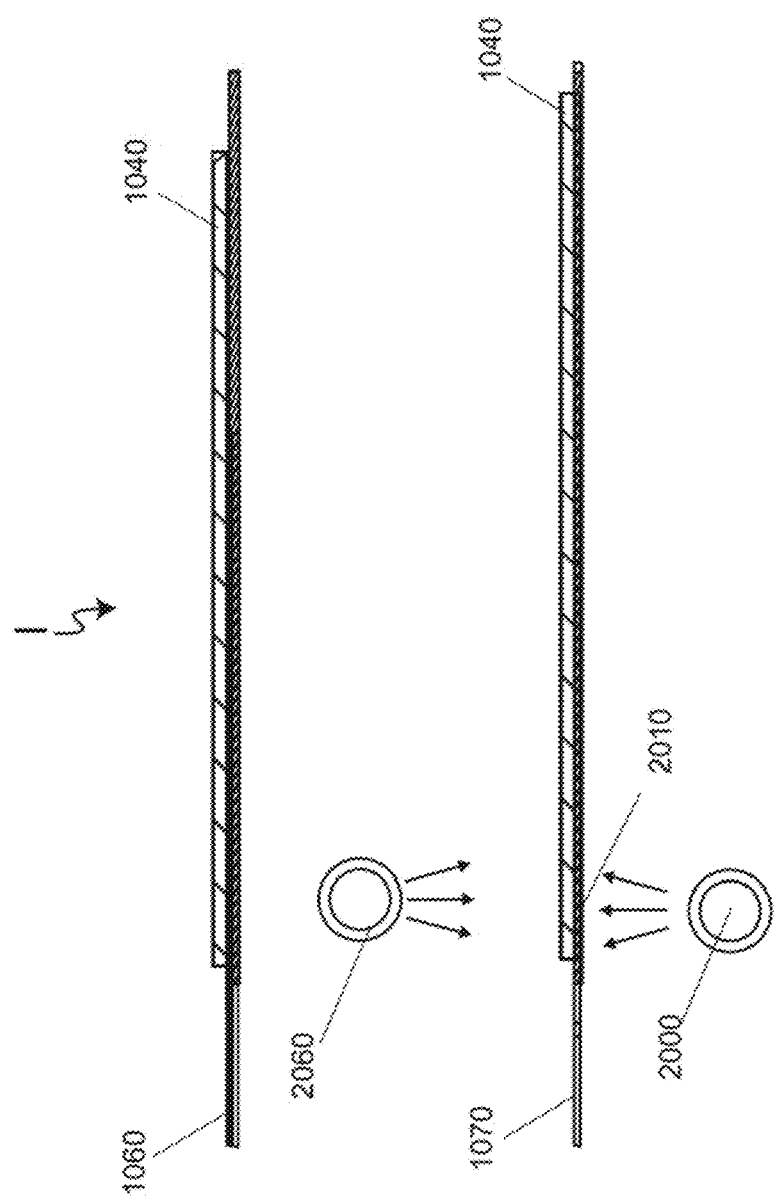
FIG. 26B shows the area marked I of FIG. 26A magnified.

FIG. 26A shows a side view of the system in simplified form where the imager is only represented by the drum, and includes a fifth embodiment of the ultraviolet source subsystem. FIG. 26B shows the area marked I magnified. FIGS. 26A and 26B shows an ultraviolet source subsystem that includes one UV source 2060 under loading area 1060 configured to be able to irradiate a plate from the plate's top while the plate is passing under it. The ultraviolet source subsystem also includes a second UV source 2000 under the unloading area 1070, such an unloading area 1070 including translucent material 2010 over the UV source 2000. The control system in operation causes the UV sources 2060 and 2000 to be on while the plate 1040 is moved under the source 2060 and over the source 2000 at a speed programmed so that each part of the plate is exposed from the back side for a required amount of time to provide adequate back exposure and from the top to provide adequate main exposure.

Figure 27A:
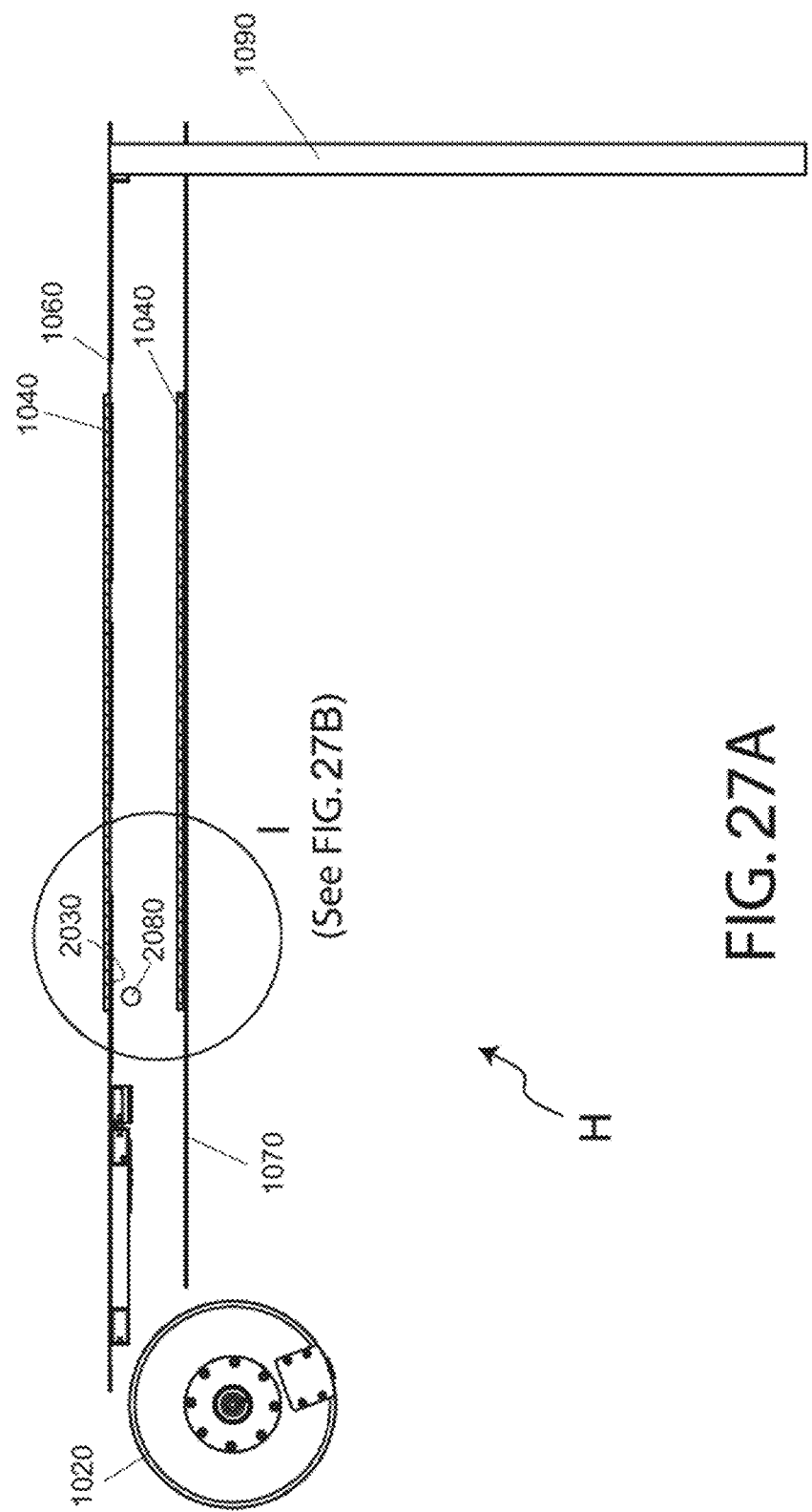
FIG. 27A shows a side view of an embodiment of the system in simplified form where the imager is only represented by the drum, and includes a sixth embodiment of an ultraviolet source subsystem.

FIG. 27A shows a side view of the system in simplified form where the imager is only represented by the drum, and includes a sixth embodiment of the ultraviolet source subsystem. FIG. 27B shows the area marked I magnified. FIGS. 27A and 27B show an ultraviolet source subsystem that includes one UV source 2080 under loading area 1060 where the loading area 1060 includes translucent material 2030 over the UV source 2080. The control system is configured in operation to cause a first plate 1040 moving on the loading area 1060 while loading to be irradiated from the back side prior to the plate being loaded. The control system is configured in operation also to cause an imaged plate to be irradiated from its top during automated unloading. The speeds of motion are programmed so that adequate back exposure is provided to a plate prior to imaging, and so that adequate main exposure is provided from the same source 2080 to the plate after imaging.

While one set of embodiments is for what is called herein semi-automatic operation according to which a plate is brought to the loading area 1060 manually, another set of embodiments is for what is called herein fully-automatic operation according to which the placing of a plate onto the loading area 1060 is automated. In one fully automatic embodiment, a mechanism under control of the control system 1100 picks up a plate from a stack of plates, places the picked up plate at a loading position on the loading area 1060, and in the case that a protective sheet is included on the plate, removes the protective sheet.

Figure 28:
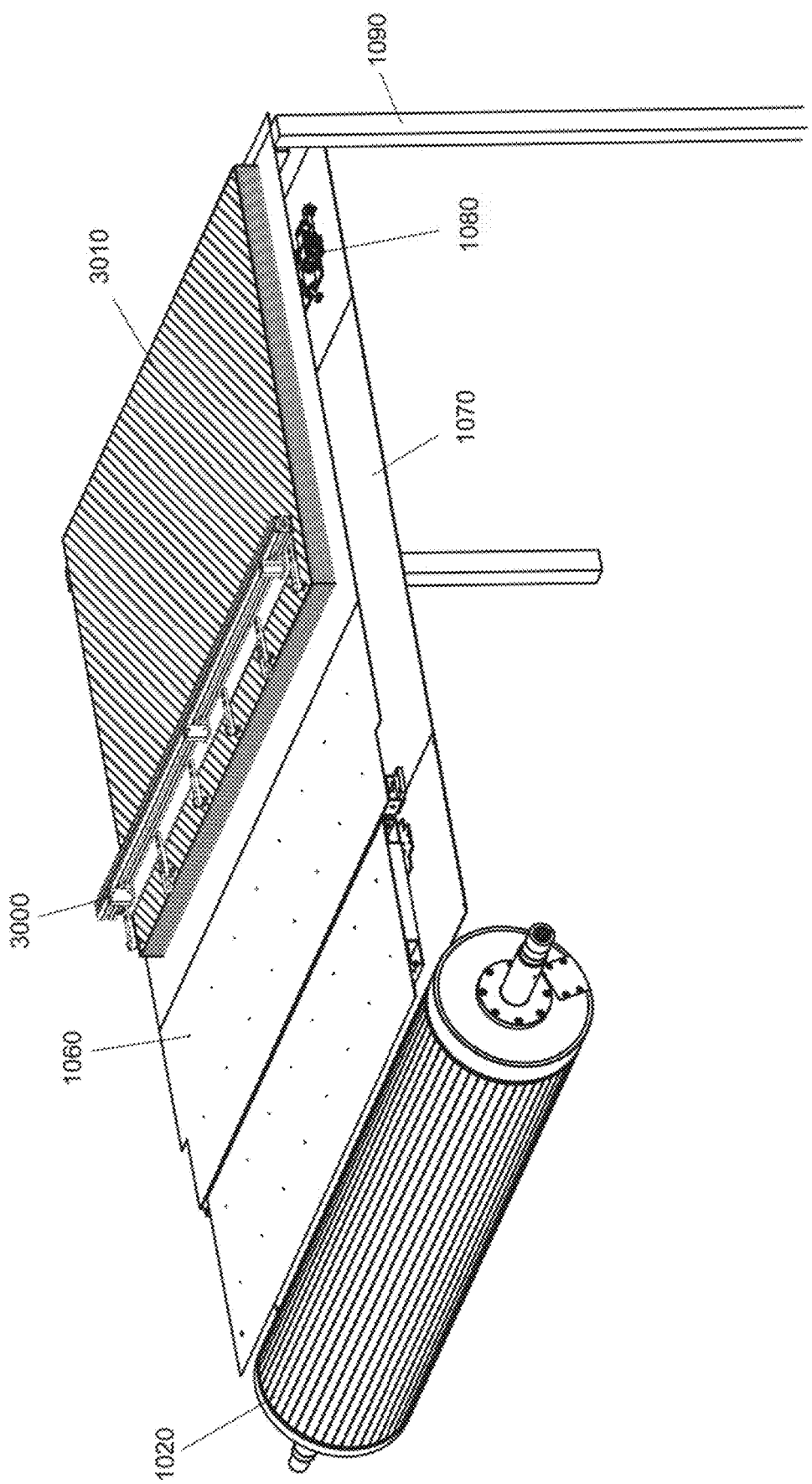
FIG. 28 shows a simplified diagram of an embodiment of a system that includes an element operative to carry out automatic loading.

FIG. 28 shows a system that includes automatic loading. The system includes a plate handler 3000 controlled by the control system 1100 configured to grab a plate 1040 from a stack of plates 3010 and to move the plate to the loading position on the loading area 1060. The plate handler 3000 also is configured to remove, under control of the control system 1100, the protective sheet from the top of the plate 1040 in the case the plate has such a protective sheet.

Figure 29:
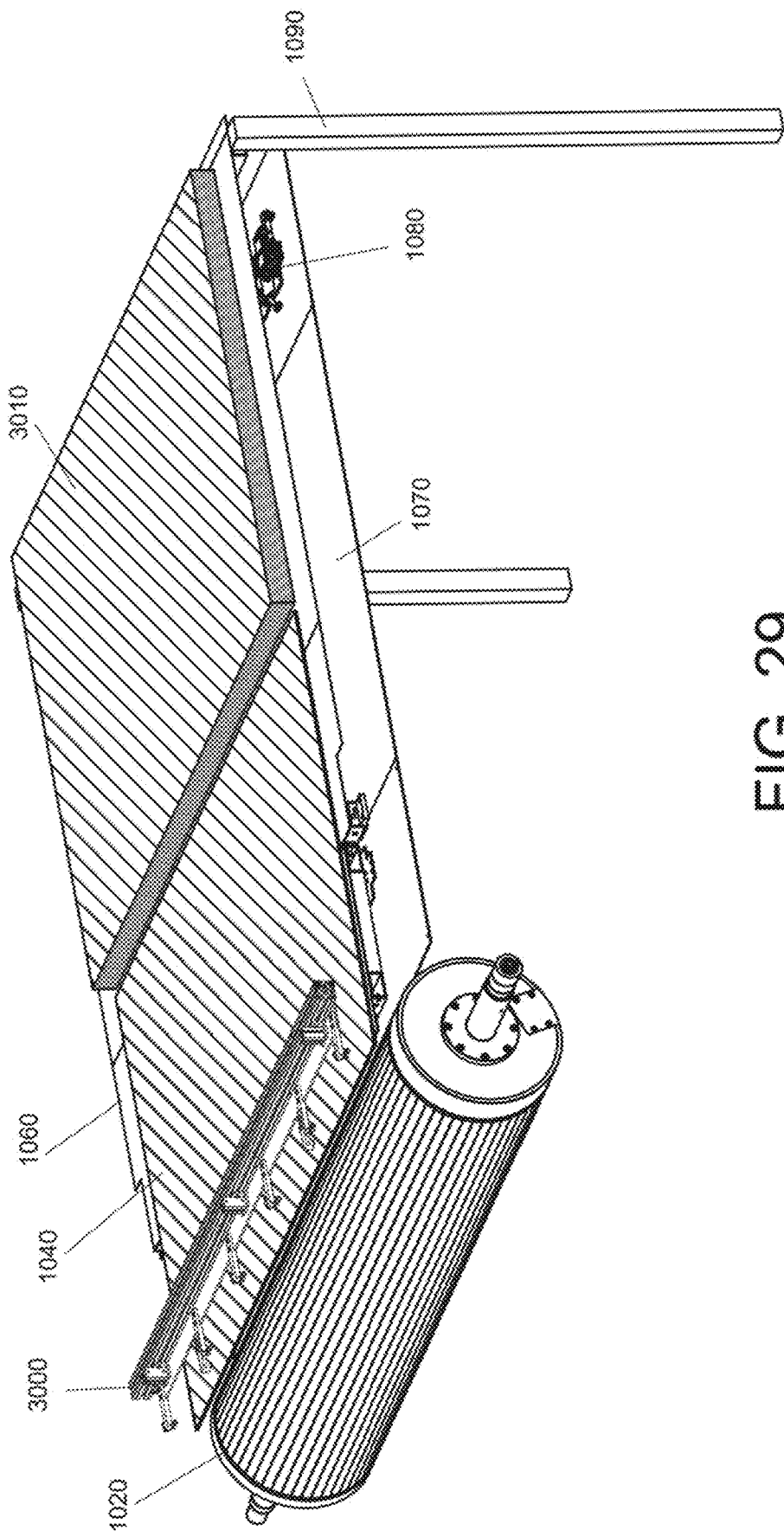
FIG. 29 shows a simplified diagram with the position of the plate handler of the embodiment of FIG. 28 after a plate has been moved onto the loading position on a loading area.

FIG. 29 shows the position of the plate handler 3000 after the plate has been moved onto the loading position on the loading area 1060.

How to carry out the automatic loading of the plate and further how to remove the protective sheet from the top of the plate is described in a slightly different configuration from that shown in FIGS. 28 and 29 in U.S. Pat. No. 7,000,543 to Klein, et al. titled METHOD AND APPARATUS FOR LOADING AND UNLOADING FLEXOGRAPHIC PLATES FOR COMPUTER-TO-PLATE IMAGING. The contents of such U.S. Pat. No. 7,000,543 are incorporated herein by reference.

The device in U.S. Pat. No. 7,000,543 includes, rather than a stack of plates, a plate magazine containing a plurality of flexographic plates. One embodiment can contain at least 10 plates, e.g., about 20 plates. The magazine of one embodiment of U.S. Pat. No. 7,000,543 includes a plurality of compartments, one compartment for each plate. Each flexographic plate is pre-loaded in its own compartment, e.g., without the separation sheet that may have been used between plates in a stack of flexographic plates. In one embodiment of U.S. Pat. No. 7,000,543 applicable also to an embodiment of the present invention, the protective sheet remains over the LAMS coating. In one version, the protective sheet is removed directly prior to the plate being mounted on the drum. In another embodiment, the protective sheet is partially removed prior to the loading, but is mostly still on top of each flexographic plate. The removal of the rest of the protective sheet occurs automatically at the same time as the mounting.

In one embodiment of U.S. Pat. No. 7,000,543 applicable also to an embodiment of the present invention, the magazine includes a frame and a set of compartments arranged vertically, each compartment designed for holding a single flexographic plate. The compartments are movable up and down. A lifting mechanism is configured to lift and lower the compartments under control of the control system 1100. Initially, each of the compartments is at its respective rest vertical position and a common rest horizontal position. In one embodiment of U.S. Pat. No. 7,000,543 applicable also to an embodiment of the present invention, the lifting mechanism moves one compartment at a time vertically between its rest vertical position and a loading vertical position at which the compartment is at a height at which the compartment is horizontally movable back and forth from the rest horizontal position to a loading horizontal position flush with a loading area 1060. The lifting mechanism 1040 further can move each compartment at the rest horizontal position up and down from and to the loading vertical position to and from a respective imaged vertical position.

In one embodiment of U.S. Pat. No. 7,000,543 applicable also to an embodiment of the present invention, there is a movable horizontal bottom panel 3320 that when moved beneath the horizontal area 1060 provides an opening for access from below the loading area 1060.

In one embodiment of U.S. Pat. No. 7,000,543 applicable also to an embodiment of the present invention, includes the automatic loading of a plate onto the loading area 1060 from the magazine and then, as described above onto the drum, and another aspect is the automatic removal of a protective sheet from the top of the plate during the loading onto the loading area 1060 and drum. These aspects are controlled under control of the control system 1100.

For embodiments such as shown in FIGS. 28 and 29 that do not include the magazine with a single plate in each compartment, but rather are for picking up a plate from a stack of plates 3010, the grabber mechanism described herein and in U.S. Pat. No. 7,000,543 can be readily adapted to remove a plate from a stack of plates rather than from a compartment. The description below, however, assumes a compartment from the magazine. How to modify the description below to operate for removal from a stack as shown in FIGS. 28 and 29 would be clear to those in the art.

For example, in the embodiments shown in FIGS. 28 and 29, the plate handler 3000 not only is movable horizontally towards and away from the imager, but also can move vertically to accommodate the height of the stack of plates. In one embodiment, the horizontal movement is by one or more motors under control of the control system 1100, and the vertical movement of the plate handler 3000 is hydraulic using at least one piston, under control of the control system 1100.

The system in a "fully automatic" embodiment includes a first grabber mechanism 3350 that includes a section 3330 to maintain the plate horizontal, and that includes a grabber set of vacuum suction cups arranged as a row. In the compartment version that is described in U.S. Pat. No. 7,000,543, when the compartment is at its loading horizontal position flush with a loading area 1060, the control system 1100 is configured in operation to cause the first mechanism with the grabber set of suction cups to grab the plate with the protective sheet on top and to move the plate and sheet away from the compartment (or stack in the stack of plates version) towards the drum on the loading area 1060, such that the edge of the plate and protective sheet is above the opening formed by moving away a bottom panel 3320.

When the plate is at the intermediate position over the opening 3070, the control system in operation causes the first mechanism 3350 to let go of and move away from the protective sheet and plate. In particular, the first mechanism rotates such that the edge of the plate may be bent away from the surface 1060. The part 3330 of the grabber mechanism 3350 maintains the adjacent part of the plate and protective sheet horizontal.

One embodiment includes a bending device that in one embodiment includes a wheel that rolls against the edge of the plate and moves back and forth across the plate edge. This bends a part, e.g., approximately 10 mm of the end of the plate and protective sheet to an angle that is adjustable to between 30 and 90 degrees, depending on the plate type. The bending device moves back and forth across the plate edge between one and three times depending on the plate type. The purpose of the bending by the bending device is to loosen the protective sheet from the plate at the edge region. Otherwise, the protective sheet tends to stick heavily to the LAMS coating. The bending device might also be a knife-type device instead of a wheel.

At this stage, the control system 1100 is configured in operation to cause the first mechanism 3350 that includes the grabber set of suction cups arranged as a row to move onto the protective sheet along the width in the strip area separated from the plate. Also at this stage, the control system causes a second mechanism that includes another set of vacuum holders (suction cups) arranged as a row to move to be under the edge of the plate through the opening around the loading area 1060. The order of the moving is not important, i.e., whether the top protective sheet or the bottom of the plate is held first. Vacuum is applied to the first and second set of vacuum holders. The second set maintains the plate at the horizontal surface, while the first mechanism lifts, e.g., by tilting tilts the protective sheet away from the plate.

In one embodiment, the grabber set of suction cups of the first mechanism is arranged relative to the other set of suction cups such that the top (grabber set) suction cups are interleaved with the bottom (the other set) suction cups. However, the inventors discovered that the mechanisms still cooperate to produce the desired result, albeit not as well, even when the top and bottom sets of suction cups are not so interleaved, e.g., are positioned at the same location when respectively adhering to the protective sheet and to the bottom of the plate. Thus, the invention is not restricted to the interleaving of the grabber set and other set of suction cups.

The control system 1100 in operation causes the vacuum to the bottom set of suction cups to be removed, and the second mechanism of the other set (the bottom set) of suction cups to move away. The movable panel 3320 now moves back to close the opening to form a substantially horizontal surface.

The grabber mechanism 3350 with the vacuum holders holding the protective sheet now slides the plate and protective sheet towards the drum under control of the control system 1100.

Once the plate edge is located at the loading area 1060, and, as described above, clamped to the drum, two actions occur. The first mechanism moves horizontally back to its horizontal rest position close to being over the movable part 3320. The first set of suction cups maintains hold onto the protective sheet such that the sheet is partially peeled away.

The protective sheet is now transported to a trash compartment.

In one embodiment, an anti-static device in the form of a wire across the width of the plate is included to remove static electricity from the combination of the plate and protective cover during the removal of the protective cover from the drum and automatic loading onto the drum. This ensures easier removal of the protective cover compared to when no anti-static device is used.

The unloading process proceeds in the reverse, except, of course, that there is now no protective sheet on top of the plate.

Figure 30A:
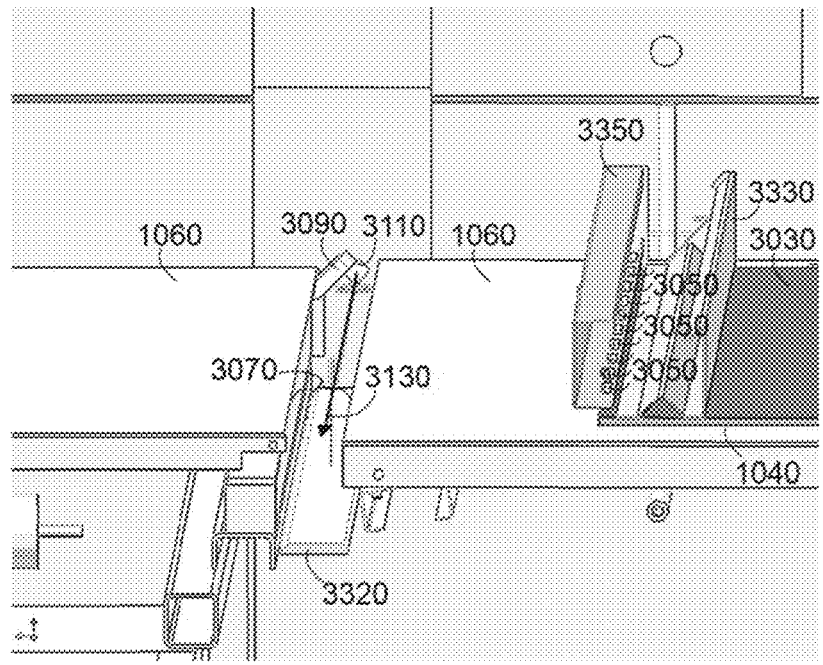
FIGS. 30A-30Y respectively correspond to FIGS. 5A-5Y of U.S. Pat. No. 7,000,543 and show a sequence of automatic loading onto a loading area, and the automatic removal of the protective sheet.
Figure 30B:
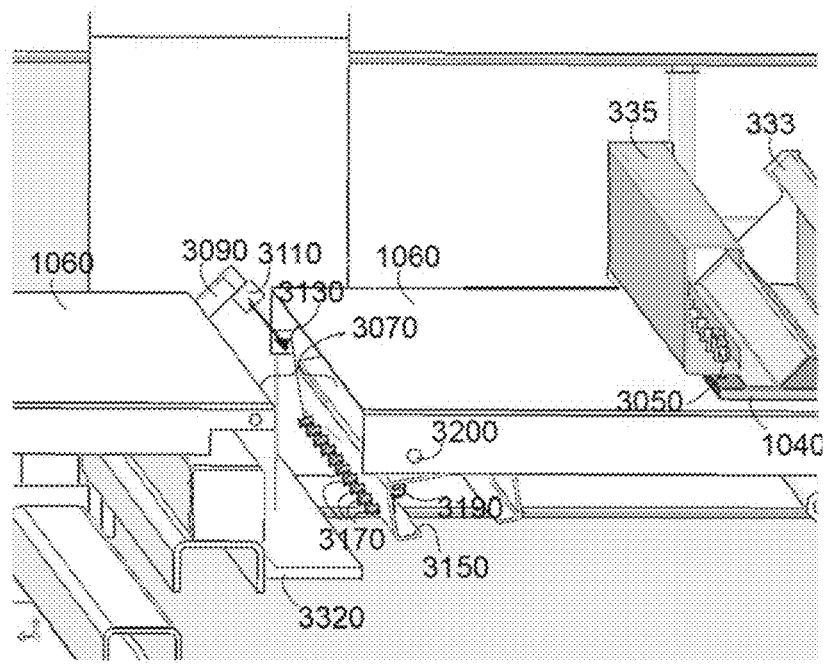
Figure 30C:
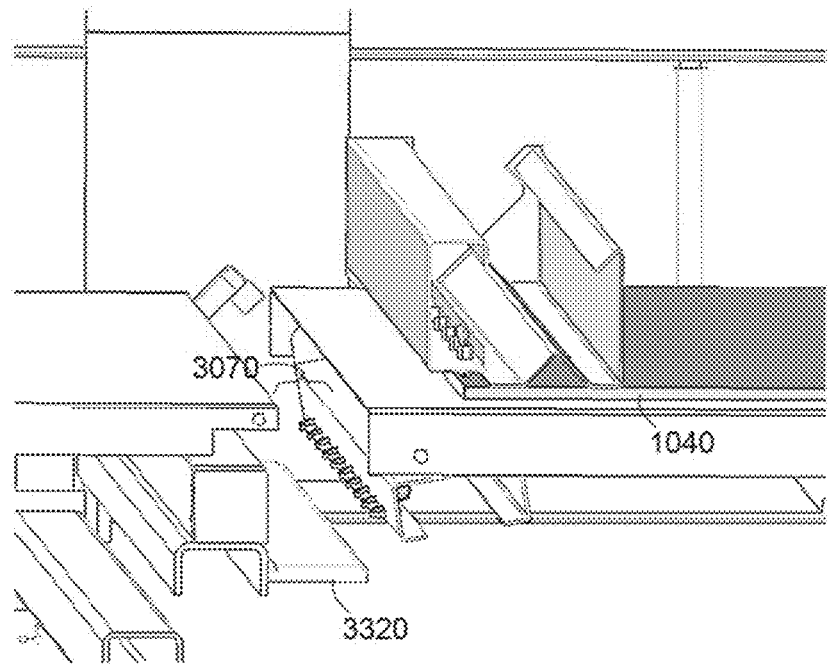
Figure 30D:
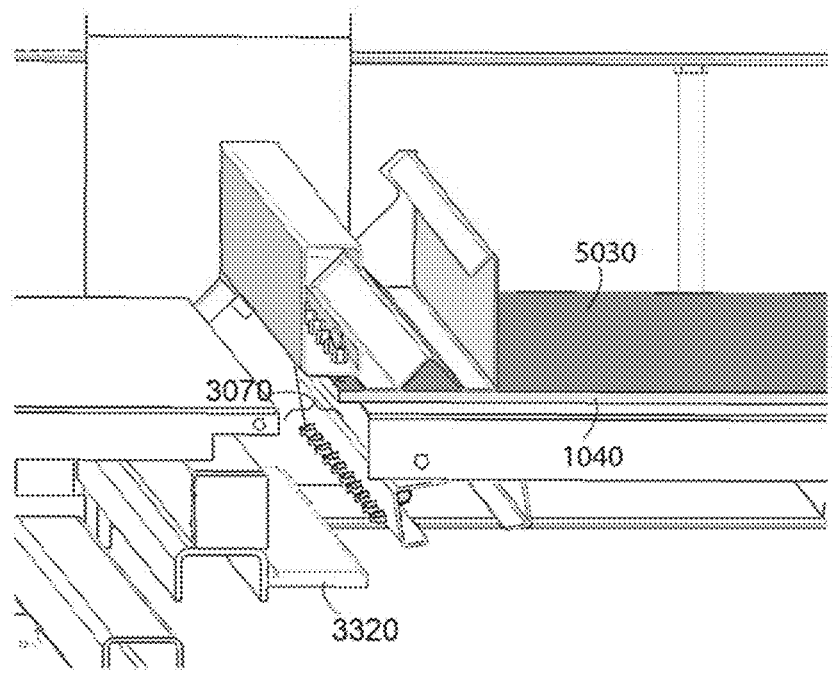
Figure 30E:
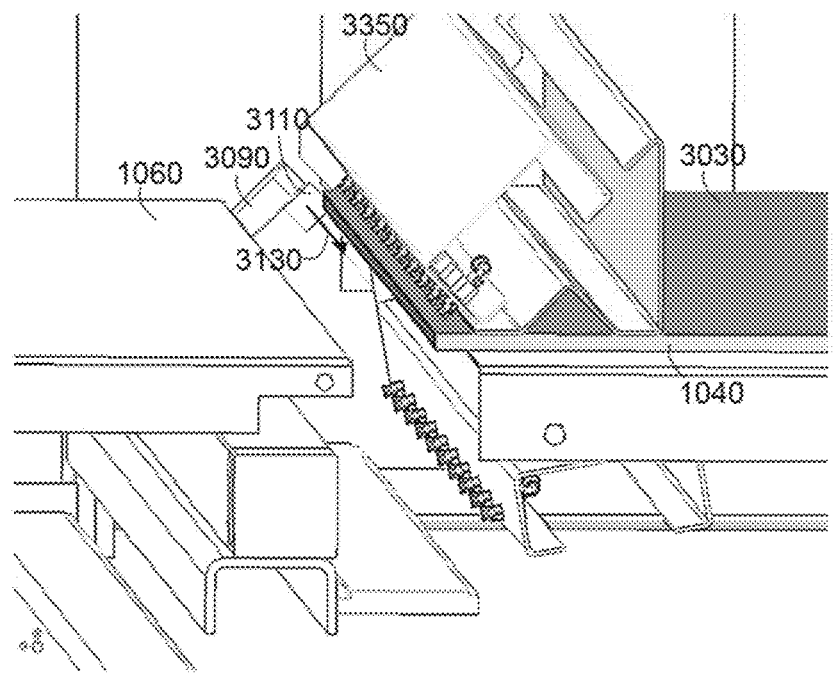
Figure 30F:
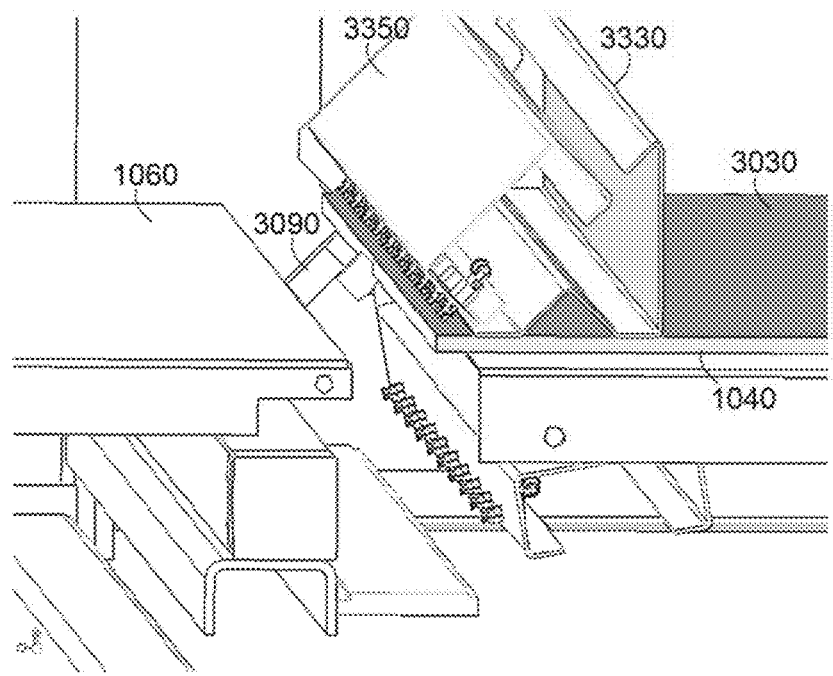
Figure 30G:
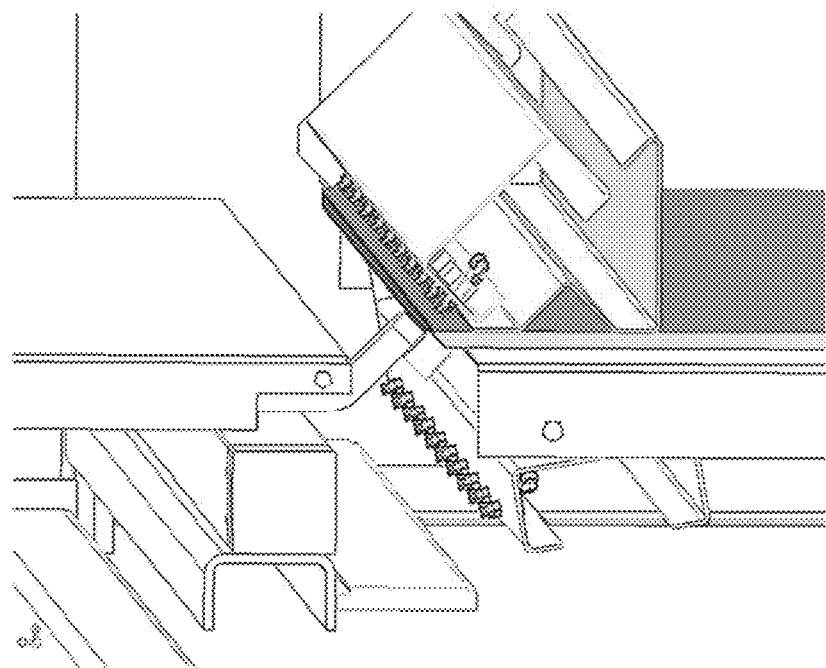
Figure 30H:
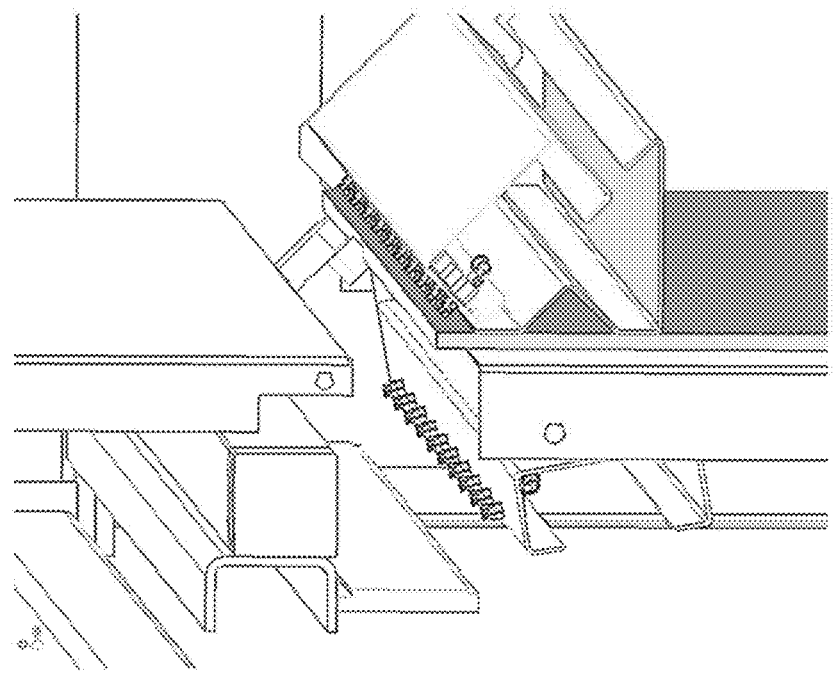
Figure 30I:
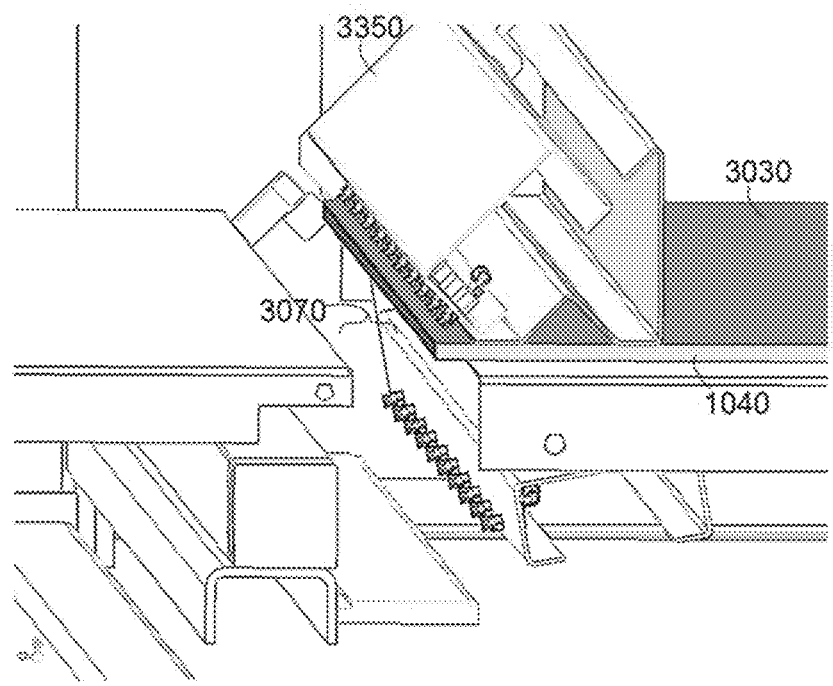
Figure 30J:
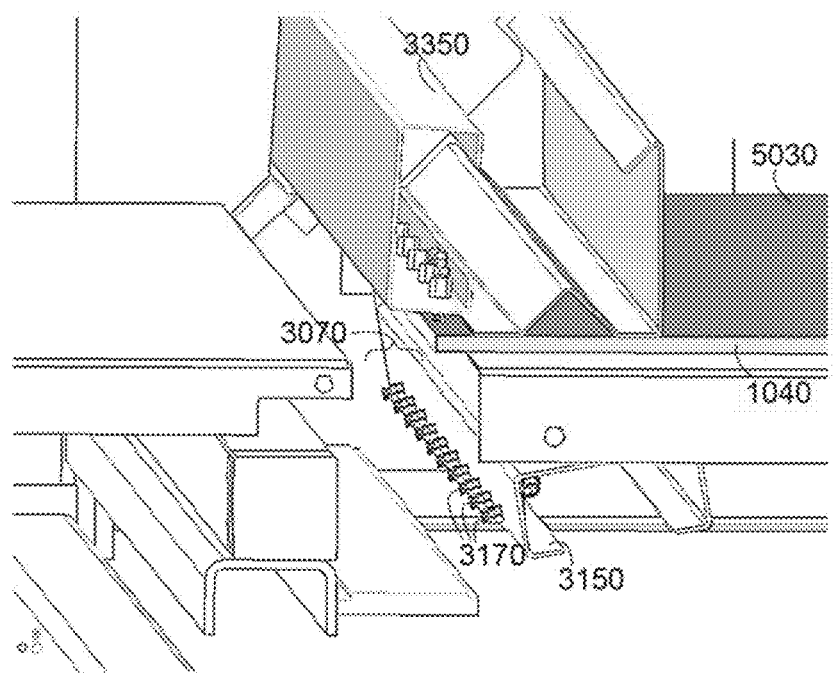
Figure 30K:
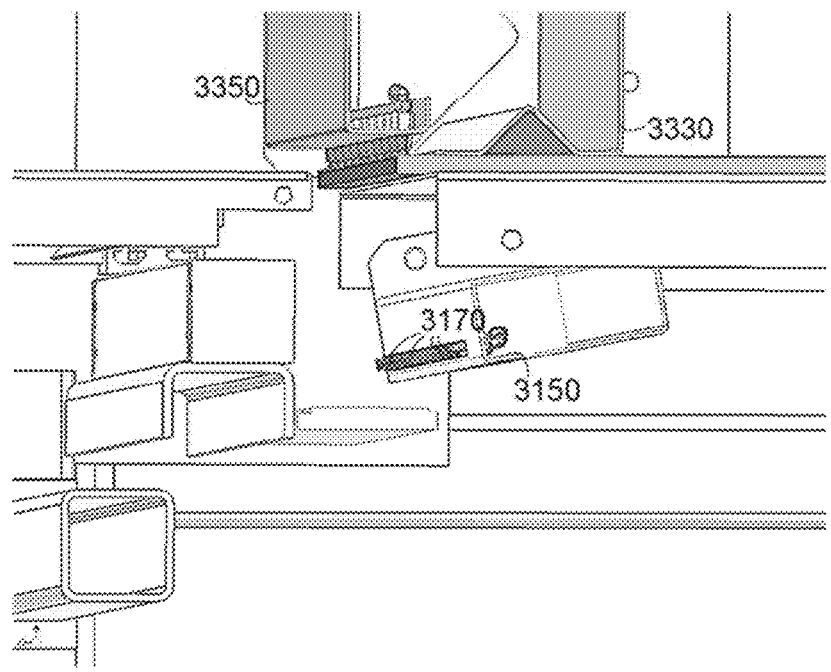
Figure 30L:
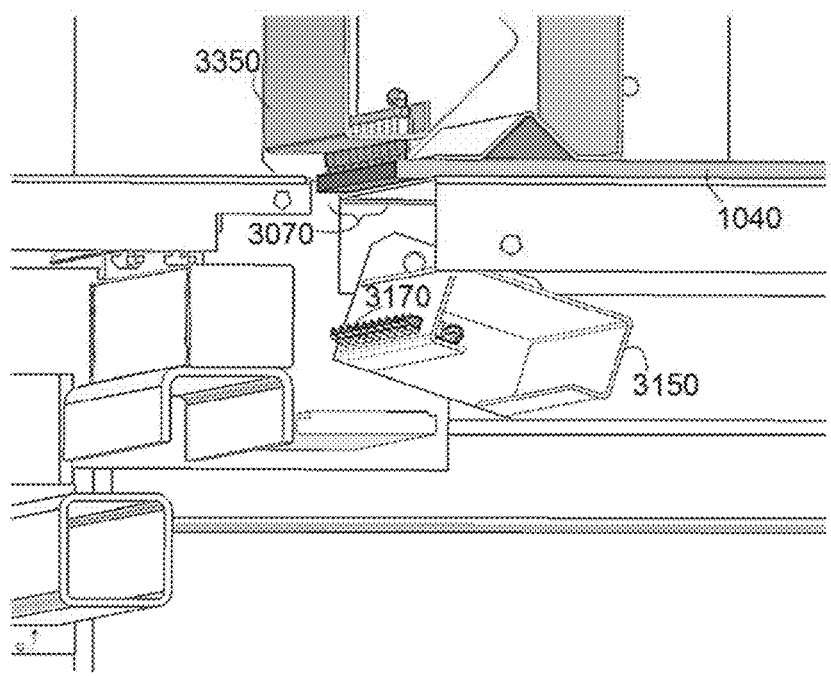
Figure 30M:
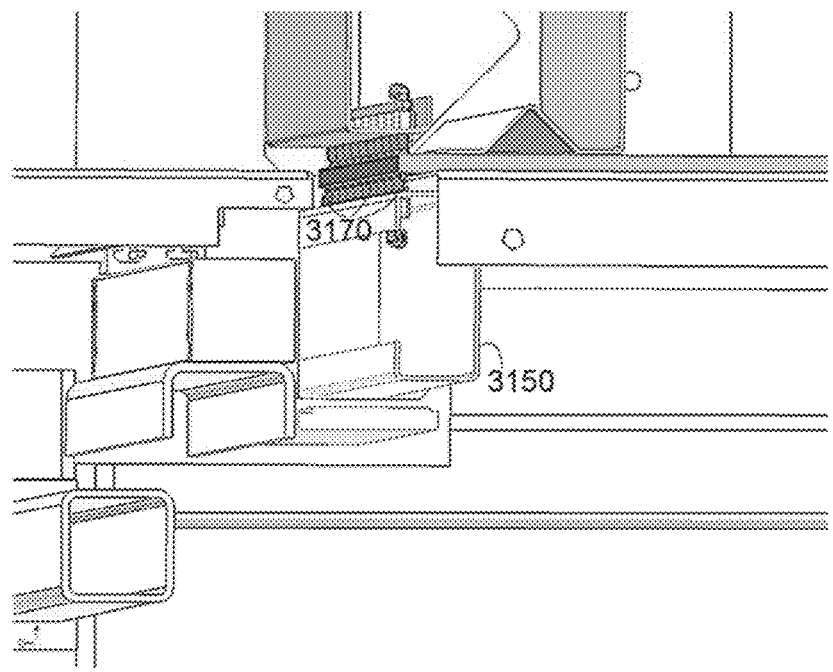
Figure 30N:
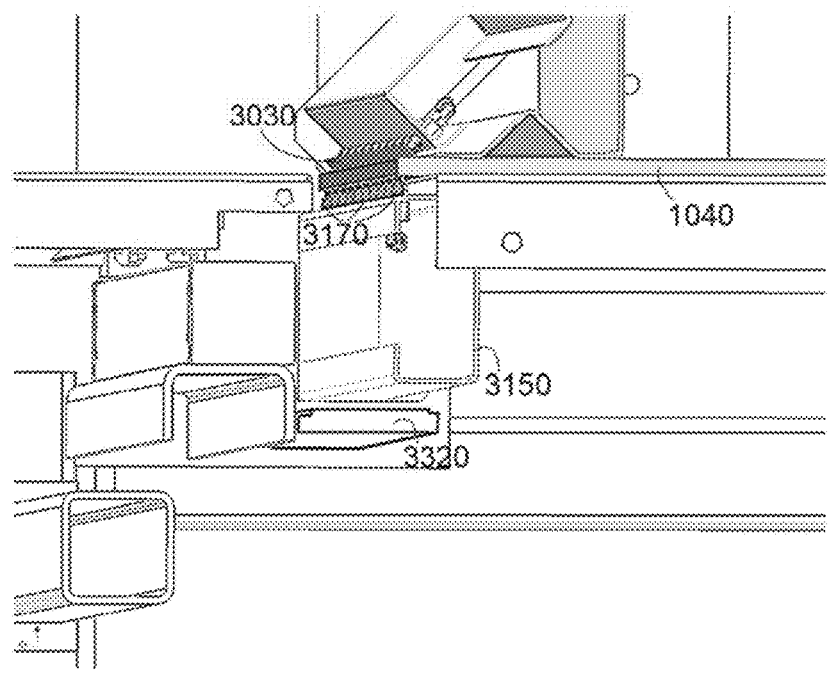
Figure 30O:
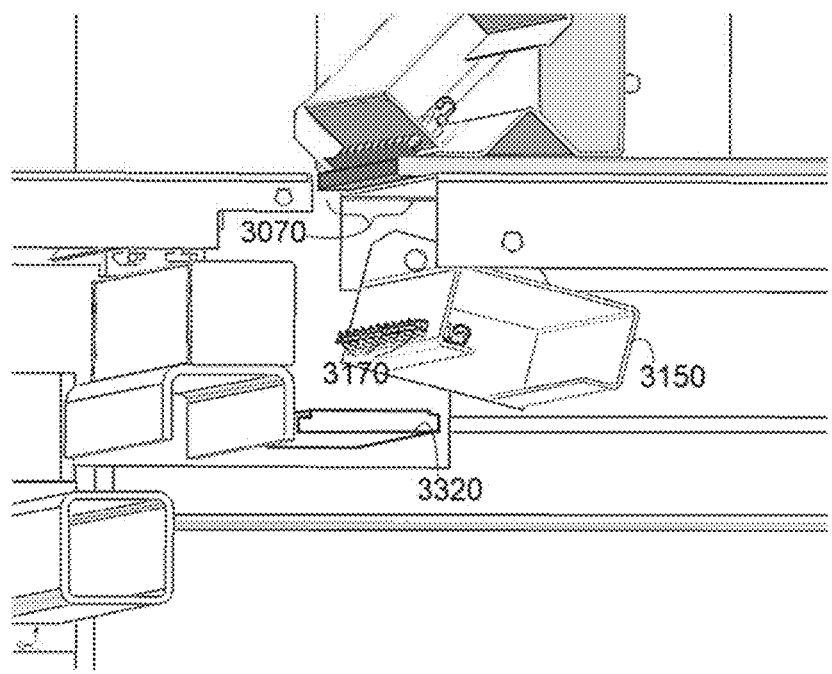
Figure 30P:
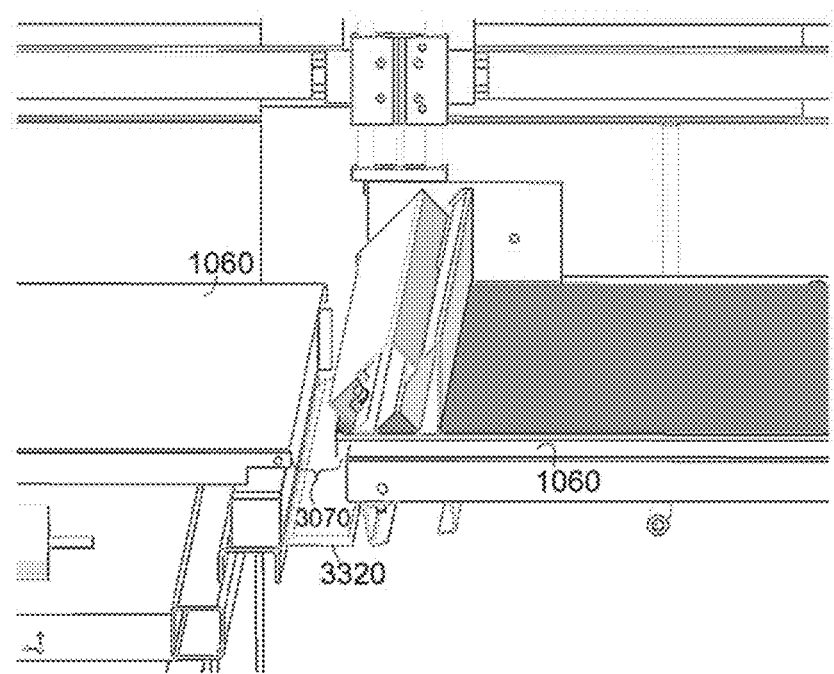
Figure 30Q:
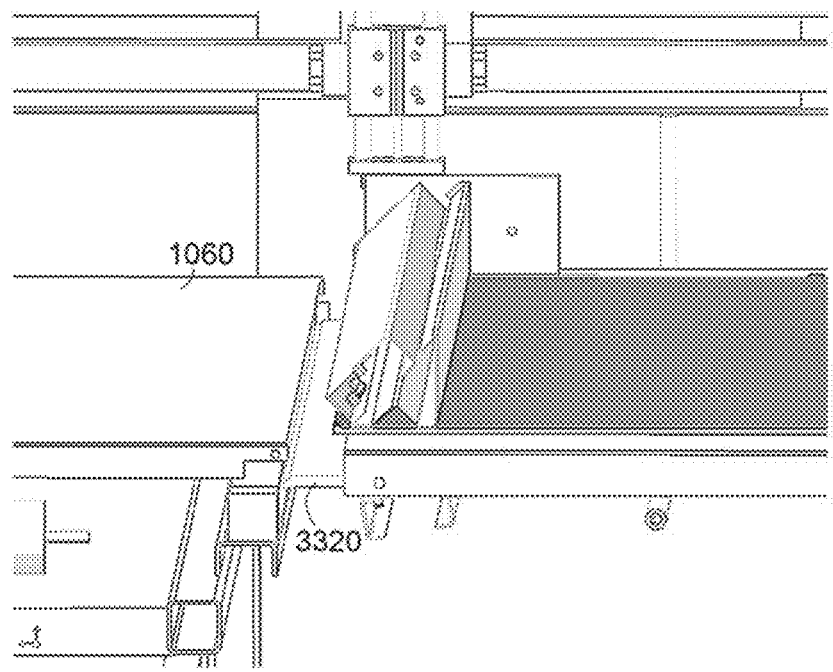
Figure 30R:
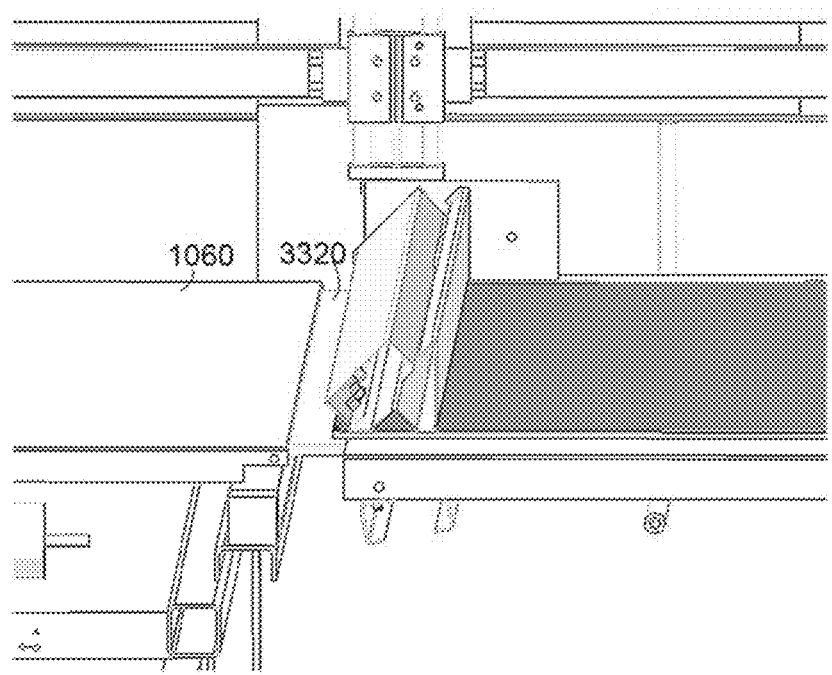
Figure 30S:
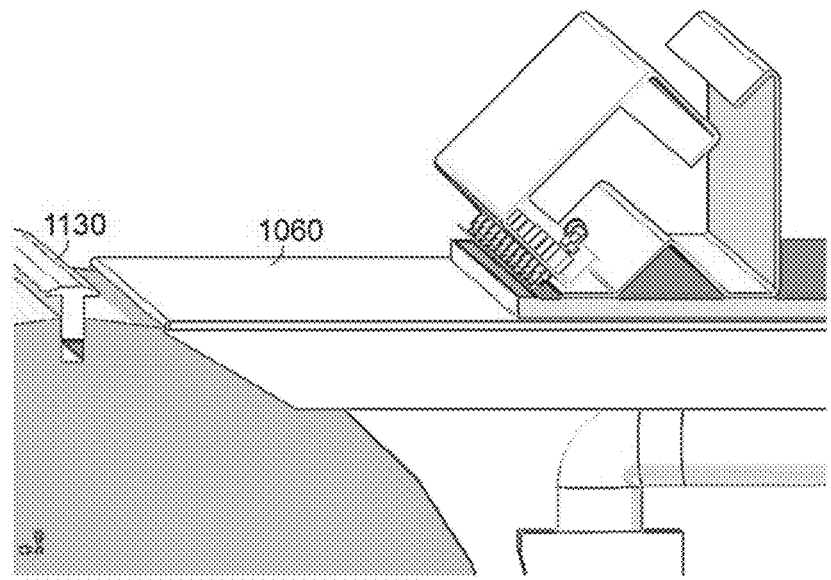
Figure 30T:
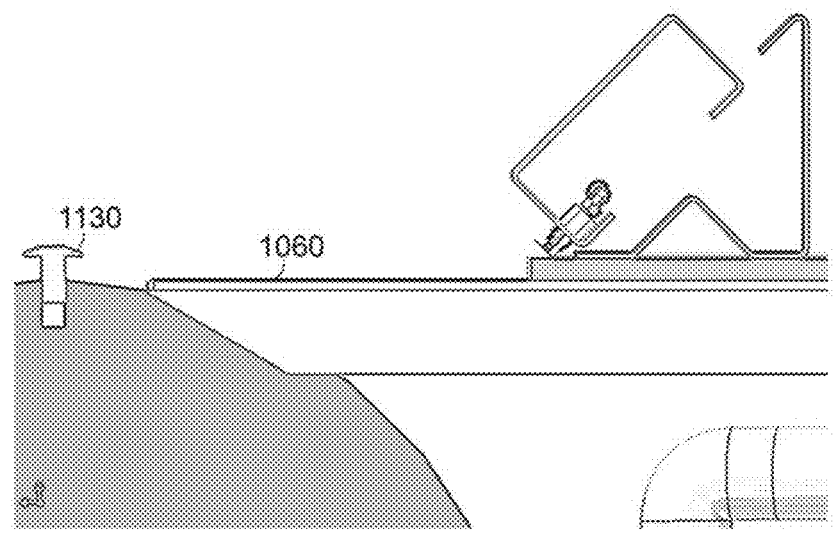
Figure 30U:
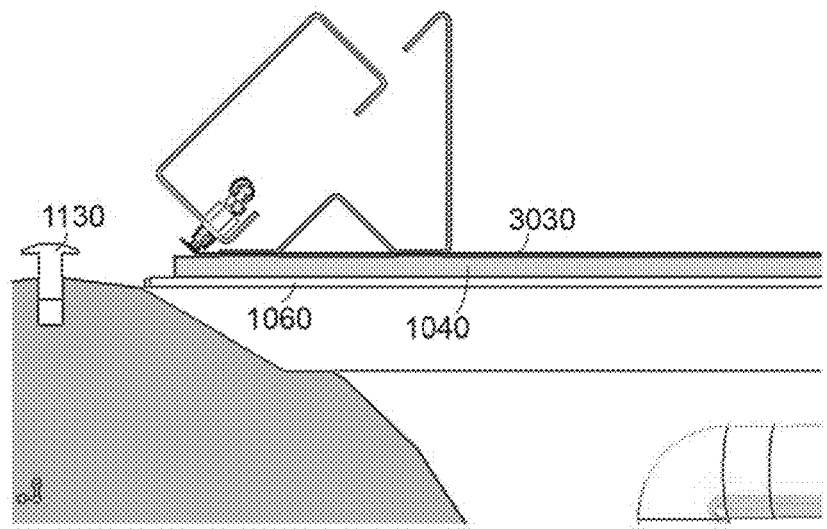
Figure 30V:
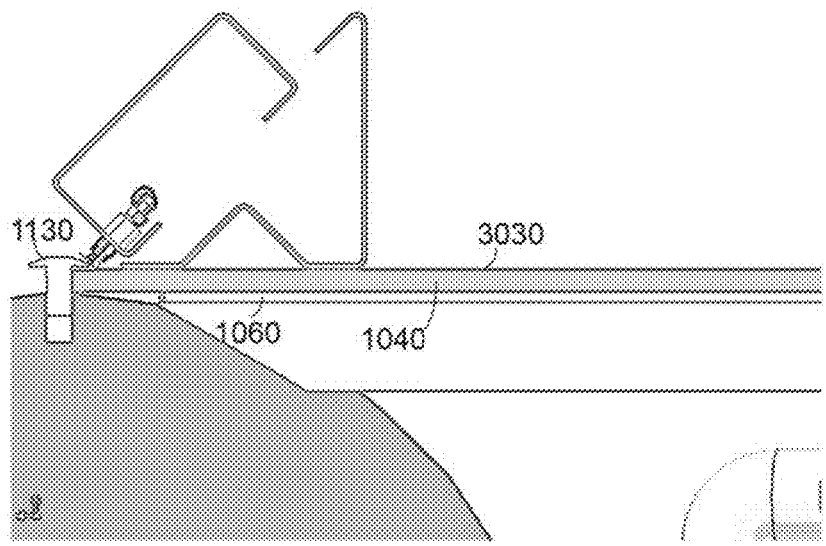
Figure 30W:
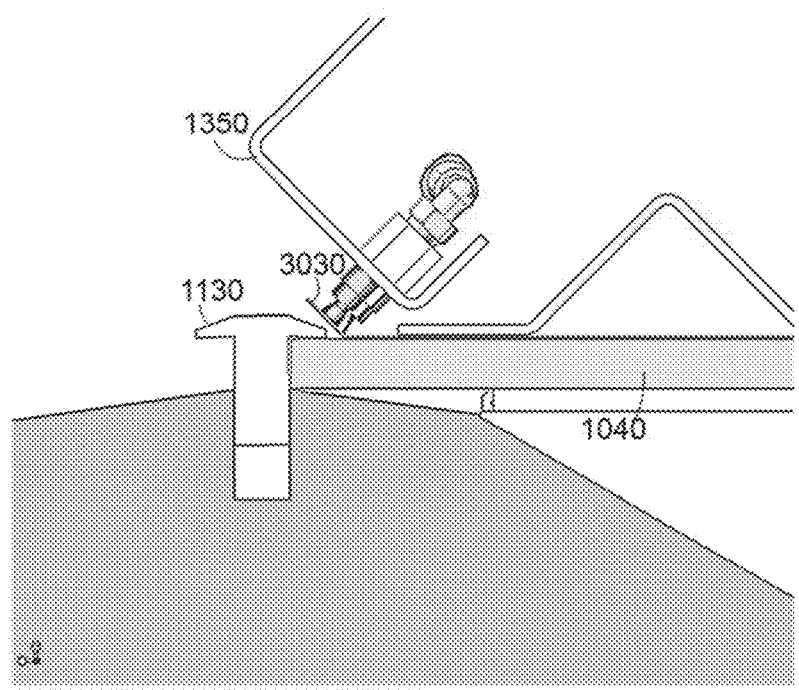
Figure 30X:
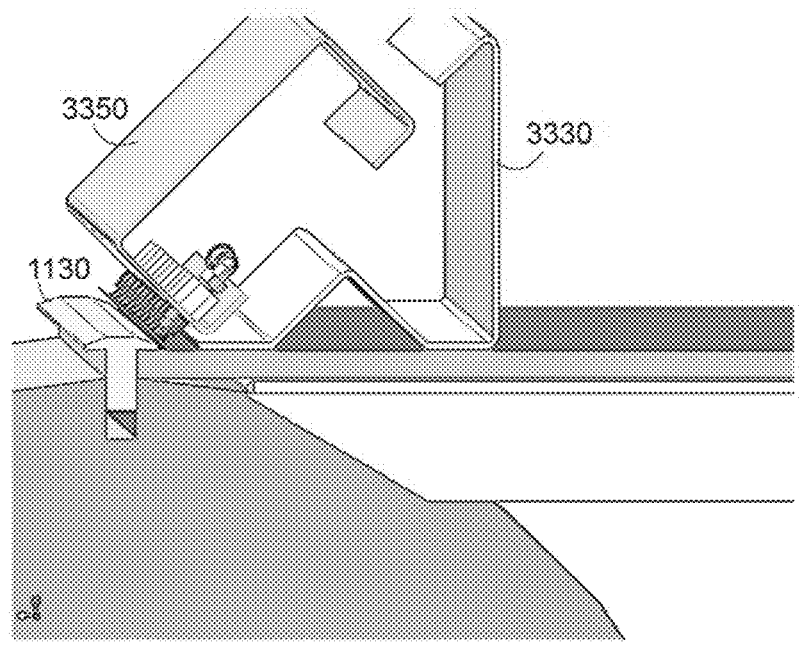
Figure 30Y:
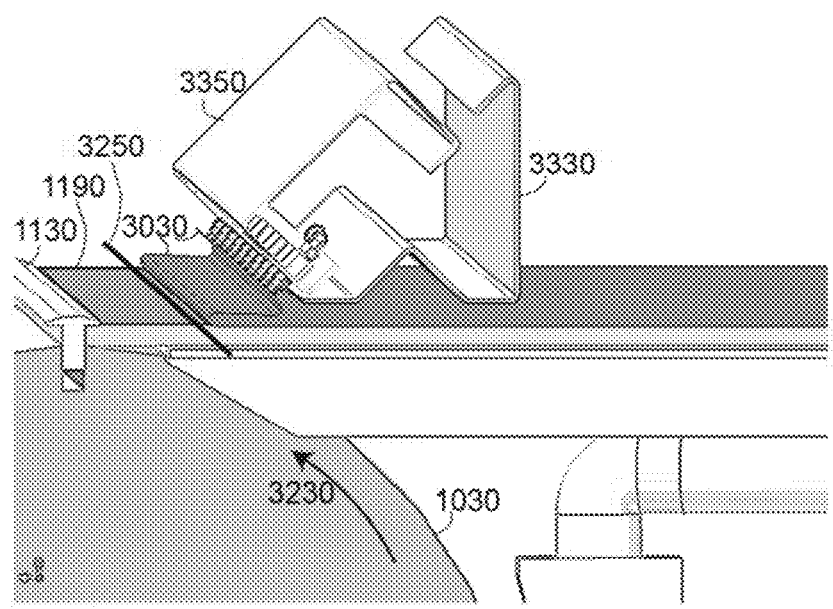

FIGS. 30A-30Y correspond to FIGS. 5A-5Y of U.S. Pat. No. 7,000,543 and show the sequence of the automatic loading onto the loading area 1060, and the automatic removal of the protective sheet. These aspects are controlled under control of the control system 1100.

FIG. 30A shows a first perspective view of a first mechanism 3350 that includes a grabber set of suction cups gripping a plate 1040 with a protective sheet 3030 thereon. An adjacent section 3330 maintains the combination of plate and protective sheet horizontal. The flexible pipes from the suction cups to an included source of vacuum are not shown so as not to obscure the views of how the automatic loader and protective sheet unloader operate. Only the bolts 3050 of the grabber set of suction cups are shown. A movable part 3320 of the loading area 1060 is shown moved way to leave an opening 3070 for the loading area 1060.

Also shown is a bending device 3090 that includes a roller 3110. The bending device is movable across the width of the opening 3070 back and forth in the direction shown by arrow 3130.

FIG. 30B shows another perspective view that provides a better view of the bottom of the loading area 1060 in the vicinity of the opening 3070. This view shows a second mechanism 3150 that includes another set of suction cups—the suction cups have reference numeral 3170 in FIG. 30B. The suction cups are connected to a vacuum source (not shown) via pipes, one of which is shown as pipe 3190. The second mechanism is hinged at hinge 3200 to rotate such that the suction cups may grab the bottom of the plate when the plate is over the opening 3070 of the loading area 1060.

FIG. 30C shows the view of FIG. 30B while the plate is being moved horizontally out of its cassette (e.g., cassette 1130 not shown) while the cassette is in its vertical loading position and its horizontal loading position.

FIG. 30D shows the plate 1040 with the protective sheet and sheet away at the location such that the edge of the plate and protective sheet is above the opening 3070 formed by moving away panel 3320.

When the plate is at the intermediate position over the opening 3070, the first mechanism 3350 lets go of the plate, i.e., the vacuum is shut off, and the mechanism 3350 moves away from the plate, in particular rotates such that the edge of the plate may be bent away from the plane of the surface of loading area 1060. FIG. 30E shows a perceptive view with the first mechanism 3350 moved such that the end edge of the plate 1040 and protective sheet 3030 may be so bent.

The bending device 3090 that in one embodiment includes a wheel 3110 that rolls against the edge of the plate now moves back and forth across the plate edge in the direction 3130. This bends approximately 10 mm of the end of the plate and protective sheet to an angle that is adjustable to between 30 and 90 degrees, depending on the plate type. The adjacent section 3330 maintains the adjacent part of the plate and protective sheet horizontal during the bending. The bending device moves back and forth across the plate edge between one and three times depending on the plate type. The purpose of the bending by the bending device is to loosen the protective sheet from the plate at the edge region. Otherwise, the protective sheet tends to stick heavily to the LAMS coating.

FIGS. 30F, 30G, 30H, and 30I show this back and forth action. In one alternate implementation, the suction cups of the grabber hold the plate 1040 and cover 3030 during bending a distance away from the edge so that the plate cannot slip in the horizontal direction.

FIG. 30J shows that at this stage, the first mechanism 3350 that includes the grabber set of suction cups arranged as a row moves onto the protective sheet 3030 along the width in the strip area separated from the plate. FIG. 30K shows a different perspective view that shows the second mechanism 3150 that includes the other set of suction cups 3170 arranged as a row. At this stage, as shown in FIGS. 30L and 30M, the second mechanism 3150 moves by rotation such that the other set of suction cups is under the edge of the plate 1040 through the opening 3070 in the loading area 1060. The order of the moving is not important, i.e., whether the top protective sheet or the bottom of plate 1040 is held first, as shown in the sequence of FIGS. 30J to 30M, or in a different order. Vacuum is applied to the first and other sets of vacuum holders.

The other set of suction cups maintains the plate at the horizontal surface, while the first mechanism 3350 lifts, e.g., by tilting, to tilt the protective sheet 3030 at the edge away from the plate 1040. FIG. 30N shows the results of such moving of the protective sheet 3030 away from the plate 1040.

The vacuum to the bottom other set of suction cups 3170 is removed, and the second mechanism 3150 of the other set of suction cups is moved away. FIG. 30O shows the suction cups 3170 of the second mechanism 3170 so moved away.

FIGS. 30P, 30Q and 30R show the movable panel 3320 now moving to close the opening 3070 to form a substantially horizontal surface. The surface of area 1060 is shown closed in FIG. 30R.

The grabbing mechanism 3350 with the vacuum holders still holding the protective sheet now slides the plate 1040 and protective sheet 3030 towards the drum 1030. Such movement is shown in FIGS. 30S, 30T, 30U and 30V.

Note that in FIGS. 30S, 30T, 30U and 30V, not shown are the UV exposing elements, and the automatic removal from the drum elements. Also not shown is the front part 1120 that is hinged and that is designed to bend downwards. In the embodiments shown in FIGS. 30A-30Y, the loading is assumed arranged so that the motion shown in FIGS. 30S, 30T, and 30U causes the plate to move into the gap between the (open) T-clamp and the outer surface of the drum. Those in the art will understand that this is a simplified version, and in one embodiment, the surface 1060 includes the tilting front part 1120 as described above. The tilting is to lower the front edge of the plate because in the embodiments described in FIGS. 10-29, the drum is positioned so that a plate can be loaded from the loading area 1060, and also so that the drum can be unloaded onto the unloading area 1070 underneath the loading area 1060. For this, the drum in the embodiments of FIGS. 10-29 is positioned lower than in the case of the loader of U.S. Pat. No. 7,000,543, from which FIGS. 30A-30Y are derived. How to modify FIGS. 30A-30Y and the description to include the hinged part 1120 and to accommodate the lower positioning of the drum for consistency with FIGS. 10-29 would be clear to those in the art.

Continuing with the loading, the plate is moved until the plate edge is under the T-clamp 1130 as shown in FIG. 30V. The T-clamp 1130 now closes to grip the plate 1040 without also gripping the protective sheet 3030 because of the sheet's being held separated from the plate 1040 at the plate edge by the grabber set of suction cups. FIG. 30W shows a cross-sectional view of the clamp 1130 holding the plate 1040 at the plate edge. FIG. 30X shows a perspective view of this stage of operation.

Once the plate edge is clamped to the drum, two actions occur. The first action is that the first mechanism 3350 moves horizontally back to its horizontal rest position close to being over the movable part 3320. The grabber set of suction cups of the first mechanism 3350 maintains hold onto the protective sheet 3030 such that the sheet 3030 is partially peeled away from the plate. The movement away from the clamp 1130 is shown in FIG. 30Y.

The second motion is that the drum rotates, e.g., in the direction 3230 shown in FIG. 30Y and as described herein above. The rotation of the drum with the plate clamped thereon while the grabber set of suction cups still holds onto the protective sheet further removes the protective sheet 3030 from the top of the plate 1040, while the plate 1040 is loaded onto the drum 1030.

An anti-static device 3250 in the form of a wire across width of the device is turned on during the motion to emit ionized air, and in particular, ionized air that can reach the separation region between the plate and separated protective sheet and thus remove any static electricity built up, so that the removal is easier. Note that, as would be known to those in the art, the source of electric supply to the wire is not shown, nor are the mechanical supports. Note also that in an improved embodiment, one or more blowers are included to ensure that the ionized air reaches the region between the plate and separated protective sheet.

The first and second motion is coordinated. In one embodiment, the backwards movement of the gripper/first mechanism 3350 occurs simultaneously with the rotation of the drum.

The protective sheet is now transported to a trash compartment.

Note that FIG. 30A-30Y do not show many details, such as the mechanical supports for the first and second mechanisms, nor the motors that cause the actions to take place under control of the control system. The particular designs are now shown so as not to obscure the operation of the devices. Those in the art will find including such mechanisms straightforward from the description provided herein.

In an alternate embodiment of the loading from a compartment as described in U.S. Pat. No. 7,000,543, the compartment once at its loading vertical position is moved to an intermediate horizontal position prior to being moved to its loading horizontal position. At the intermediate horizontal position, there is a gap between the imager and the magazine, and such gap is used to provide access to the bottom of the plate opposite the side whereon a protective sheet lays. An automatic plate mover automatically moves the plate horizontally from the compartment at the intermediate position to provide such access to the bottom of the plate. At the intermediate position, the plate is restrained on such bottom side, and while restrained, any protective sheet on the plate is partially lifted and held. The compartment and plate are now further moved horizontally to the loading horizontal position, and then the plate is further moved to an imager loading horizontal position, then onto the imager while the protective sheet is held. As the plate is loaded onto the imager, the holding of the protective sheet removes the protective sheet from the plate, such that the plate is loaded onto the imager without the protective sheet.

Not described herein are details of the control system 1100. Those in the art will understand that by "under control of" and "configured to cause" mean that the control system outputs signals that cause motors and actuators to carry out the motions, and furthermore, that there are sensors that provide signals to the control system for such functionality. Those in the art also will understand that such a control system includes one or more programmable processors and a memory subsystem that includes instructions that cause the motions and actions described herein. Not shown are the motors, sensors, and actuators that work in conjunction with the control system to cause the various motions described herein, and including such motors, sensors and actuators can be carried out by those in the art given the description provided herein.

Note that in one embodiment, a T-clamp mechanism is used. Other clamping mechanisms may be used in alternate embodiments.

In the embodiment shown in the drawings, the unloading area 1070 is arranged vertically beneath the loading area 1060. In alternate embodiments, the loading and unloading areas can be arranged on opposite sides of the imager or other arrangements that allow a plate to be simultaneously on the loading area and another plate to be simultaneously at the unloading area. General By the terms "polymer plate" and "photopolymer plate" herein is meant a plate with any type of UV-curable material thereon. Today, such materials are photopolymers. However, the term "photopolymer" is not meant to be limiting to a polymer composition. The inventor anticipates that in the future, there may be new materials and compositions that also are curable by UV radiation of a desired wavelength, and the invention is equally applicable to plates having such material thereon.

Unless specifically stated otherwise, as apparent from the following discussions, it is appreciated that throughout the specification discussions utilizing terms such as "processing," "computing," "calculating," "determining" or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Note that when a method is described that includes several elements, e.g., several steps, no ordering of such elements, e.g., steps is implied, unless specifically stated.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the DESCRIPTION OF EXAMPLE EMBODIMENTS are hereby expressly incorporated into this DESCRIPTION OF EXAMPLE EMBODIMENTS, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

All publications, patents, and patent applications cited herein are hereby incorporated by reference.

Any discussion of prior art in this specification should in no way be considered an admission that such prior art is widely known, is publicly known, or forms part of the general knowledge in the field.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

I claim:

1. A system for preparing a printing plate, the printing plate comprising a photosensitive polymer cured by exposure to ultraviolet (UV) radiation, the printing plate having a non-printing back side, a printing front side, a lateral width, and a lateral length, the system comprising:
    a UV exposure unit, the UV exposure unit comprising:
        a holder, comprising a UV translucent material, configured to receive the printing plate;
        a plurality of stationary back UV light emitting diodes (UV LEDs) configured to emit UV radiation toward the non-printing back side of the printing plate through the holder with the printing plate disposed in a stationary position on the holder, the plurality of stationary back UV LED sources together defining at least one back array having a collective irradiation field covering an area at least coextensive with the lateral length and lateral width of the plate; and
        a controller connected to the plurality of UV LEDs and configured to activate the plurality of UV LEDs to emit the UV radiation.

2. The system of claim 1, wherein the UV exposure unit controller is configured to cause all of the plurality of stationary back UV LED sources to emit UV radiation simultaneously.

3. The system of claim 1, wherein the plurality of stationary back UV LED sources are configured as a plurality of back UV LED subsets smaller than an entirety of the plurality of stationary back UV LED sources.

4. The system of claim 3, wherein each back UV LED subset is individually controllable.

5. The system of claim 4, wherein each back UV LED subset is controllable by a respective controllable power source.

6. The system of claim 5, wherein each back UV LED subset corresponds to a different UV wavelength, such that a spectral composition of the UV produced by the UV LEDs is controllable by controlling the respective power sources.

7. The system of claim 3, wherein each back UV LED subset is mounted on a segment that is moveable relative to another segment.

8. The system of claim 3, wherein each back UV LED subset is mounted on a water-cooled heatsink.

9. The system of claim 1, wherein each back UV LED in the plurality of stationary back UV LEDs is connected to a controllable power source configured to regulate intensity, emission duration, or a combination thereof, of UV light emitted by the back UV LED.

10. The system of claim 1, wherein the UV exposure unit further comprises at least one front array comprising a plurality of front UV LEDs configured to emit UV radiation toward the printing front side of the printing plate with the printing plate disposed on the holder, wherein the controller is also configured to control the at least one front array of UV LEDs.

11. The system of claim 10, wherein the controller is configured to cause the at least one front array and the at last one back array to irradiate both the back side and the front side of the plate with UV light simultaneously.

12. The system of claim 10, wherein the controller is configured to cause the at least one front array and the at last one back array to irradiate the back side of the plate and the front side of the plate non-simultaneously.

13. The system of claim 10, wherein the plurality of front UV LEDs includes a plurality of front subsets of front UV LEDs.

14. The system of claim 13, wherein each front subset is controllable by a respective controllable power source.

15. The system of claim 13, wherein each front subset corresponds to a different UV wavelength, such that a spectral composition of the UV light produced by the plurality of front UV LEDs is controllable by controlling the respective power sources.

16. The system of claim 13, wherein each front subset is mounted on a segment that is moveable relative to another segment.

17. The system of claim 13, wherein each front subset is mounted on a water-cooled heatsink.

18. The system of claim 10, wherein each front UV LED is connected to a controllable power source configured to regulate intensity, emission duration, or a combination thereof, of UV light emitted by the front UV LED.

19. The system of claim 10, wherein the printing plate further comprises a masking layer disposed over a front surface of the photosensitive polymer, the masking layer having openings therein.

20. The system of claim 19, further comprising an imager configured to create the openings in the masking layer in accordance with imaging data, wherein the UV exposure unit is disposed in a printing plate preparation workflow sequentially after the imager to receive printing plates imaged by the imager.

21. The system of claim 20, wherein the masking layer comprises a Laser Ablation Mask System (LAMS) coating configured to be ablated by a laser and the imager comprises a digital imager having one or more lasers configured to emit laser light modulated in accordance with the imaging data to create the openings in the masking layer.

22. The system of claim 21, wherein the system is configured to receive the printing plate in a loading position and further comprises a plate handling mechanism operable by the controller, the system operable by the controller configured to automatically, without manual handling by a human operator, load the plate onto the imager from the loading position, image the plate with the imager according to imaging data, unload the plate from the imager, and irradiate the plate with UV irradiation.

23. The system of claim 22, wherein the imager comprises a drum imager and the holder of the UV exposure unit configured to receive the printing plate in the stationary position during irradiation defines a horizontal area.

24. The system of claim 23, wherein the printing plate comprises a computer-to-plate (CTP) flexographic plate.

25. The system of claim 1, wherein the printing plate comprises a computer-to-plate (CTP) flexographic plate.

26. The system of claim 1, wherein the holder configured to receive the printing plate defines a horizontal area.

* * * * *